(12) United States Patent
Hirano

(10) Patent No.: US 10,423,068 B2
(45) Date of Patent: *Sep. 24, 2019

(54) ACTIVE-LIGHT-SENSITIVE OR RADIATION-SENSITIVE RESIN COMPOSITION, ACTIVE-LIGHT-SENSITIVE OR RADIATION-SENSITIVE FILM, PATTERN FORMING METHOD, AND METHOD FOR MANUFACTURING ELECTRONIC DEVICE

(71) Applicant: FUJIFILM Corporation, Tokyo (JP)

(72) Inventor: Shuji Hirano, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/446,153

(22) Filed: Mar. 1, 2017

(65) Prior Publication Data

US 2017/0242338 A1 Aug. 24, 2017

Related U.S. Application Data

(63) Continuation of application No. PCT/JP2015/073371, filed on Aug. 20, 2015.

(30) Foreign Application Priority Data

Sep. 2, 2014 (JP) .................................. 2014-178118

(51) Int. Cl.
| | |
|---|---|
| G03F 7/004 | (2006.01) |
| G03F 7/038 | (2006.01) |
| G03F 7/039 | (2006.01) |
| G03F 7/20 | (2006.01) |
| G03F 7/32 | (2006.01) |
| G03F 7/38 | (2006.01) |
| C08F 220/04 | (2006.01) |
| C08F 220/18 | (2006.01) |
| C08F 220/64 | (2006.01) |
| C08F 220/68 | (2006.01) |
| C08F 222/02 | (2006.01) |
| C08F 220/06 | (2006.01) |
| G03F 7/16 | (2006.01) |
| C08F 220/28 | (2006.01) |

(52) U.S. Cl.
CPC .......... *G03F 7/0045* (2013.01); *C08F 220/04* (2013.01); *C08F 220/06* (2013.01); *C08F 220/18* (2013.01); *C08F 220/64* (2013.01); *C08F 220/68* (2013.01); *C08F 222/02* (2013.01); *G03F 7/0042* (2013.01); *G03F 7/0046* (2013.01); *G03F 7/0048* (2013.01); *G03F 7/038* (2013.01); *G03F 7/039* (2013.01); *G03F 7/0395* (2013.01); *G03F 7/0397* (2013.01); *G03F 7/162* (2013.01); *G03F 7/2004* (2013.01); *G03F 7/2037* (2013.01); *G03F 7/322* (2013.01); *G03F 7/325* (2013.01); *G03F 7/38* (2013.01); *C08F 2220/282* (2013.01); *C08F 2220/283* (2013.01)

(58) Field of Classification Search
None
See application file for complete search history.

(56) References Cited

U.S. PATENT DOCUMENTS

| | | | | |
|---|---|---|---|---|
| 5,693,452 A | * | 12/1997 | Aoai | .......................... C08F 8/02 430/176 |
| 6,171,757 B1 | * | 1/2001 | Angelopoulos | ....... G03F 7/0042 430/270.1 |
| 6,482,566 B1 | | 11/2002 | Hofer et al. | |
| 9,499,466 B2 | | 11/2016 | Kaneko | |
| 2002/0090574 A1 | | 7/2002 | Aviram et al. | |
| 2003/0113657 A1 | | 6/2003 | Nagahara et al. | |
| 2007/0111139 A1 | * | 5/2007 | Takeda | .................. G03F 7/0382 430/270.1 |
| 2007/0248913 A1 | | 10/2007 | Rahman et al. | |
| 2008/0248419 A1 | | 10/2008 | Hirano | |
| 2010/0297551 A1 | | 11/2010 | Teranishi | |

(Continued)

FOREIGN PATENT DOCUMENTS

| | | |
|---|---|---|
| JP | 07-134418 A | 5/1995 |
| JP | 2001-290264 A | 10/2001 |

(Continued)

OTHER PUBLICATIONS

International Preliminary Report on Patentability and Translation of Written Opinion, dated Mar. 16, 2017, from the International Bureau in counterpart International application No. PCT/JP2015/073371.

(Continued)

*Primary Examiner* — Martin J Angebranndt
(74) *Attorney, Agent, or Firm* — Sughrue Mion, PLLC

(57) ABSTRACT

Provided are an active-light-sensitive or radiation-sensitive resin composition in which the sensitivity is excellent, and an active-light-sensitive or radiation-sensitive film, a pattern forming method, and a method for manufacturing an electronic device, each using the active-light-sensitive or radiation-sensitive resin composition. The active-light-sensitive or radiation-sensitive resin composition contains a resin (Ab) whose polarity is changed by the action of an acid, and a compound that generates an acid upon irradiation with active light or radiation, in which the resin (Ab) includes a metal ion, and the metal type of the metal ion is at least one of metal types belonging to Groups 1 to 10 and 13 to 16 (here, excluding Mg and Cs).

15 Claims, No Drawings

(56) References Cited

U.S. PATENT DOCUMENTS

| | | |
|---|---|---|
| 2012/0202153 A1 | 8/2012 | Hatakeyama |
| 2012/0208127 A1* | 8/2012 | Hatakeyama ........... G03F 7/038 430/283.1 |
| 2013/0029270 A1* | 1/2013 | Hatakeyama ......... G03F 7/0043 430/284.1 |
| 2013/0197123 A1 | 8/2013 | Kaneko |
| 2013/0230801 A1* | 9/2013 | Shimizu ................ G03F 7/0397 430/270.1 |
| 2014/0170563 A1 | 6/2014 | Hatakeyama |
| 2015/0132687 A1 | 5/2015 | Hirano et al. |
| 2017/0174801 A1* | 6/2017 | Hirano .................. C08F 220/06 |
| 2017/0176858 A1* | 6/2017 | Hirano .................... G03F 7/038 |

FOREIGN PATENT DOCUMENTS

| | | | |
|---|---|---|---|
| JP | 2002-053613 A | | 2/2002 |
| JP | 2002-107937 A | | 4/2002 |
| JP | 2007-154181 A | | 6/2007 |
| JP | 2007-291387 A | | 11/2007 |
| JP | 2008-268875 A | | 11/2008 |
| JP | 2010-152136 | * | 7/2010 ............. G03F 7/004 |
| JP | 2010-270185 A | | 12/2010 |
| JP | 2012-181511 A | | 9/2012 |
| JP | 2014-041329 A | | 3/2014 |
| JP | 2014-119659 A | | 6/2014 |
| KR | 10-2013-0098213 A | | 9/2013 |
| TW | 201215625 A | | 4/2012 |

OTHER PUBLICATIONS

Written Opinion of the International Searching Authority of PCT/JP2015/073371 dated Oct. 6, 2015.

International Search Report of PCT/JP2015/073371 dated Oct. 6, 2015.

Office Action dated Jan. 30, 2018 from the Japanese Patent Office in counterpart Japanese Application No. 2016-546412.

Notice of Final Rejection dated Aug. 11, 2018, issued by the Korean Intellectual Property Office in corresponding Korean Application No. 10-2017-7005668.

Office Action dated Apr. 5, 2018 from the Korean Intellectual Property Office in counterpart Korean Application No. 10-2017-7005668.

Office Action dated Apr. 26, 2019, from the Taiwanese Patent Office in counterpart Taiwanese application No. 104128240.

* cited by examiner

ACTIVE-LIGHT-SENSITIVE OR RADIATION-SENSITIVE RESIN COMPOSITION, ACTIVE-LIGHT-SENSITIVE OR RADIATION-SENSITIVE FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2015/073371 filed on Aug. 20, 2015, which claims priority under 35 U.S.C. § 119(a) to Japanese Patent Application No. 2014-178118 filed on Sep. 2, 2014. The above application is hereby expressly incorporated by reference, in its entirety, into the present application.

BACKGROUND OF THE INVENTION

1. Field of the Invention

The present invention relates to an active-light-sensitive or radiation-sensitive resin composition, an active-light-sensitive or radiation-sensitive film, a pattern forming method, and a method for manufacturing an electronic device.

More specifically, the present invention relates to an active-light-sensitive or radiation-sensitive resin composition (resist composition) which is suitably used in an ultra-micro lithographic process applicable to a process for manufacturing ultra-large scale integrations (LSIs) and high-capacity microchips, a process for fabricating a nanoimprint mold, a process for manufacturing a high-density information recording medium, or the like, and other photofabrication processes; and an active-light-sensitive or radiation-sensitive film, a pattern forming method, and a method for manufacturing an electronic device, each using the active-light-sensitive or radiation-sensitive resin composition.

2. Description of the Related Art

In the related art, microfabrication by lithography using a photoresist composition has been performed in a process for manufacturing a semiconductor device such as an integrated circuit (IC) and an LSI. Currently, lithography using electron beams, EUV light, or the like is also being developed, and various resist compositions have been proposed (see, for example, JP2012-181511A).

SUMMARY OF THE INVENTION

In recent years, high functionality has been required for various types of electronic equipment, and thus, further improvement of characteristics of resist compositions for use in microfabrication has been required. In particular, further improvement in sensitivity has been required.

Above all, the present inventors have investigated the resist composition described in JP2012-181511A, and thus, it became clear that the sensitivity does not necessarily satisfy a level that has recently been required.

The present invention has been made by taking into account the above-described aspects, and has an object to provide an active-light-sensitive or radiation-sensitive resin composition in which the sensitivity is excellent, and an active-light-sensitive or radiation-sensitive film, a pattern forming method, and a method for manufacturing an electronic device, each using the active-light-sensitive or radiation-sensitive resin composition.

The present inventors have made intensive studies, and as a result, have found that the above objects can be accomplished by the following configurations.

That is, the present invention provides [1] to [11] below.

[1] An active-light-sensitive or radiation-sensitive resin composition comprising: a resin (Ab) whose polarity is changed by the action of an acid; and a compound that generates an acid upon irradiation with active light or radiation, in which the resin (Ab) includes a metal ion, and a metal type of the metal ion is at least one of metal types belonging to Groups 1 to 10 and 13 to 16 (here, excluding Mg and Cs).

[2] The active-light-sensitive or radiation-sensitive resin composition as described in [1], in which the resin (Ab) has a metal salt structure including the metal ion.

[3] The active-light-sensitive or radiation-sensitive resin composition as described in [2], in which the metal salt structure is represented by the following General Formula (f).

[4] The active-light-sensitive or radiation-sensitive resin composition as described in [3], in which the acid group in $X_a$ in General Formula (f) is a carboxyl group.

[5] The active-light-sensitive or radiation-sensitive resin composition as described in any one of [2] to [4], in which the resin (Ab) has at least one of repeating units represented by General Formulae (f1) to (f4), which will be described later, as the metal salt structure.

[6] An active-light-sensitive or radiation-sensitive film which is formed using the active-light-sensitive or radiation-sensitive resin composition as described in any one of [1] to [5].

[7] A pattern forming method comprising at least: a step of forming an active-light-sensitive or radiation-sensitive film using the active-light-sensitive or radiation-sensitive resin composition as described in any one of [1] to [5]; a step of exposing the active-light-sensitive or radiation-sensitive film; and a step of developing the exposed active-light-sensitive or radiation-sensitive film using a developer to form a pattern.

[8] The pattern forming method as described in [7], in which the exposure is exposure with electron beams or EUV light.

[9] The pattern forming method as described in [7] or [8], in which the developer is an alkaline developer.

[10] The pattern forming method as described in [7] or [8], in which the developer is a developer including an organic solvent.

[11] A method for manufacturing an electronic device, comprising the pattern forming method as described in any one of [7] to [10].

According to the present invention, it is possible to provide an active-light-sensitive or radiation-sensitive resin composition in which the sensitivity is excellent, and an active-light-sensitive or radiation-sensitive film, a pattern forming method, and a method for manufacturing an electronic device, each using the active-light-sensitive or radiation-sensitive resin composition.

DESCRIPTION OF THE PREFERRED EMBODIMENTS

Hereinafter, embodiments of the present invention will be described in detail.

In citations for a group (an atomic group) in the present specification, in a case where a group is denoted without specifying whether it is substituted or unsubstituted, the group denoted without specifying whether it is substituted or unsubstituted includes both a group not having a substituent and a group having a substituent. For example, an "alkyl group" includes not only an alkyl group not having a substituent (unsubstituted alkyl group), but also an alkyl group having a substituent (substituted alkyl group).

In the present specification, light includes not only extreme ultraviolet rays (EUV light) but also electron beams.

Furthermore, unless otherwise specified, "exposure" in the present specification includes not only exposure by extreme ultraviolet rays (EUV light) but also writing by electron beams.

"Active light" or "radiation" in the present specification means, for example, a bright line spectrum of a mercury lamp, far ultraviolet rays represented by an excimer laser, extreme ultraviolet rays (EUV light), X-rays, electron beams, or the like. In addition, in the present invention, "light" means active light or radiation. Incidentally, unless otherwise specified, "exposure" in the present specification includes not only exposure by a mercury lamp, far ultraviolet rays represented by an excimer laser, X-rays, EUV light, or the like, but also writing by particle rays such as electron beams and ion beams.

[Active-Light-Sensitive or Radiation-Sensitive Resin Composition]

The active-light-sensitive or radiation-sensitive resin composition of the present invention (hereinafter also referred to as "the composition of the present invention" or "the resist composition of the present invention") contains a resin (Ab) which will be described in detail below and a compound that generates an acid upon irradiation with active light or radiation (also referred to as a "photoacid generator").

[Resin (Ab)]

The resin (Ab) is a resin whose polarity is changed by the action of an acid.

The resin (Ab) is preferably insoluble or sparingly soluble in an alkaline developer, and preferably soluble in a developer including an organic solvent.

The resin (Ab) preferably has a repeating unit having an acid-decomposable group.

In the present invention, such a resin (Ab) includes a metal ion, and the metal type of the metal ion is at least one of metal types belonging to Groups 1 to 10 and 13 to 16 (here, excluding Mg and Cs).

Thus, the composition of the present invention is excellent in the sensitivity. The reason for this is not clear, but is estimated as follow.

First, in the case of performing the exposure with electron beams or EUV light, the composition of the present invention absorbs light to generate electrons, the photoacid generator decomposes by the generated electrons to generate an acid, and the polarity of the resin (Ab) is changed by the action of the generated acid.

In this case, it is considered that since absorption of electron beams or EUV light increases, and thus the above-mentioned metal (metal ion) included in the resin (Ab) can absorb a large amount of light, many electrons are generated, and an acid is easily generated, the sensitivity becomes high.

The sensitivity becomes high by selecting the above-mentioned metal types, but in case where metal types such as Mg, Cu, Zn, and Cs are selected, the sensitivity becomes insufficient. The fact is also clear from comparison results between Examples and Comparative Examples which will be described later.

Among the above-mentioned metal types, from the viewpoints of optical density of a metallic element with respect to EUV light and a decomposition rate of a metal salt structure with respect to EUV light, the metal types belonging to Groups 1 and 2, 8 to 10, and 13 to 16 (here, excluding Mg and Cs) are preferable, and metal types belonging to Groups 8 to 10 and 13 to 16 are more preferable.

The metal ion is preferably included in the resin (Ab) in an embodiment of the metal salt structure. That is, the resin (Ab) preferably has a metal salt structure including the metal ion. Such a metal salt structure is included in the resin (Ab) as, for example, a partial structure of a functional group which the resin (Ab) has.

Specific examples of the metal salt structure include a partial structure represented by the following General Formula (f).

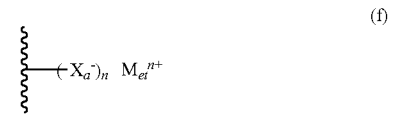

Here, in General Formula (f), $X_a$ represents a residue formed by removing a hydrogen atom from an acid group, $M_{et}$ represents a metal atom belonging to Groups 1 to 10 and 13 to 16 (here, excluding Mg and Cs), and n represents an integer of 1 or more.

Examples of the acid group in $X_a$ in General Formula (f) include a carboxyl group (—COOH), a sulfonic acid group (—SO$_3$H), a phosphoric acid group (H$_2$PO$_4$—), and a phenolic hydroxyl group (—C$_6$H$_4$OH), and these may be used singly or in combination of two or more kinds thereof.

Among the acid groups, a carboxyl group is preferable.

The metal type of the metal atom represented by $M_{et}$ in General Formula (f) has the same definition as the above-mentioned metal type.

The integer represented by n in General Formula (f) is preferably 1 to 4, more preferably 1 to 3, and still more preferably 1 or 2.

Furthermore, in General Formula (f), the wavy line represents a binding position (which shall apply hereinafter), but in a case where n is 2 or more, some of $X_a$'s may not be bonded to the resin (Ab).

Moreover, similarly, in a case where n in General Formula (f) is 2 or more, some of $X_a$'s may be hydroxide ions in which a proton leaves from a water molecule that is a Bronsted acid. That is, General Formula (f) includes an embodiment represented by the following General Formula (f').

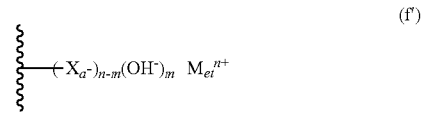

Here, in General Formula (f'), $X_a$ represents a residue formed by removing a hydrogen atom from an acid group, $M_{et}$ represents a metal atom belonging to Groups 1 to 10 and 13 to 16 (here, excluding Mg and Cs), n represents an integer of 2 or more, m represents an integer from 1 to (n−1).

$X_a$ and $M_{et}$ in General Formula (f') have the same definitions as $X_a$ and $M_{et}$ in General Formula (f), respectively.

The integer represented by n in General Formula (f) is preferably 2 to 4, and more preferably 2 or 3.

The integer represented by m in General Formula (f) is preferably 1 to 3, and more preferably 1 or 2.

The above-mentioned metal salt structure decomposes upon exposure (a metal ion leaves) to provide a polar group such as a carboxyl group. This decomposition is carried out, irrespective of the action of an acid. That is, a mechanism in which unevenness such as acid diffusion easily occurs is not involved, and only the exposed area has a change in polarity. As a result, in a case where the resin (Ab) has the above-mentioned metal salt structure, the roughness characteristic (Line Edge Roughness: LER) is improved.

In addition, although it is considered that the metal ion that has left becomes a metal oxide or the like, the embodiment is not particularly limited.

It is preferable that the partial structure represented by General Formula (f) is included in a repeating unit constituting the resin (Ab), and specifically, an embodiment in which the resin (Ab) has at least one of repeating units represented by the following General Formulae (f1) to (f4) is more preferable.

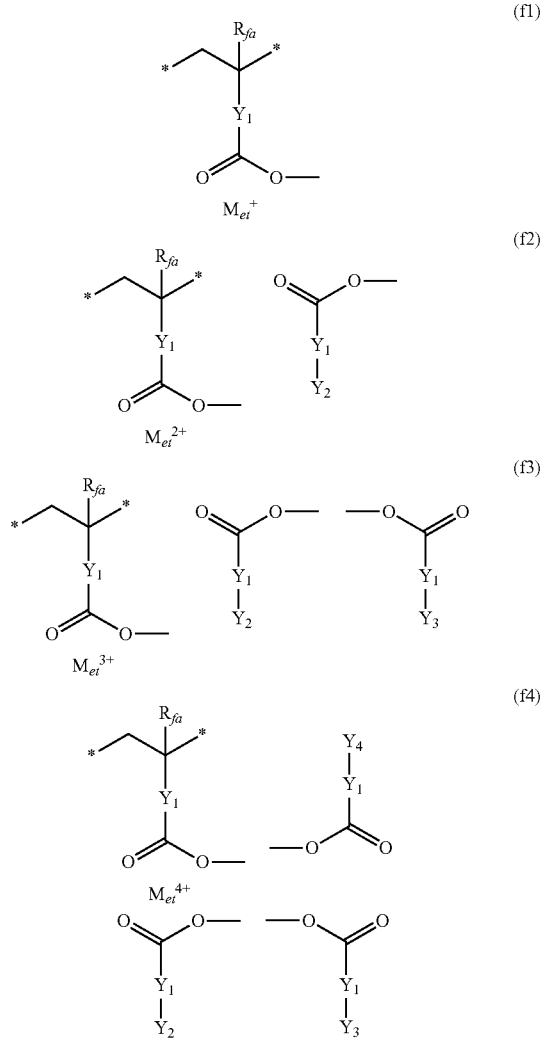

Here, in General Formulae (f1) to (f4), $M_{et}$ represents a metal atom belonging to Groups 1 to 10 and 13 to 16 (here, excluding Mg and Cs), $R_{fa}$ represents a hydrogen atom, an alkyl group, a cycloalkyl group, a halogen atom, a cyano group, or an alkyloxycarbonyl group, $Y_1$'s each independently represent a single bond or a divalent linking group, and $Y_2$ to $Y_4$ each independently represent a hydrogen atom or a monovalent organic group.

Further, * represents a binding position.

The metal type of the metal atom represented by $M_{et}$ in General Formulae (f1) to (f4) has the same definition as the above-mentioned metal type.

The alkyl group represented by $R_{fa}$ in General Formulae (f1) to (f4) may be a linear alkyl group or a branched alkyl group. Preferred examples of the alkyl group include alkyl groups having 1 to 20 carbon atoms, such as a methyl group, an ethyl group, a propyl group, an isopropyl group, an n-butyl group, an isobutyl group, a t-butyl group, a pentyl group, a hexyl group, a cyclohexyl group, an octyl group, and a dodecyl group, with those having 1 to 5 carbon atoms being preferable, and those having 1 to 3 carbon atoms being more preferable.

Examples of the cycloalkyl group represented by $R_{fa}$ include a cycloalkyl group having 3 to 15 carbon atoms, such as a cyclopentyl group and a cyclohexyl group.

Examples of the halogen atom represented by $R_{fa}$ include a fluorine atom, a chlorine atom, a bromine atom, and an iodine atom, and among these, a fluorine atom is particularly preferable.

For the alkyl group included in the alkyloxycarbonyl group represented by $R_{fa}$, for example, a configuration mentioned as the alkyl group represented by $R_{fa}$ can be adopted and used.

As $R_{fa}$, a hydrogen atom or an alkyl group is preferable.

Examples of the divalent linking group represented by $Y_1$ in General Formulae (f1) to (f4) include an alkylene group (for example, a methylene group, an ethylene group, a propylene group, a butylene group, a hexylene group, and an octylene group), a cycloalkylene group (for example, a cyclopentylene group, a cyclohexylene group, and an adamantylene group), an alkenylene group (for example, an ethylene group, a propenylene group, and a butenylene group), a divalent aromatic ring group (for example, a phenylene group, a benzylene group, a tolylene group, and a naphthylene group), —S—, —O—, —CO—, —SO$_2$—, —N(R$_0$)—, and a divalent linking group obtained by combining these plural groups. Further, $R_0$ is a hydrogen atom or an alkyl group (for example, an alkyl group having 1 to 8 carbon atoms, specifically, a methyl group, an ethyl group, a propyl group, an n-butyl group, a sec-butyl group, a hexyl group, and an octyl group). The respective groups mentioned herein may have a substituent such as an ether group, an ester group, a lactone ring, a hydroxyl group, an amino group, and a cyano group, may have a heteroatom, and may have a double bond or a triple bond.

Examples of the monovalent organic group represented by each of $Y_2$ to $Y_4$ in General Formulae (f1) to (f4) include an alkyl group, an alkenyl group, an alkynyl group, a cycloalkyl group, and an aryl group, each of which may have a heteroatom. These respective groups may have a substituent such as a hydroxyl group, an ether group, an ester group, an amino group, an amido group, a sulfonic acid ester group, a halogen atom, a cyano group, a nitro group, a carbonate group, a carbamate group, a thiol group, a sulfide group, a thioketone group, and an aromatic heterocycle.

The alkyl group represented by each of $Y_2$ to $Y_4$ may be linear or branched, and preferably has 1 to 10 carbon atoms, and more preferably 1 to 3 carbon atoms, and examples thereof include a methyl group, an ethyl group, an n-propyl group, an isopropyl group, and an n-butyl group.

The alkenyl group represented by each of $Y_2$ to $Y_4$ preferably has 3 to 20 carbon atoms, and examples thereof include a vinyl group, an allyl group, an isopropenyl group, and a styryl group.

The alkynyl group represented by each of $Y_2$ to $Y_4$ preferably has 2 to 16 carbon atoms, and examples thereof include an ethynyl group, a 1-propynyl group, a 1-butynyl group, and a trimethylsilylethynyl group.

The cycloalkyl group represented by each of $Y_2$ to $Y_4$ may be monocyclic or polycyclic, preferably has 3 to 10 carbon atoms, and more preferably has 4 to 8 carbon atoms, and examples thereof include a cyclopropyl group, a cyclobutyl group, a cyclopentyl group, a cyclohexyl group, a norbornyl group, and an adamantyl group.

Examples of the aryl group represented by each of $Y_2$ to $Y_4$ include a phenyl group, a benzyl group, a tolyl group, and a naphthyl group.

Furthermore, the monovalent organic group represented by each of $Y_2$ to $Y_4$ may constitute the repeating unit of the resin (Ab). In this case, the monovalent organic group represented by each of $Y_2$ to $Y_4$ represents a group represented by the following formula. $R_{fa}$ in the following formula is as described above.

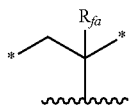

Specific examples of the repeating units represented by General Formulae (f1) to (f4) are shown below, but the present invention is not limited thereto.

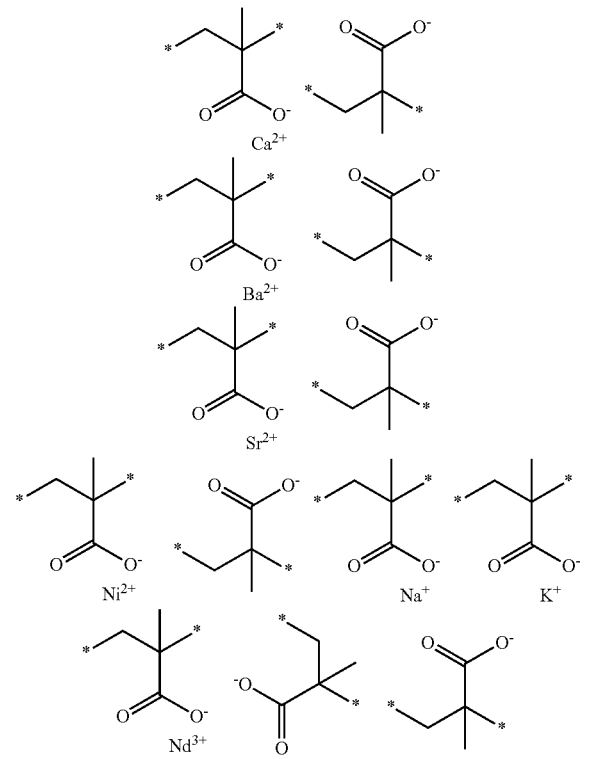

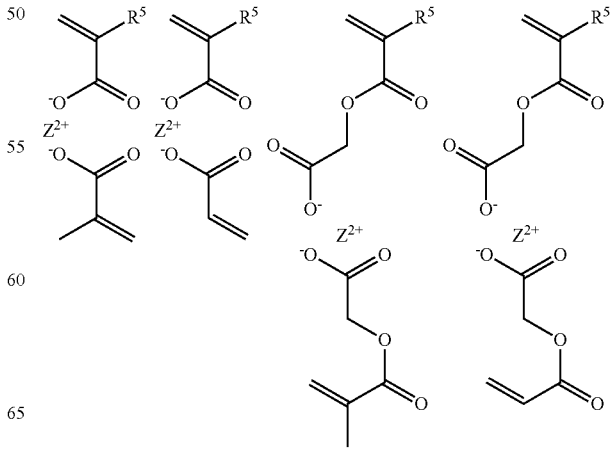

Furthermore, examples of the monomers for obtaining the repeating unit represented by General Formula (f2) include, but not limited to, the monomers exemplified by the following formulae.

In addition, in the following formulae, $R^5$ corresponds to the above-mentioned $R_{fa}$, and Z represents a metal atom belonging to Groups 1 to 10 and 13 to 16 (here, excluding Mg) which is a divalent metal atom.

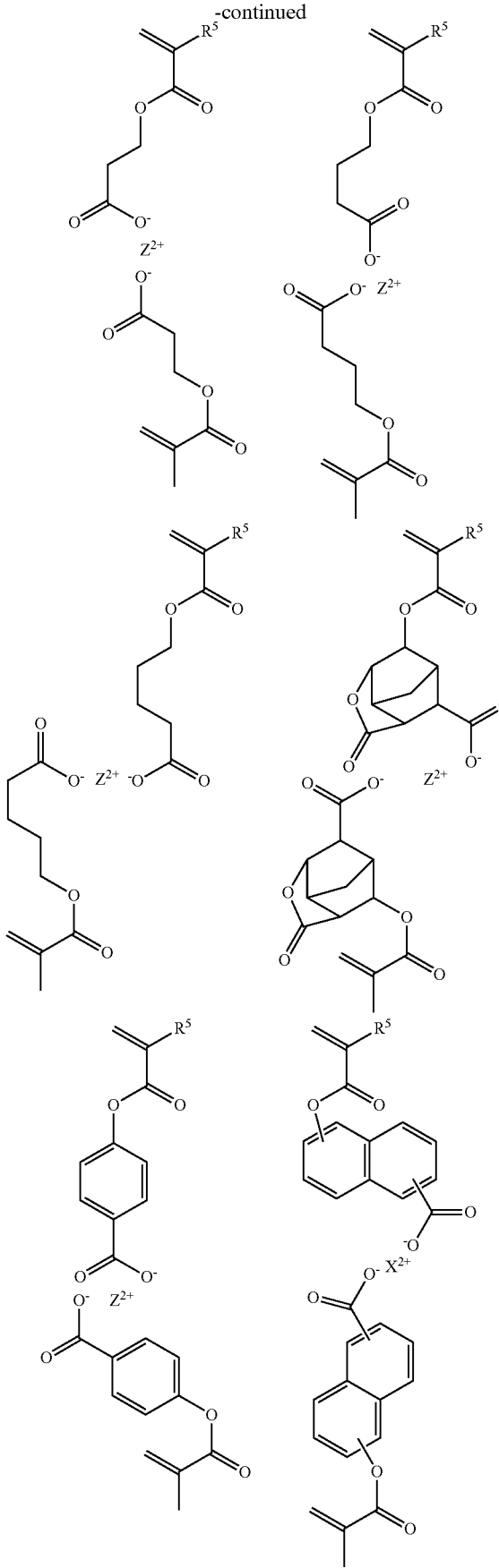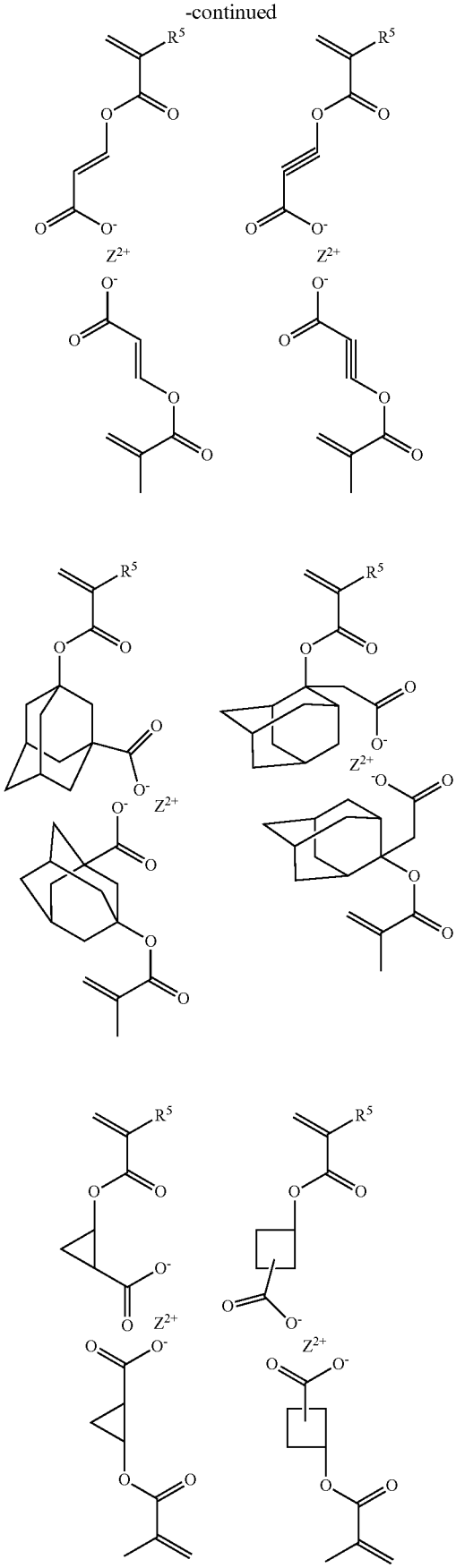

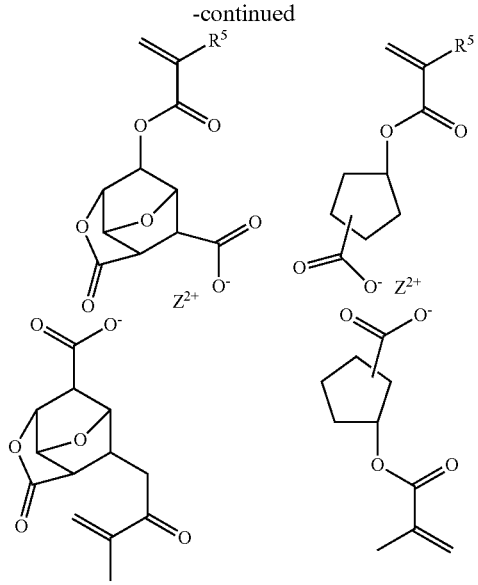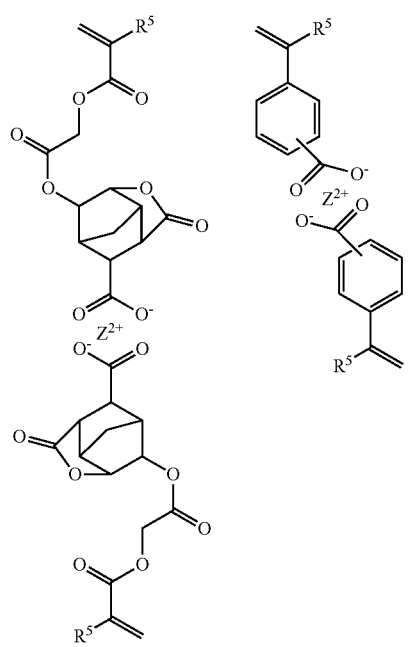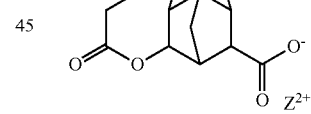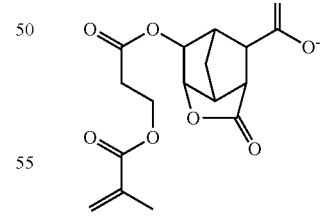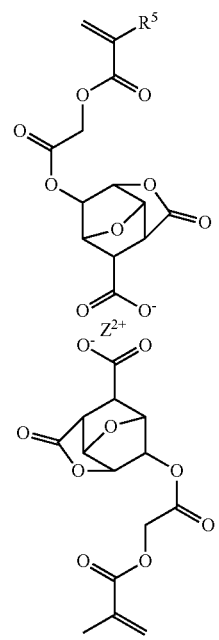

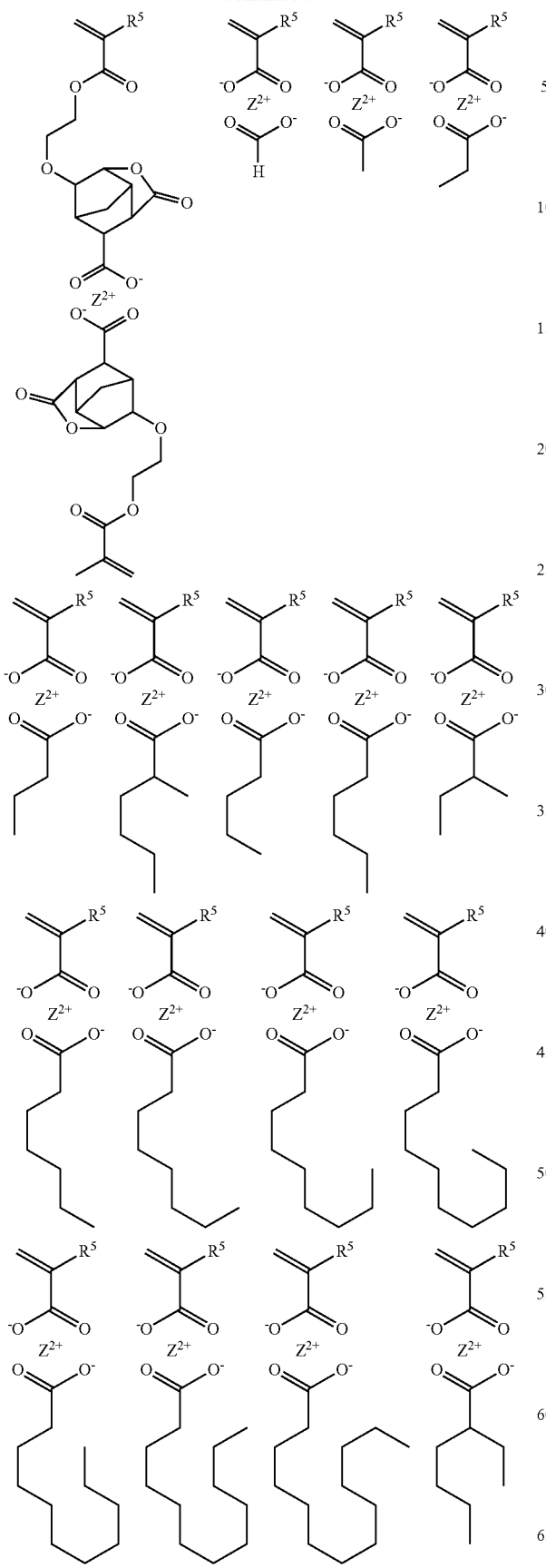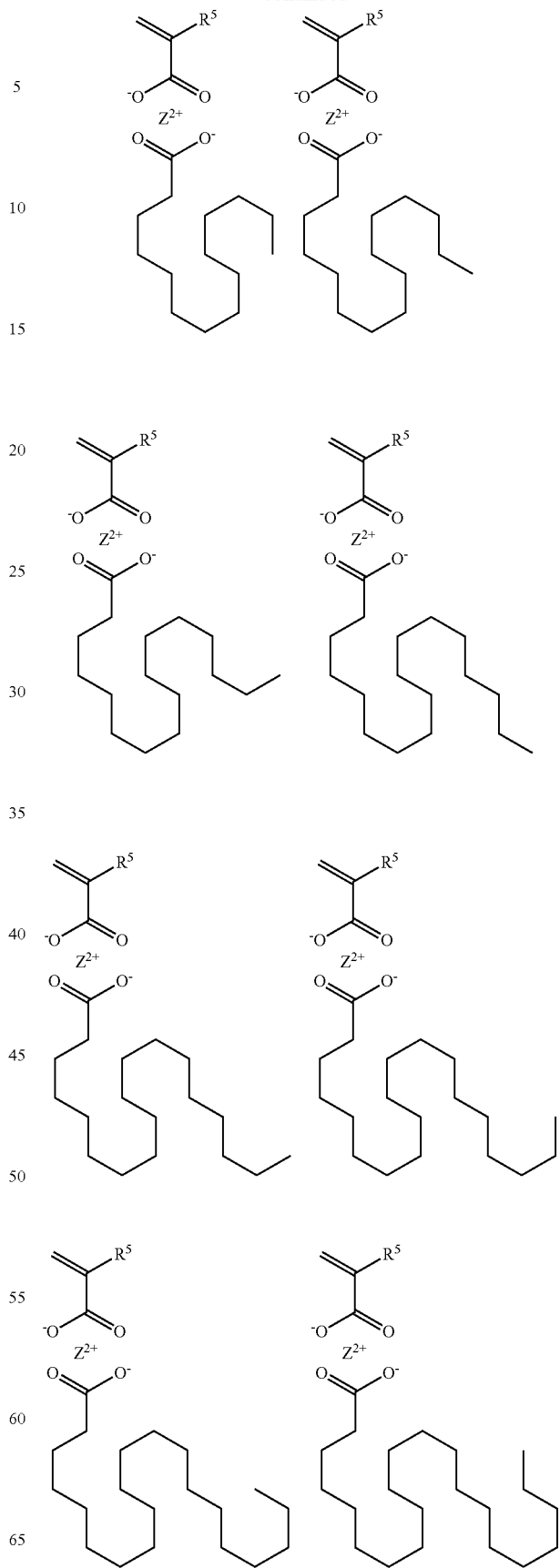

-continued
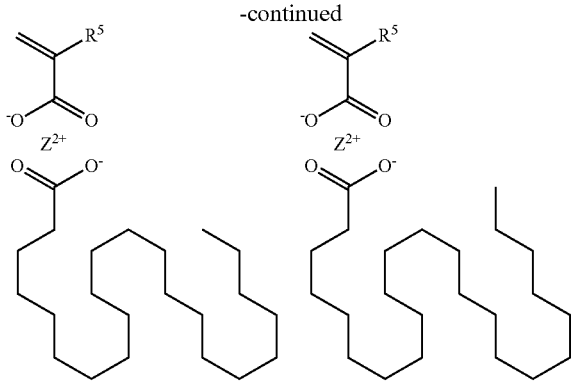
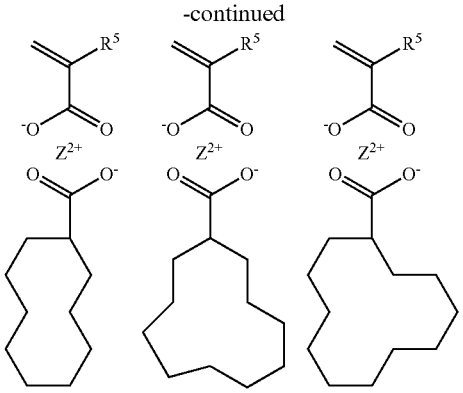
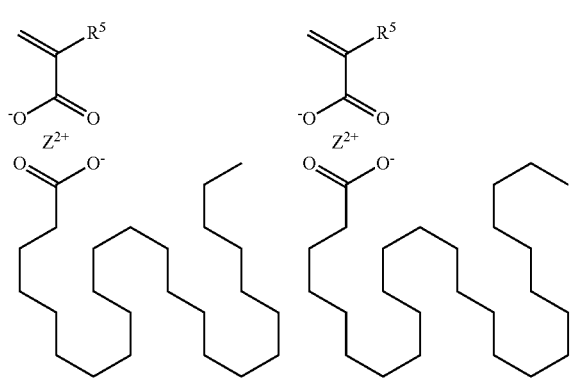
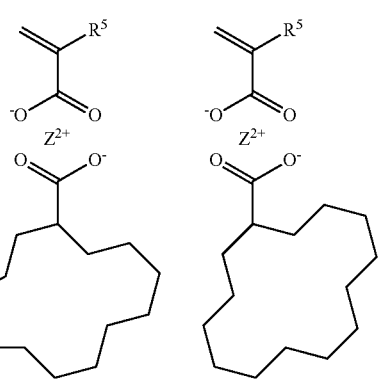
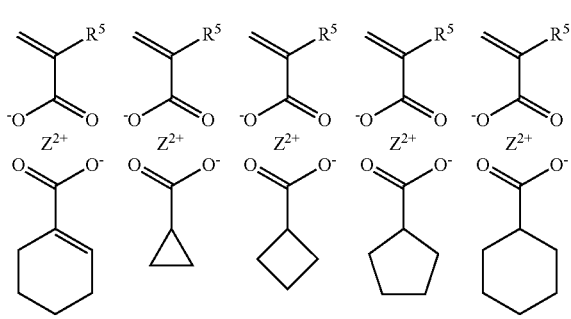
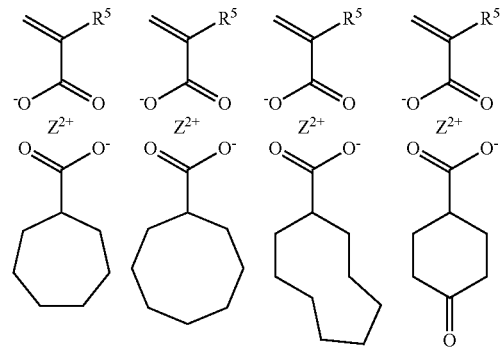
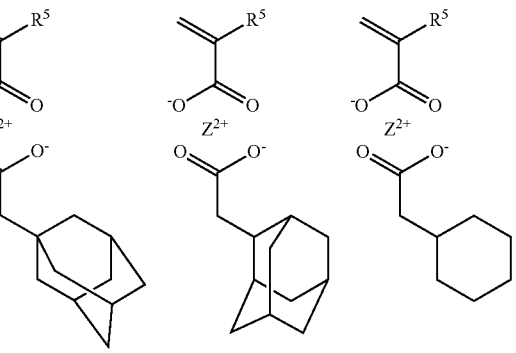

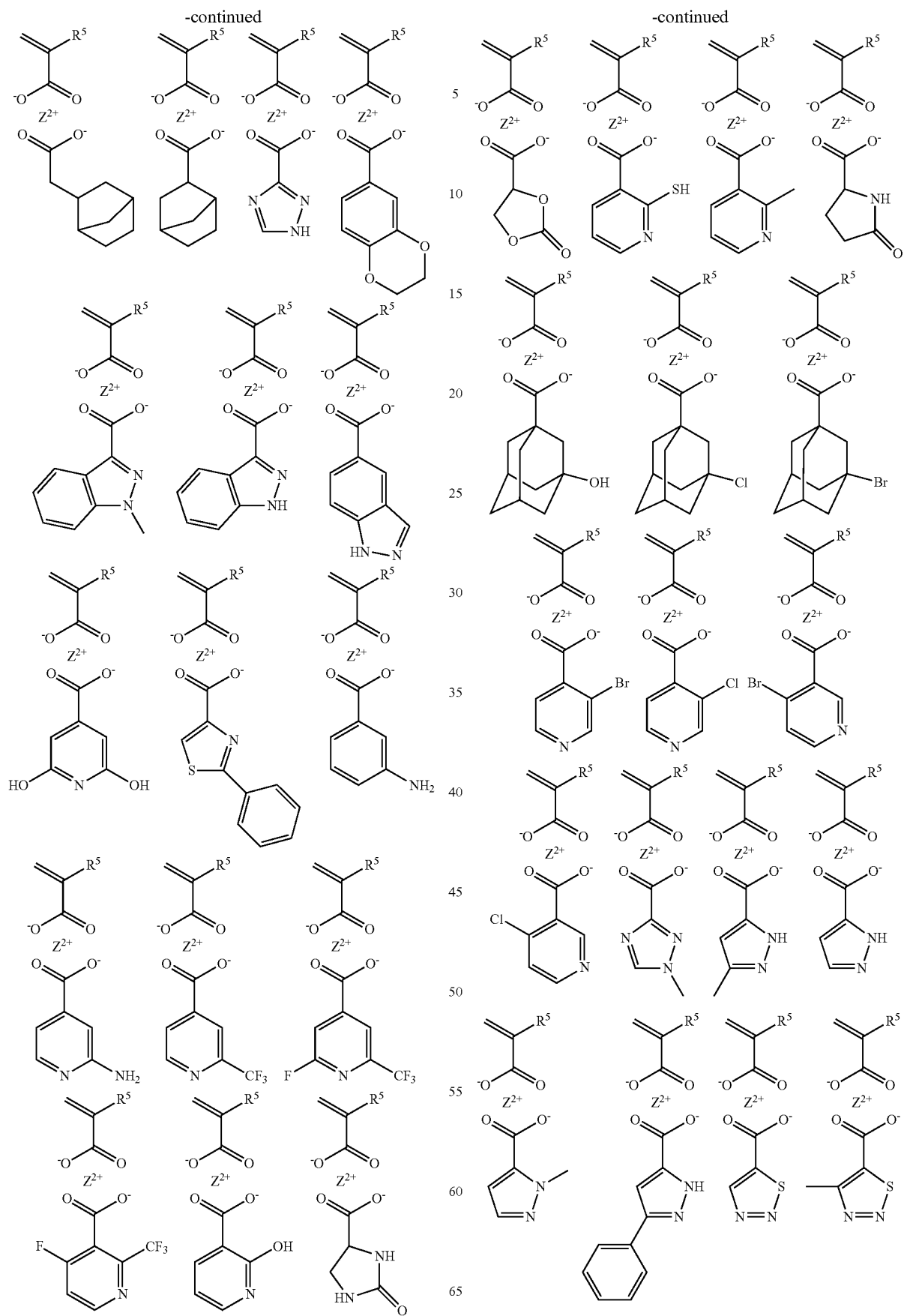

-continued
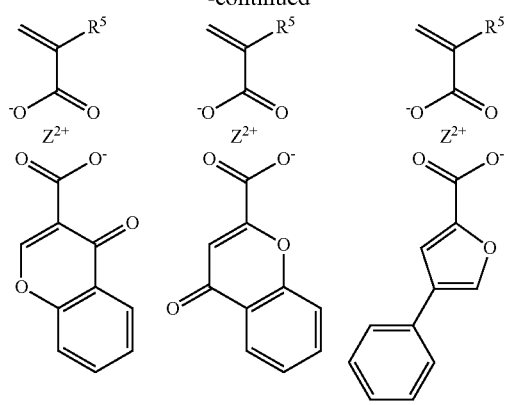
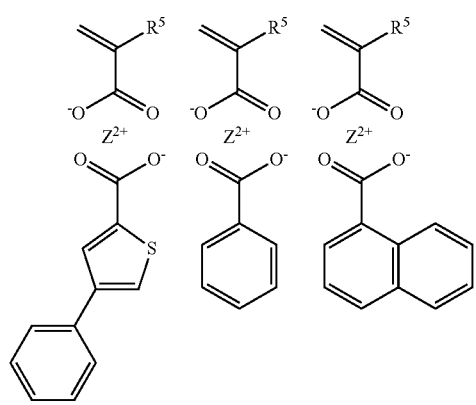
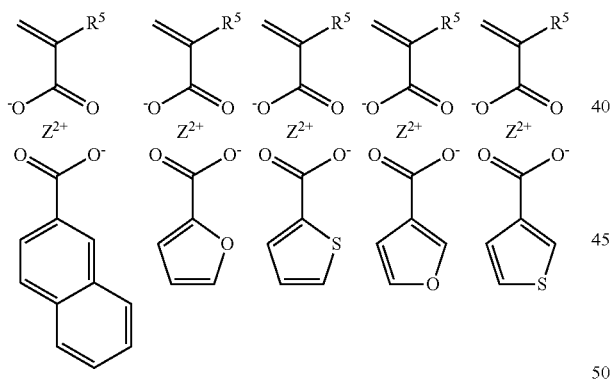
-continued
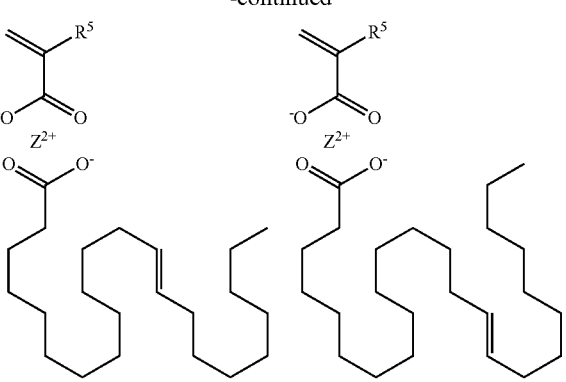
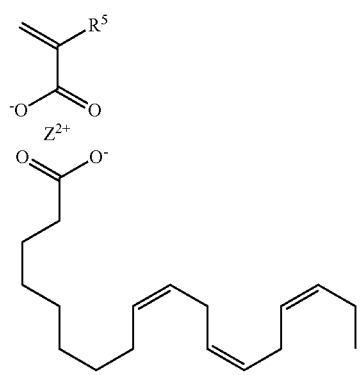
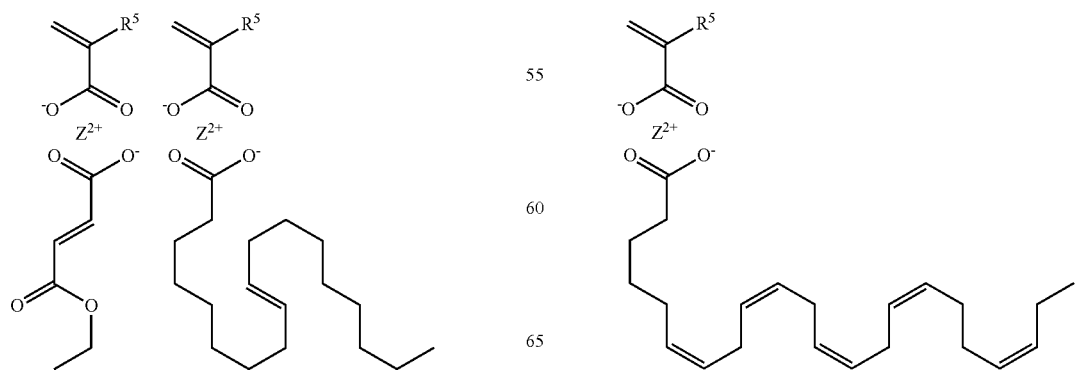

-continued
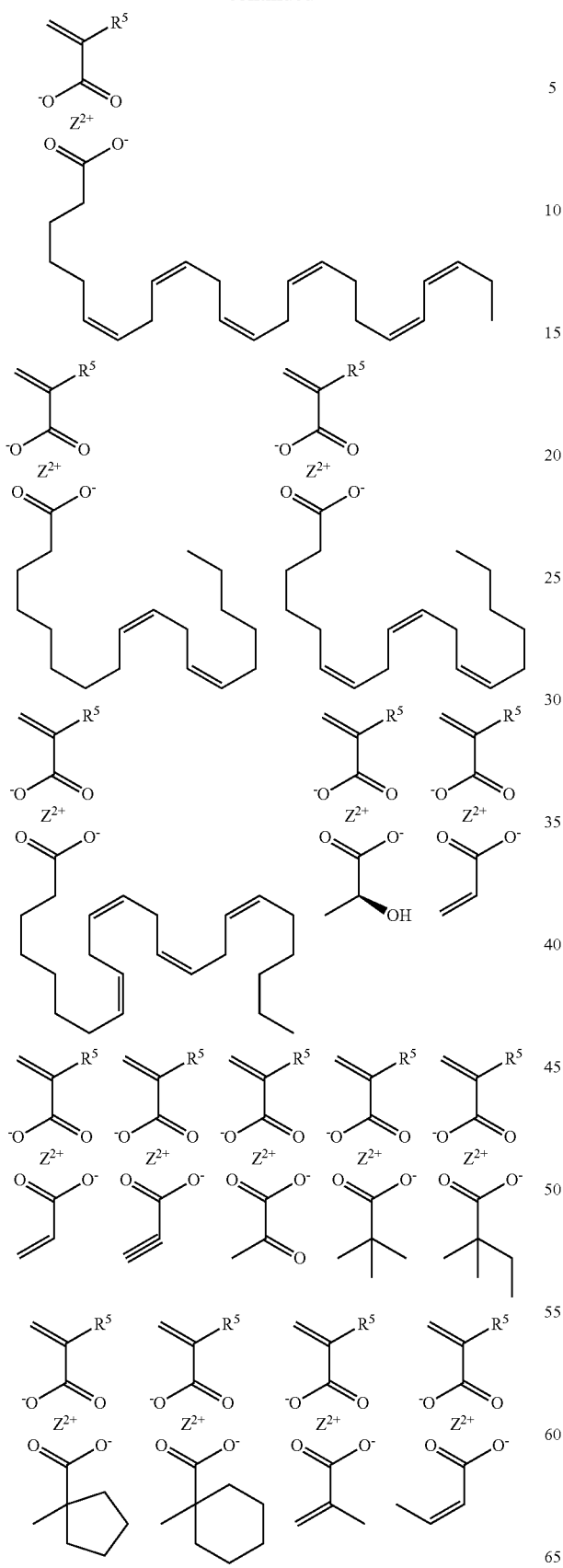
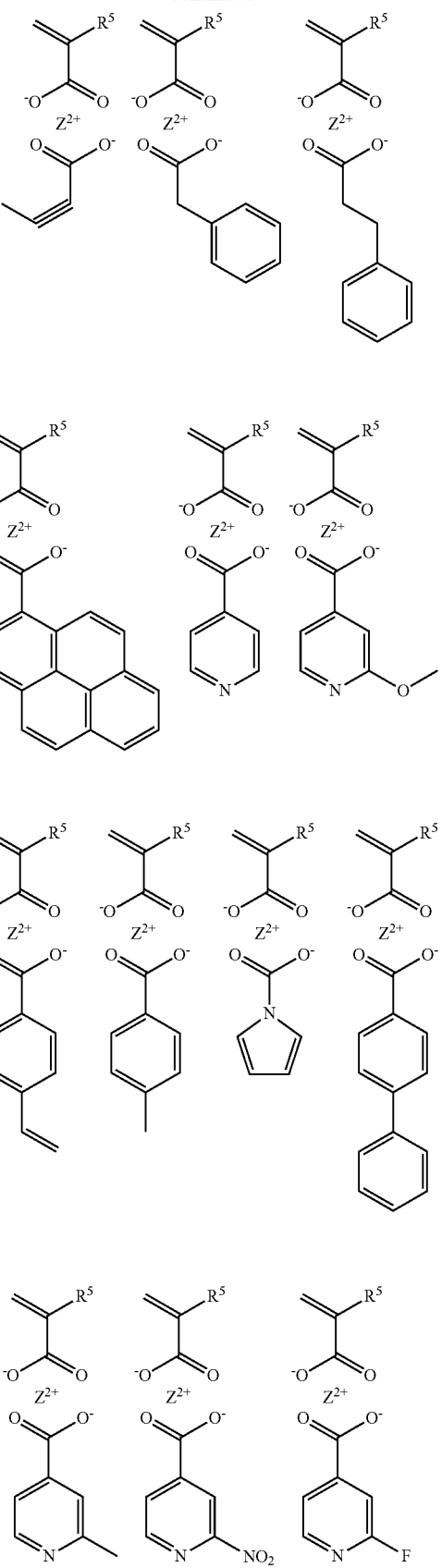

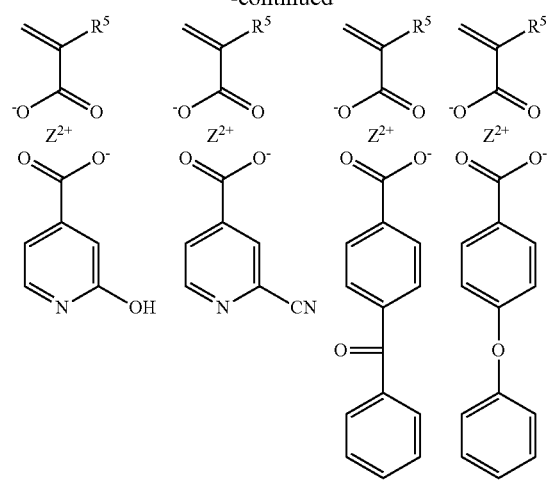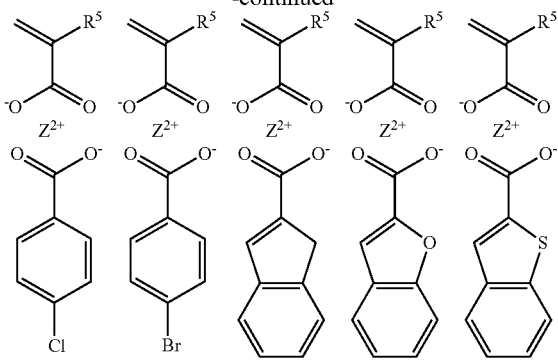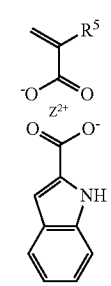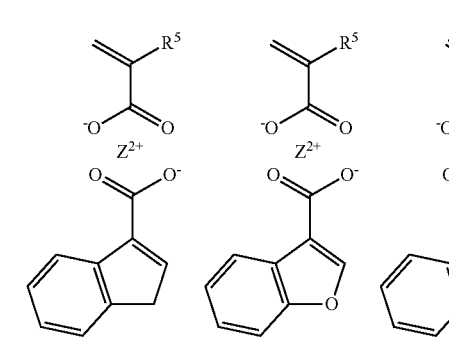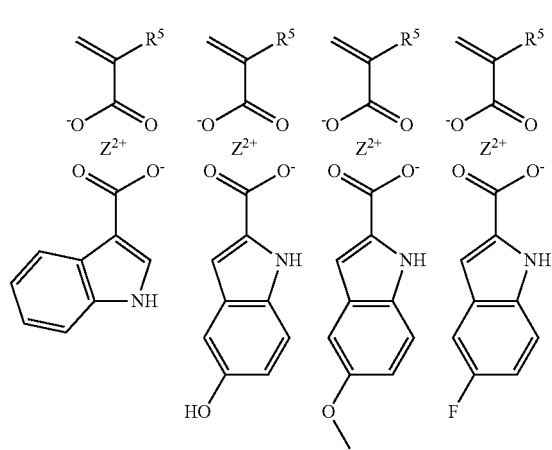

-continued
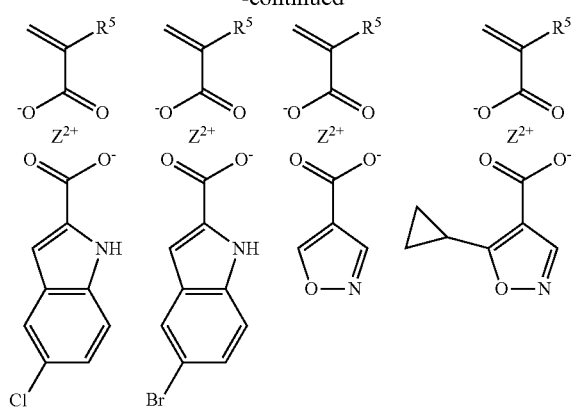
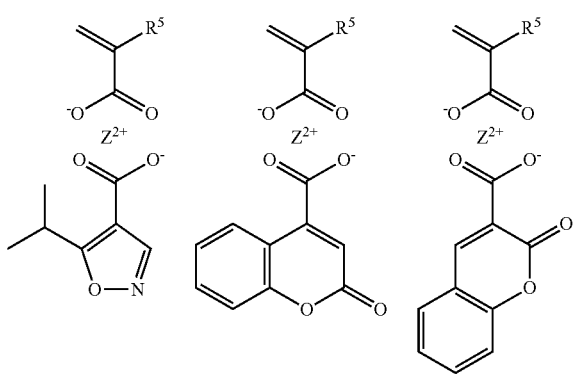
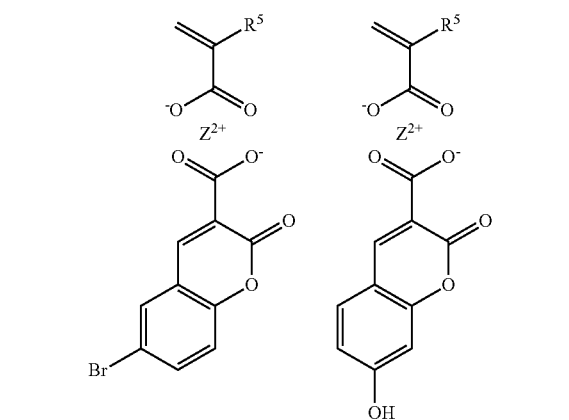
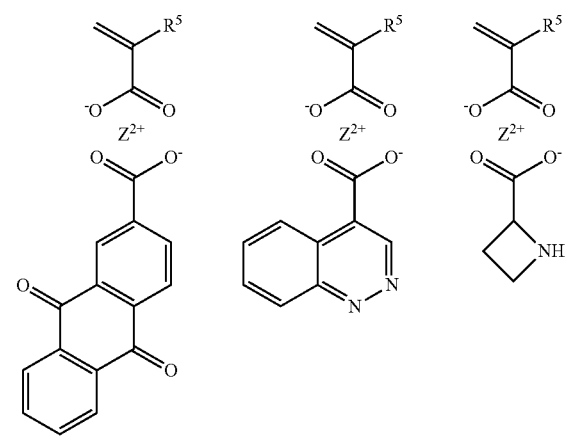
-continued
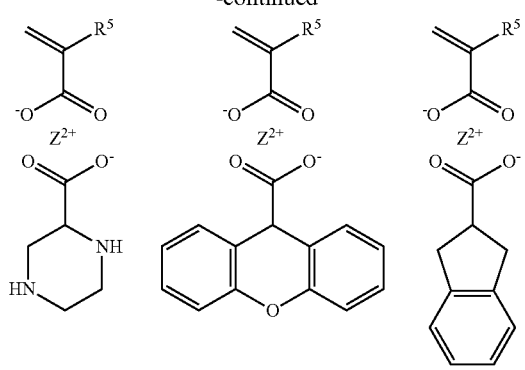
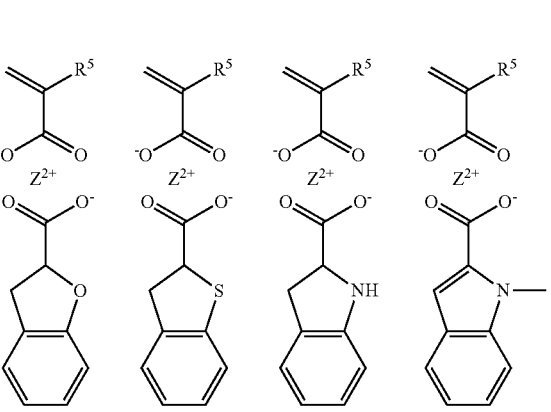
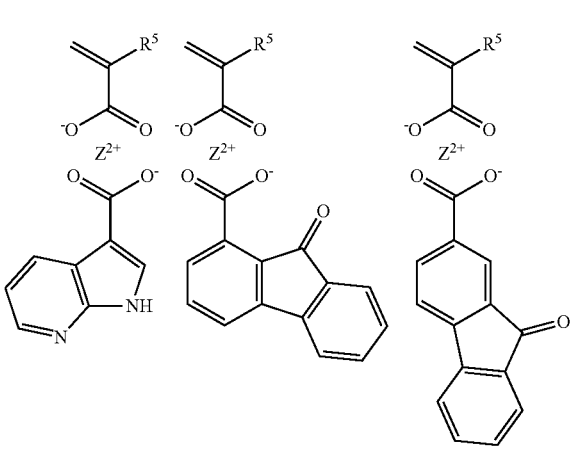
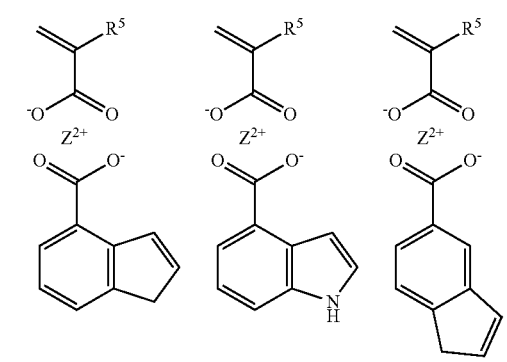

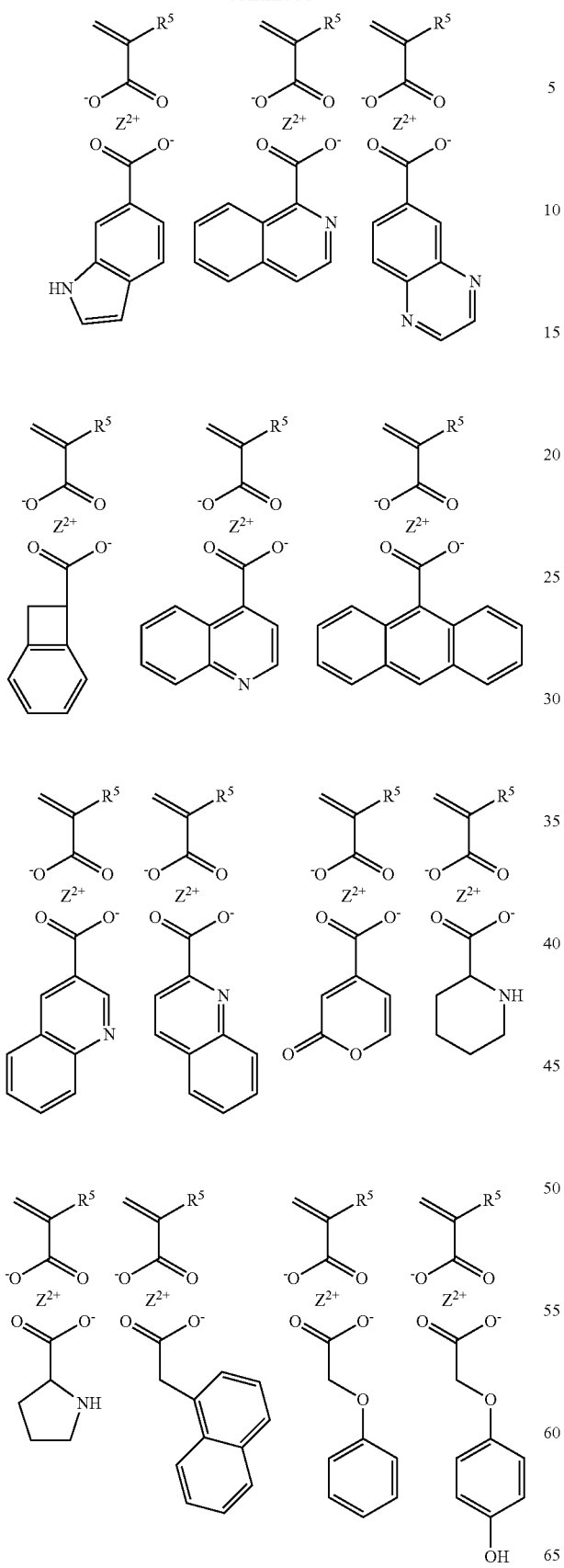
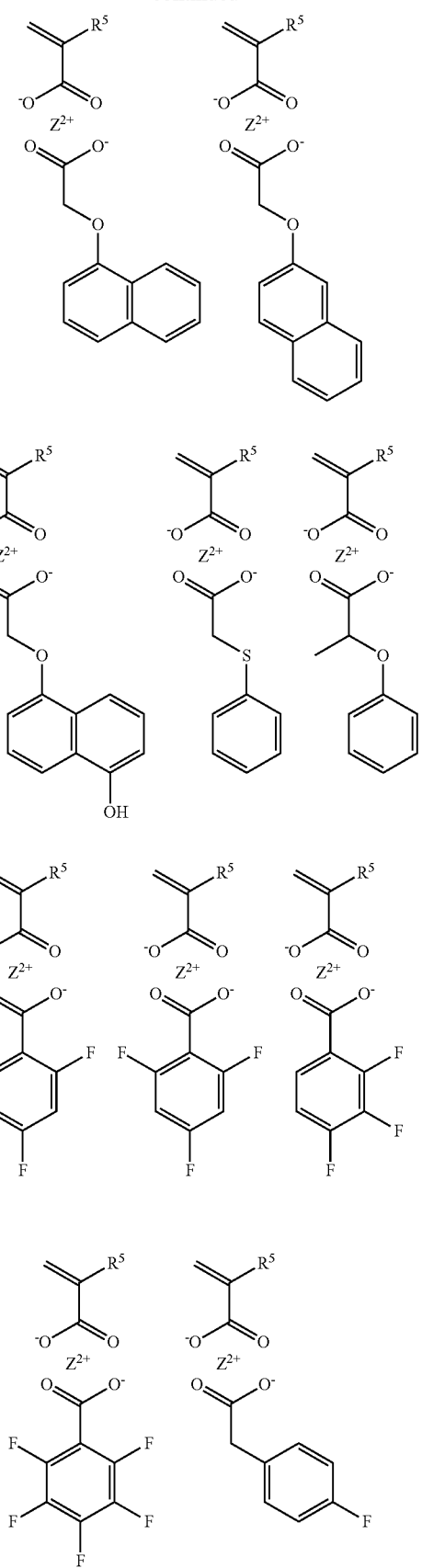

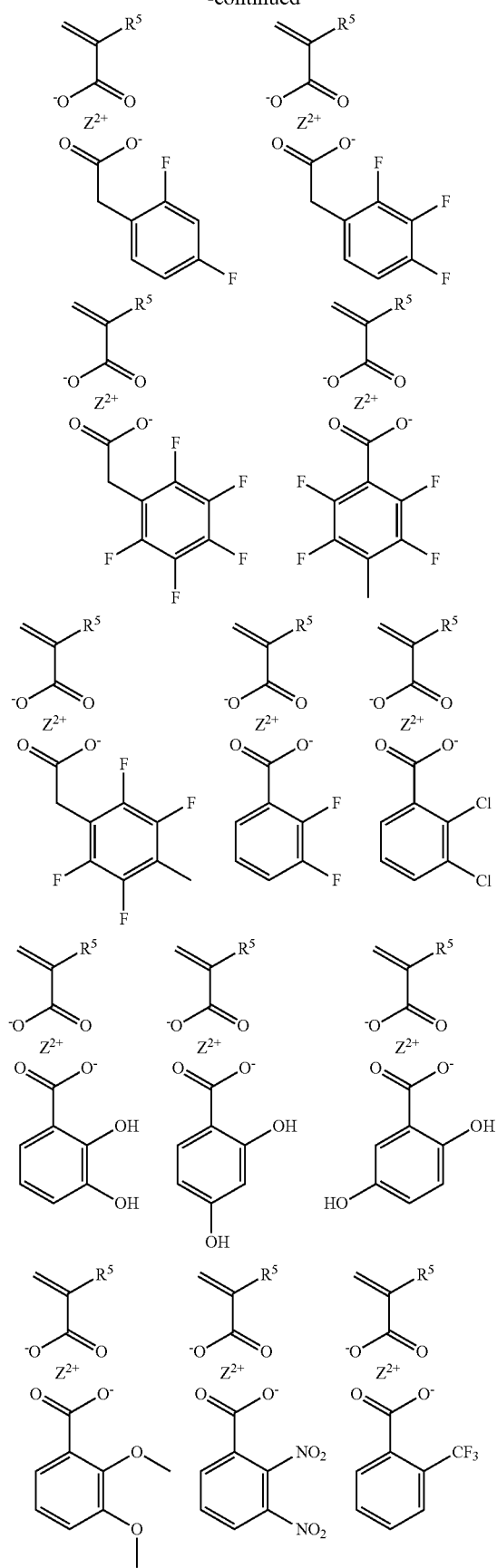
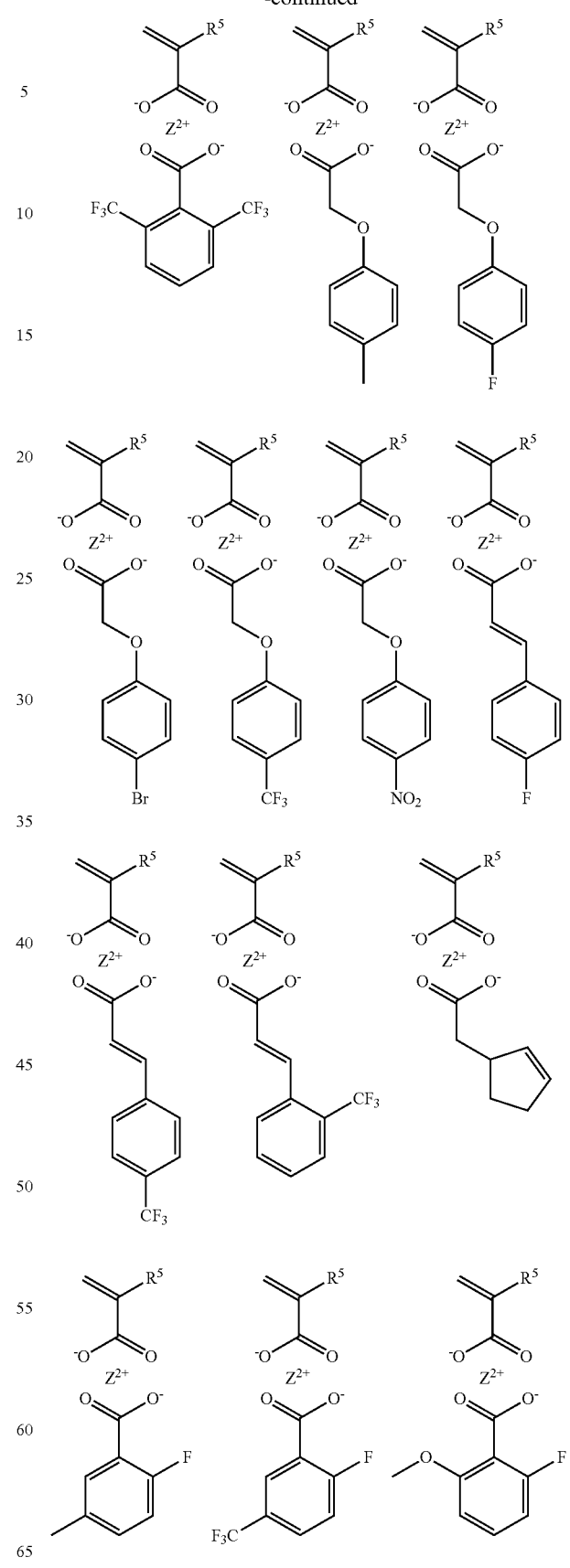

-continued
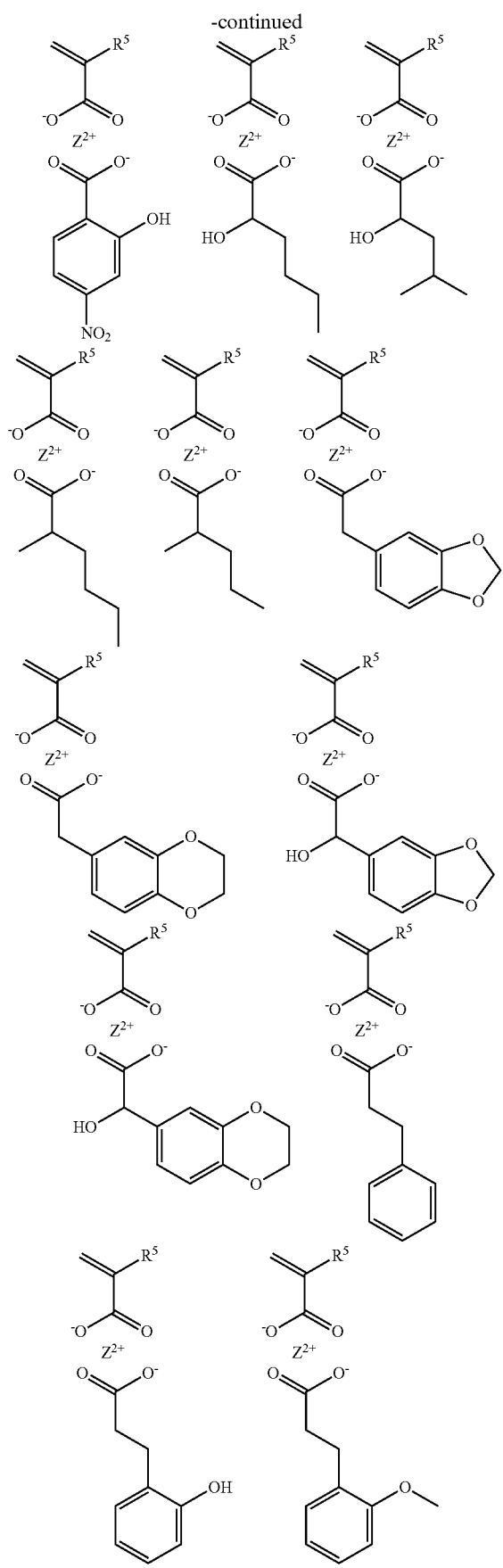
-continued
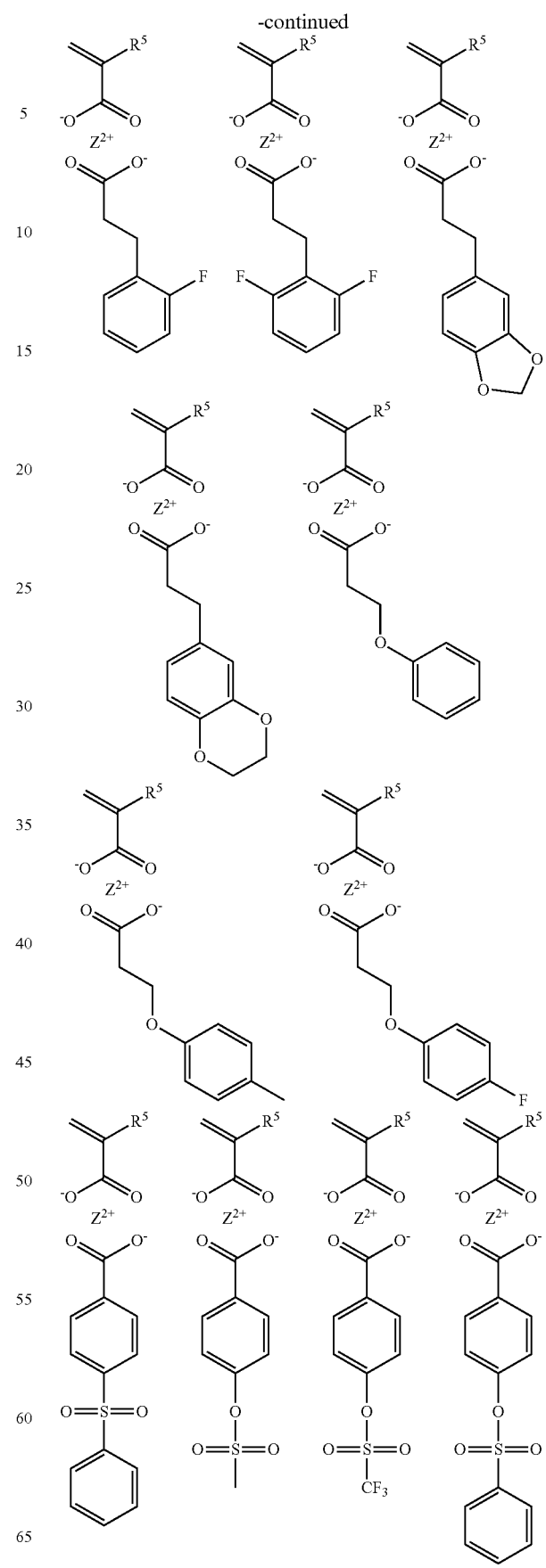

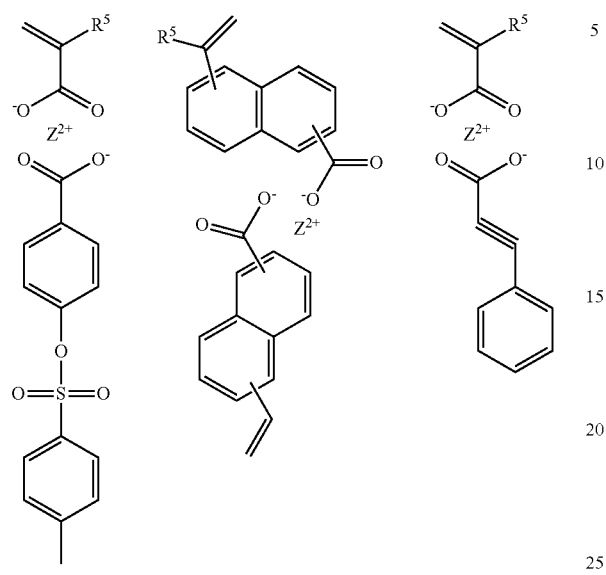
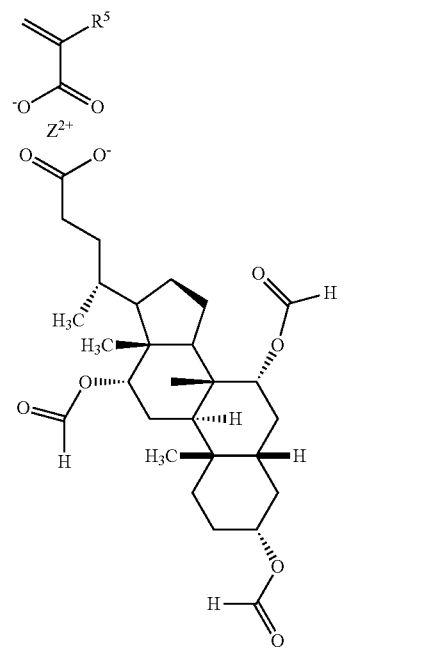
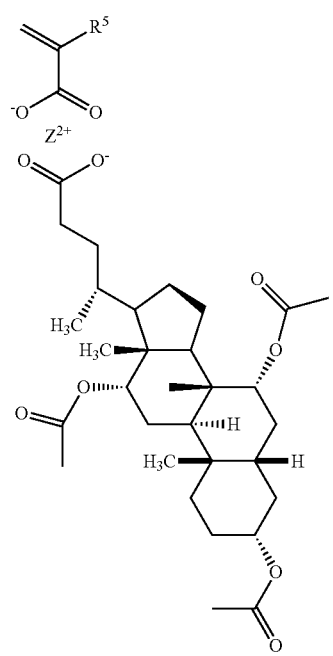
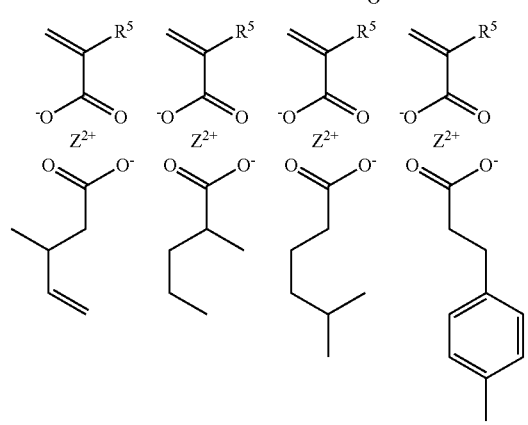

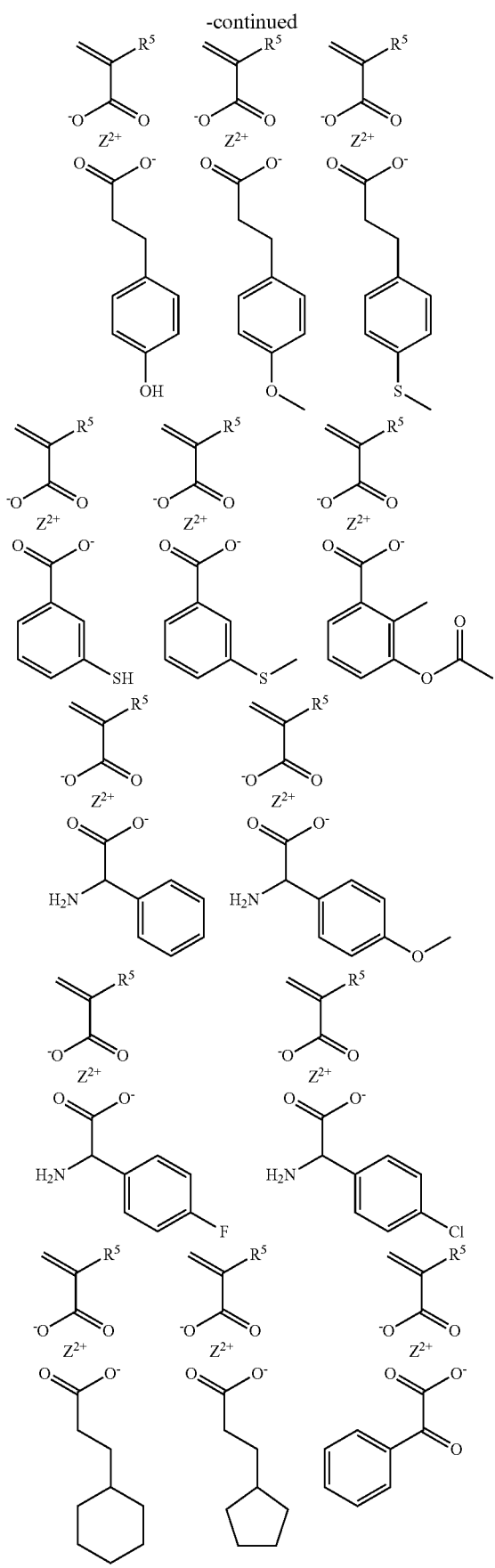
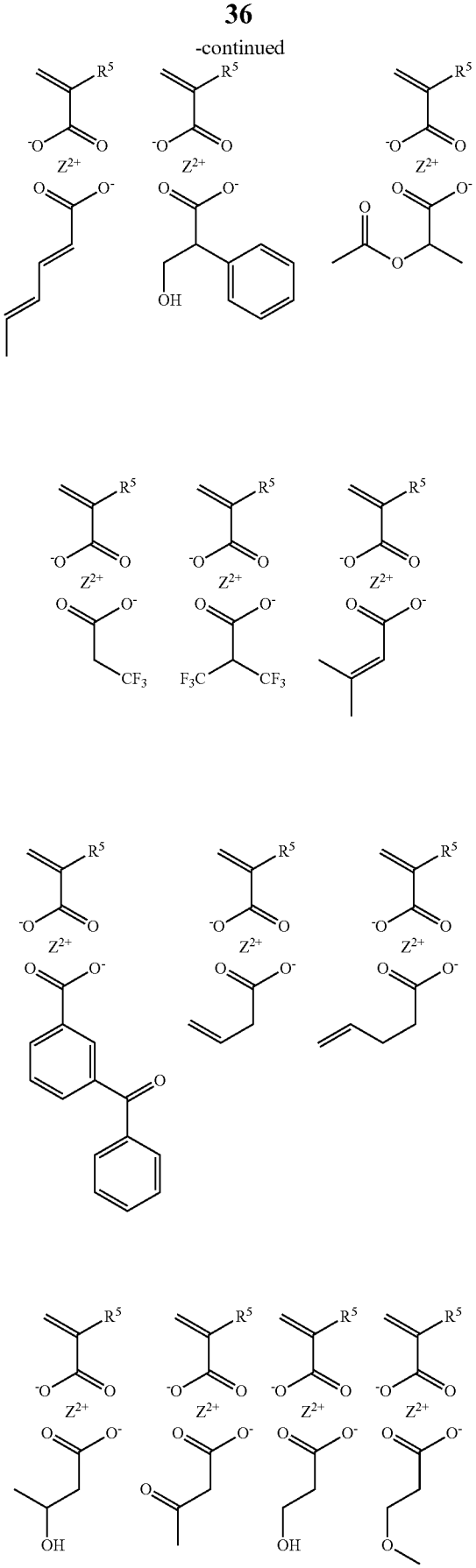

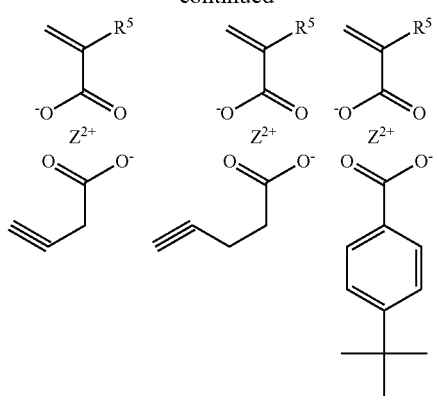
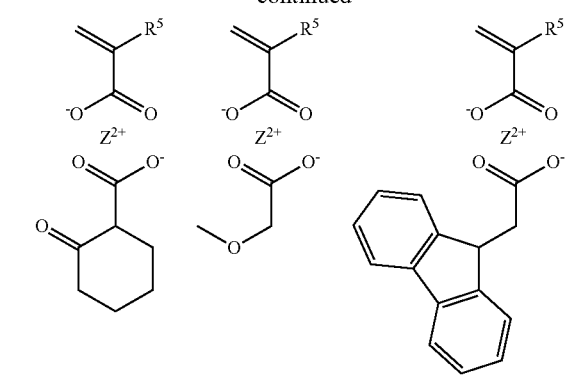
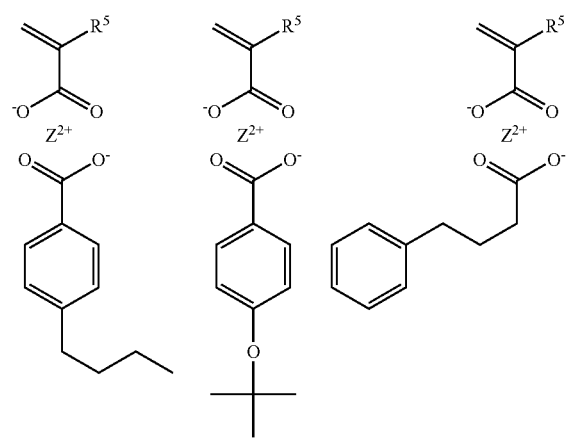
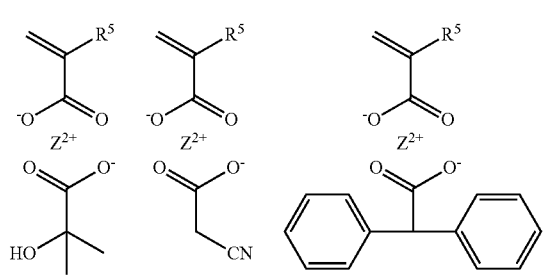
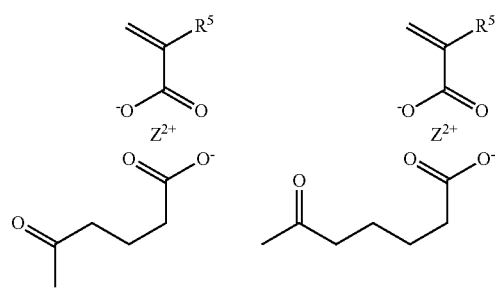

Moreover, examples of the monomer for obtaining the repeating unit represented by General Formula (f1) include the monomers exemplified by the following formulae, but are not limited thereto. Further, in the following formulae, $R^5$ corresponds to the above-mentioned $R_{fa}$, and Z represents a metal atom belonging to Groups 1 to 10 and 13 to 16 (here, excluding Cs) which is a monovalent metal atom.

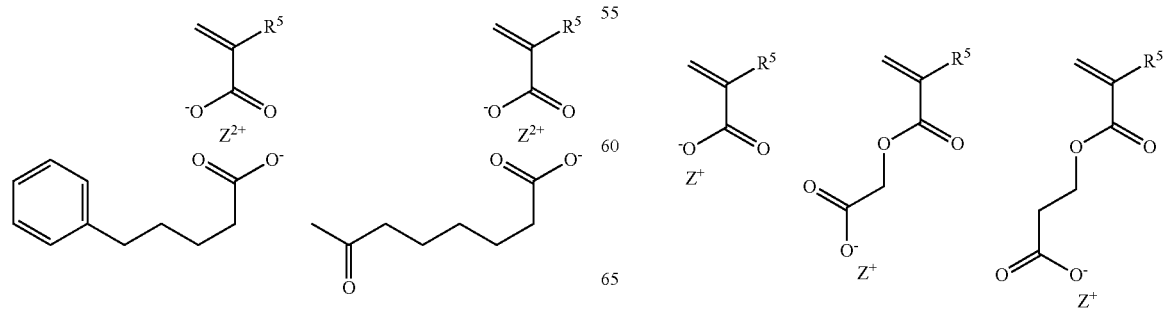

-continued

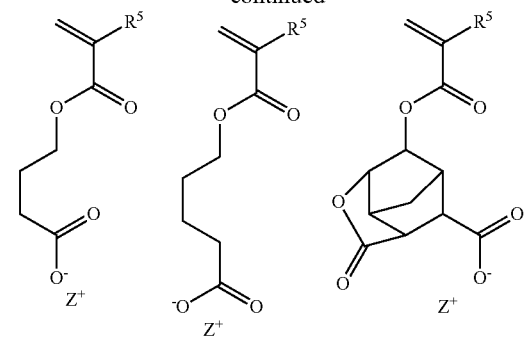

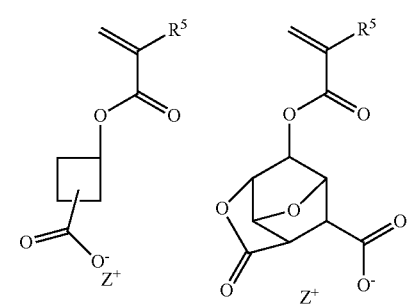

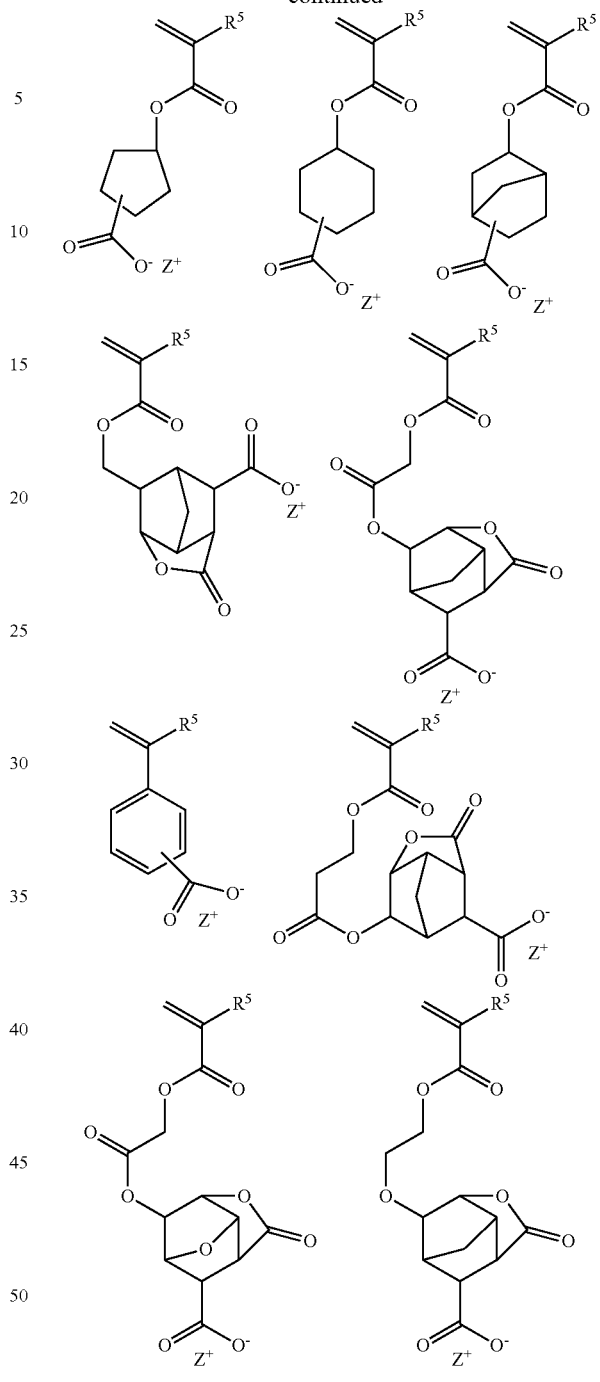

The content of the repeating units represented by General Formulae (f1) to (f4) in the resin (Ab) is preferably 1% to 80% by mole, more preferably 2% to 50% by mole, and still more preferably 5% to 30% by mole, with respect to all the repeating units.

The resin (Ab) is a resin whose polarity is changed by the action of an acid, and preferably has a repeating unit having an acid-decomposable group.

Examples of the acid-decomposable group include a group in which a hydrogen atom of a polar group such as a carboxyl group, a phenolic hydroxyl group, a sulfonic acid group, and a thiol group is protected with a group that leaves by the action of an acid.

Examples of the group that leaves by the action of an acid include —C($R_{36}$)($R_{37}$)($R_{38}$), —C($R_{36}$)($R_{37}$)(O$R_{39}$), —C(=O)—O—C($R_{36}$)($R_{37}$)($R_{38}$), —C($R_{01}$)($R_{02}$)(O$R_{39}$), and —C($R_{01}$)($R_{02}$)—C(=O)—O—C($R_{36}$)($R_{37}$)($R_{38}$).

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring. $R_{01}$ and $R_{02}$ each independently represent a hydrogen atom, an alkyl group, a cycloalkyl group, an aryl group, an aralkyl group, or an alkenyl group.

In one embodiment, the resin (Ab) preferably contains a repeating unit represented by the following General Formula (AI) as a repeating unit having an acid-decomposable group.

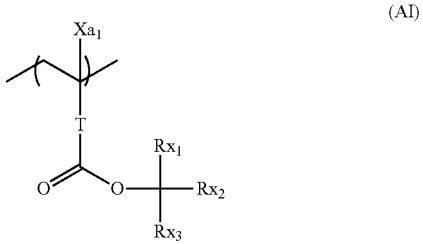
(AI)

In General Formula (AI), $Xa_1$ represents a hydrogen atom, a methyl group, or a group represented by —CH$_2$—$R_9$. $R_9$ represents a hydroxyl group or a monovalent organic group, and examples thereof include an alkyl group having 5 or less carbon atoms, and an acyl group, with an alkyl group having 3 or less carbon atoms being preferable, and a methyl group being more preferable. $Xa_1$ preferably represents a hydrogen atom, a methyl group, a trifluoromethyl group, or a hydroxymethyl group.

T represents a single bond or a divalent linking group.

$Rx_1$ to $Rx_3$ each independently represent an (linear or branched) alkyl group or an (monocyclic or polycyclic) cycloalkyl group.

At least two members of $Rx_1$ to $Rx_3$ may be bonded to each other to form an (monocyclic or polycyclic) cycloalkyl group.

Examples of the divalent linking group of T include an alkylene group, a —COO-Rt- group, and an —O-Rt- group. In the formulae, Rt represents an alkylene group or a cycloalkylene group.

T is preferably a single bond or a —COO-Rt- group. Rt is preferably an alkylene group having 1 to 5 carbon atoms, and more preferably a —CH$_2$— group or a —(CH$_2$)$_3$— group.

The alkyl group of each of $Rx_1$ to $Rx_3$ is preferably one having 1 to 4 carbon atoms, such as a methyl group, an ethyl group, an n-propyl group, an isopropyl group, an n-butyl group, an isobutyl group, and a t-butyl group.

As the cycloalkyl group of each of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group is preferable.

As the cycloalkyl group formed by bonding of at least two members of $Rx_1$ to $Rx_3$, a monocyclic cycloalkyl group such as a cyclopentyl group and a cyclohexyl group, or a polycyclic cycloalkyl group such as a norbornyl group, a tetracyclodecanyl group, a tetracyclododecanyl group, or an adamantyl group.

An embodiment in which $Rx_1$ is a methyl group or an ethyl group, and $Rx_2$ and $Rx_3$ are bonded to each other thereby form any of the above-mentioned cycloalkyl groups is preferable.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), with the substituents having 8 or less carbon atoms being preferable.

In another embodiment, it is preferable that the resin (Ab) contains at least one of repeating units represented by the following General Formulae (A1) and (A2).

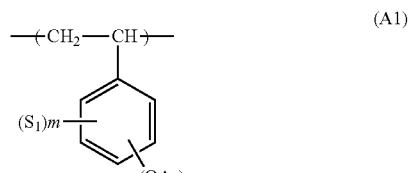
(A1)

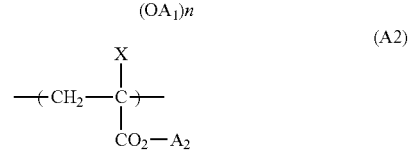
(A2)

In General Formula (A1).

n represents an integer of 1 to 5, and m represents an integer of 0 to 4 satisfying the relationship $1 \leq m+n \leq 5$.

$S_1$ represents a substituent (other than a hydrogen atom), and in a case where m is 2 or more, a plurality of $S_1$'s may be the same as or different from each other.

$A_1$ represents a hydrogen atom or a group that leaves by the action of an acid, provided that at least one $A_1$ represents a group that leaves by the action of an acid. In a case where $n \geq 2$, a plurality of $A_1$'s may be the same as or different from each other.

In General Formula (A2),

X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group, or an aralkyl group.

$A_2$ represents a group that leaves by the action of an acid.

First, the repeating unit represented by General Formula (A1) will be described.

As described above, n represents an integer of 1 to 5, and n is preferably 1 or 2, and particularly preferably 1.

As described above, m represents an integer of 0 to 4 satisfying the relationship $1 \leq m+n \leq 5$, and m is preferably 0 to 2, more preferably 0 or 1, and particularly preferably 0.

As described above, $S_1$ represents a substituent (other than a hydrogen atom). Examples of the substituent include the same ones as the substituents described with regard to $S_1$ in General Formula (A) which will be described later.

As described above, $A_1$ represents a hydrogen atom or a group that leaves by the action of an acid, and at least one $A_1$ is a group that leaves by the action of an acid.

Examples of the group that leaves by the action of an acid include a tertiary alkyl group such as a t-butyl group and a t-amyl group, a t-butoxycarbonyl group, a t-butoxycarbonylmethyl group, and an acetal group represented by a formula —C($L_1$)($L_2$)-O—$Z_2$.

The acetal group represented by the formula —C(L$_1$)(L$_2$)-O—Z$_2$ will be described below. In the formula, L$_1$ and L$_2$ each independently represent a hydrogen atom, an alkyl group, a cycloalkyl group, or an aralkyl group. Z$_2$ represents an alkyl group, a cycloalkyl group, or an aralkyl group. Further, Z$_2$ and L$_1$ may be bonded to each other to form a 5- or 6-membered ring.

The alkyl group may be a linear alkyl group or a branched alkyl group.

The linear alkyl group preferably has 1 to 30 carbon atoms, and more preferably 1 to 20 carbon atoms. Examples of the linear alkyl group include a methyl group, an ethyl group, an n-propyl group, an n-butyl group, a sec-butyl group, an n-pentyl group, an n-hexyl group, an n-heptyl group, an n-octyl group, an n-nonyl group, and an n-decyl group.

The branched alkyl group preferably has 3 to 30 carbon atoms, and more preferably 3 to 20 carbon atoms. Examples of the branched alkyl group include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, and a t-decyl group.

These alkyl groups may further have a substituent. Examples of the substituent include a hydroxyl group; a halogen atom such as fluorine, chlorine, bromine, and iodine atoms; a nitro group; a cyano group; an amido group; a sulfonamido group; an alkyl group such as a methyl group, an ethyl group, a propyl group, an isopropyl group, an n-butyl group, a sec-butyl group, a hexyl group, a 2-ethylhexyl group, an octyl group, and a dodecyl group; an alkoxy group such as a methoxy group, an ethoxy group, a hydroxyethoxy group, a propoxy group, a hydroxypropoxy group, and a butoxy group; an alkoxycarbonyl group such as a methoxycarbonyl group and an ethoxycarbonyl group; an acyl group such as a formyl group, an acetyl group, and a benzoyl group; an acyloxy group such as an acetoxy group and a butyryloxy group; and a carboxyl group.

As the alkyl group, an ethyl group, an isopropyl group, an isobutyl group, a cyclohexylethyl group, a phenylmethyl group, or a phenylethyl group is particularly preferable.

The cycloalkyl may be monocyclic or polycyclic. In the latter case, the cycloalkyl group may be bridged. That is, in this case, the cycloalkyl group may have a bridged structure. Some of carbon atoms of the cycloalkyl group may be substituted with a heteroatom such as an oxygen atom.

The monocyclic cycloalkyl group is preferably one having 3 to 8 carbon atoms. Examples of the cycloalkyl group include a cyclopropyl group, a cyclopentyl group, a cyclohexyl group, a cyclobutyl group, and a cyclooctyl group.

Examples of the polycyclic cycloalkyl group include a group having, for example, a bicyclo, tricyclo, or tetracyclo structure. As the polycyclic cycloalkyl group, one having 6 to 20 carbon atoms is preferable. Examples of the cycloalkyl group include an adamantyl group, a norbornyl group, an isobornyl group, a camphanyl group, a dicyclopentyl group, an α-pinene structure, a tricyclodecanyl group, a tetracyclododecyl group, and an androstanyl group.

Examples of the aralkyl group in each of L$_1$, L$_2$, and Z$_2$ include one having 7 to 15 carbon atoms, such as a benzyl group or a phenethyl group.

These aralkyl groups may further have a substituent. Preferred examples of the substituent include an alkoxy group, a hydroxyl group, a halogen atom, a nitro group, an acyl group, an acylamino group, a sulfonylamino group, an alkylthio group, an arylthio group, and an aralkylthio group. Examples of the substituted aralkyl group include an alkoxy-benzyl group, a hydroxybenzyl group, and a phenylthiophenethyl group. The substituents that can be included in these aralkyl groups preferably have 12 or less carbon atoms.

Examples of the 5- or 6-membered ring formed by the mutual bonding of Z$_2$ and L$_1$ include a tetrahydropyran ring and a tetrahydrofuran ring. Among these, a tetrahydropyran ring is particularly preferable.

Z$_2$ is preferably a linear or branched alkyl group. Thus, the effects of the present invention become more remarkable.

Specific examples of the repeating unit represented by General Formula (A1) are shown below, but are not limited thereto.

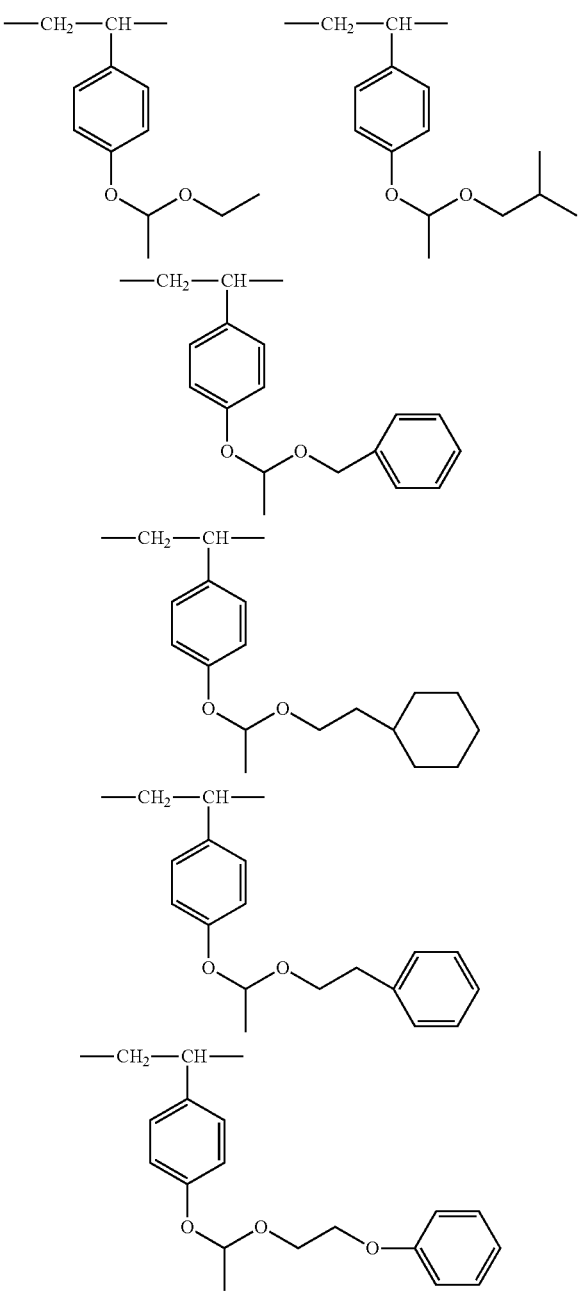

45
-continued
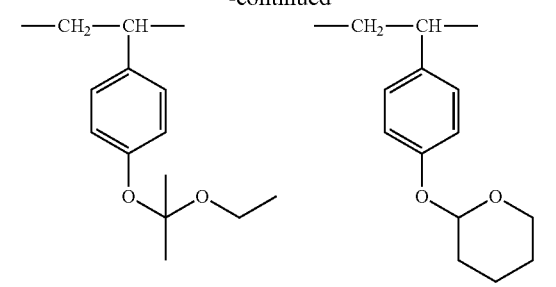
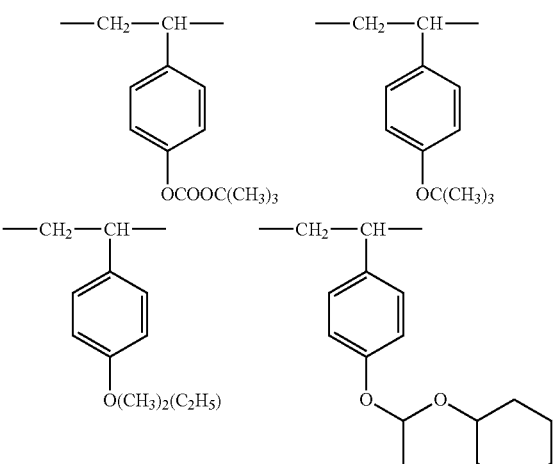
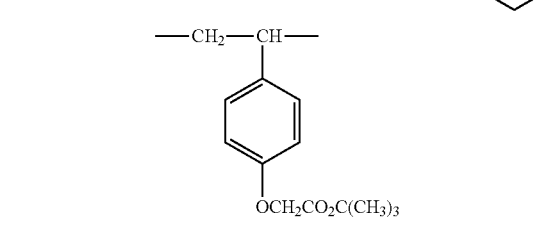
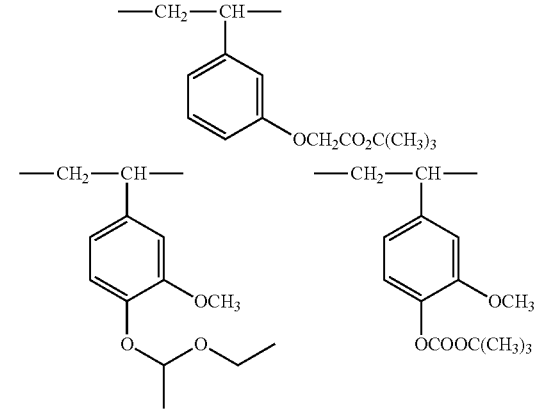
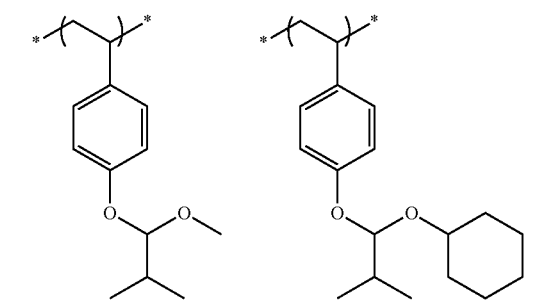
46
-continued
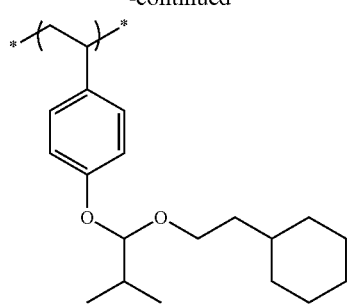
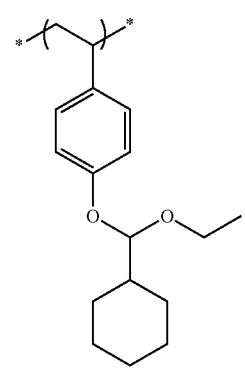 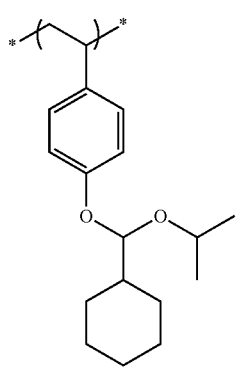
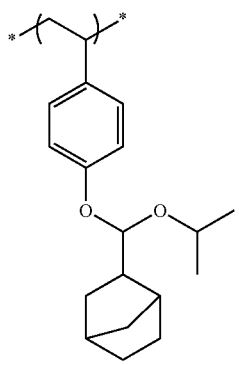 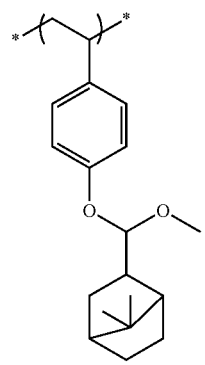
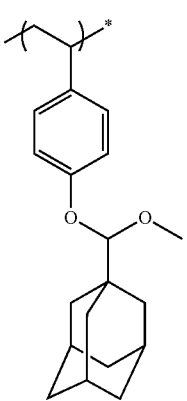 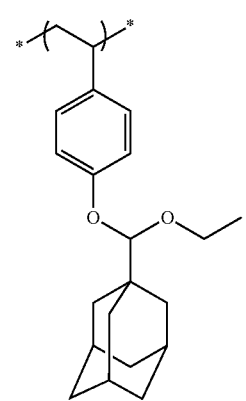

-continued

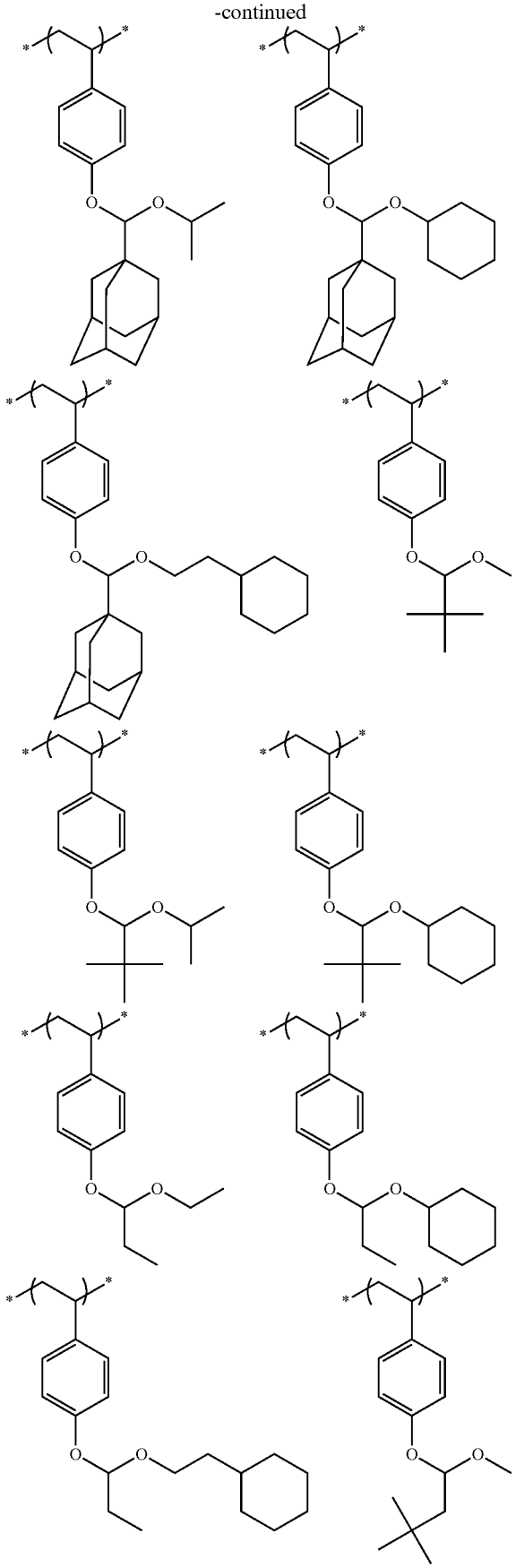

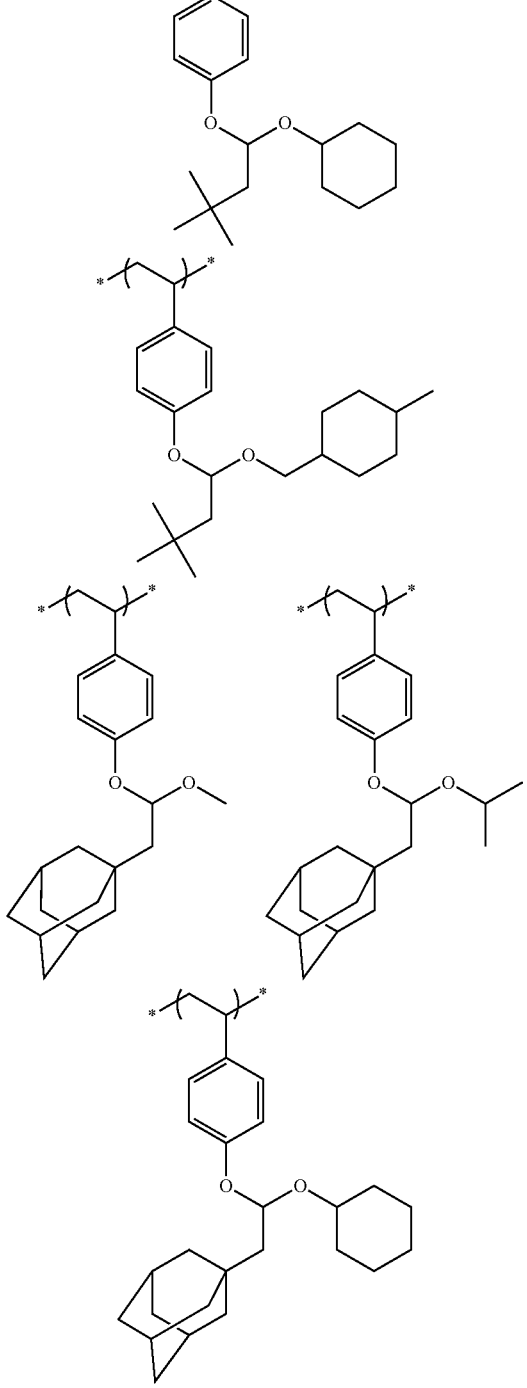

Next, the repeating unit represented by General Formula (A2) will be described.

As described above, X represents a hydrogen atom, an alkyl group, a hydroxyl group, an alkoxy group, a halogen atom, a cyano group, a nitro group, an acyl group, an acyloxy group, a cycloalkyl group, a cycloalkyloxy group, an aryl group, a carboxyl group, an alkyloxycarbonyl group, an alkylcarbonyloxy group, or an aralkyl group.

The alkyl group as X may contain a substituent, and may be linear or branched. The linear alkyl group preferably has 1 to 30 carbon atoms, and more preferably 1 to 20 carbon atoms, and examples thereof include a methyl group, an ethyl group, an n-propyl group, an n-butyl group, a sec-butyl group, an n-pentyl group, an n-hexyl group, an n-heptyl group, an n-octyl group, an n-nonyl group, and an n-decyl group. The branched alkyl group preferably has 3 to 30 carbon atoms, and more preferably 3 to 20 carbon atoms, and examples thereof include an i-propyl group, an i-butyl group, a t-butyl group, an i-pentyl group, a t-pentyl group, an i-hexyl group, a t-hexyl group, an i-heptyl group, a t-heptyl group, an i-octyl group, a t-octyl group, an i-nonyl group, and a t-decyl group.

The alkoxy group as X may contain a substituent, and is, for example, the alkoxy group having 1 to 8 carbon atoms. Examples thereof include a methoxy group, an ethoxy group, a propoxy group, a butoxy group, a pentyloxy group, a hexyloxy group, and a cyclohexyloxy group.

Examples of the halogen atom as X include a fluorine atom, a chlorine atom, a bromine atom, or an iodine atom, with a fluorine atom being preferable.

The acyl group as X may contain a substituent, and is, for example, an acyl group having 2 to 8 carbon atoms. Specific preferred examples thereof include a formyl group, an acetyl group, a propanoyl group, a butanoyl group, a pivaloyl group, and a benzoyl group.

The acyloxy group as X may contain a substituent, and is preferably an acyloxy group having 2 to 8 carbon atoms. Examples thereof include an acetoxy group, a propionyloxy group, a butyryloxy group, a valeryloxy group, a pivaloyloxy group, a hexanoyloxy group, an octanoyloxy group, and a benzoyloxy group.

The cycloalkyl group as X may contain a substituent, and may be monocyclic, polycyclic, or bridged. For example, the cycloalkyl group may have a bridged structure. The monocyclic cycloalkyl group is preferably a cycloalkyl group having 3 to 8 carbon atoms, and examples thereof include a cyclopropyl group, a cyclopentyl group, a cyclohexyl group, a cyclobutyl group, and a cyclooctyl group. Examples of the polycyclic cycloalkyl group include a group having, for example, a bicyclo, tricyclo, or tetracyclo structure having 5 or more carbon atoms. This polycyclic cycloalkyl group is preferably a cycloalkyl group having 6 to 20 carbon atoms. Examples thereof include an adamantyl group, a norbornyl group, an isobornyl group, a camphanyl group, a dicyclopentyl group, an α-pinene structure, a tricyclodecanyl group, a tetracyclododecyl group, and an androstanyl group. Some of carbon atoms of the cycloalkyl group may be substituted with a heteroatom such as an oxygen atom.

The aryl group as X may contain a substituent, and is preferably one having 6 to 14 carbon atoms. Examples thereof include a phenyl group, a xylyl group, a toluyl group, a cumenyl group, a naphthyl group, and an anthracenyl group.

The alkyloxycarbonyl group as X may contain a substituent, and is preferably one having 2 to 8 carbon atoms. Examples thereof include a methoxycarbonyl group, an ethoxycarbonyl group, and a propoxycarbonyl group.

The alkylcarbonyloxy group as X may contain a substituent, and is preferably one having 2 to 8 carbon atoms. Examples thereof include a methylcarbonyloxy group and an ethylcarbonyloxy group.

The aralkyl group as X may contain a substituent, and is preferably one having 7 to 16 carbon atoms, and examples thereof include a benzyl group.

Examples of the substituent which may further be contained in the alkyl group, the alkoxy group, the acyl group, the cycloalkyl group, the aryl group, the alkyloxycarbonyl group, the alkylcarbonyloxy group, and the aralkyl group as X include an alkyl group, a hydroxyl group, an alkoxy group, a halogen atom (a fluorine atom, a chlorine atom, a bromine atom or an iodine atom), a cyano group, a nitro group, an acyl group, an acyloxy group, a cycloalkyl group, an aryl group, a carboxyl group, an alkyloxycarbonyl group, an alkylcarbonyloxy group, and an aralkyl group.

As described above, $A_2$ represents a group that leaves by the action of an acid. That is, the repeating unit represented by General Formula (A2) contains the group represented by a formula "—$COOA_2$" as an acid-decomposable group. Examples of $A_2$ include the same ones as those described above with regard to $A_1$ in General Formula (A1).

$A_2$ is preferably a hydrocarbon group (preferably 20 or less carbon atoms, and more preferably 4 to 12 carbon atoms), and more preferably a t-butyl group, a t-amyl group, or a hydrocarbon group having an alicyclic structure (for example, an alicyclic group per se or an alkyl group substituted with an alicyclic group).

$A_2$ is preferably a tertiary alkyl group or a tertiary cycloalkyl group.

The alicyclic structure may be monocyclic or polycyclic. Specific examples thereof include a monocyclo, bicyclo, tricyclo, or tetracyclo structure having 5 or more carbon atoms. The alicyclic structure preferably has 6 to 30 carbon atoms, and particularly preferably has 7 to 25 carbon atoms. Hydrocarbon groups having these acyclic structures may further have a substituent.

Examples of the alicyclic structure include the alicyclic structures described in paragraphs [0264] and [0265] of JP2013-83966A.

In the present invention, preferred examples of the alicyclic structure include, as expressed as a monovalent alicyclic group, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group. The alicyclic structure is more preferably an adamantyl group, a decalin residue, a norbornyl group, a cedrol group, a cyclohexyl group, a cycloheptyl group, a cyclooctyl group, a cyclodecanyl group, or a cyclododecanyl group.

Examples of the substituents which may be contained in these alicyclic structures include an alkyl group, a halogen atom, a hydroxyl group, an alkoxy group, a carboxyl group, and an alkoxycarbonyl group. The alkyl group is preferably a lower alkyl group such as a methyl group, an ethyl group, a propyl group, an isopropyl group, or a butyl group, and more preferably a methyl group, an ethyl group, a propyl group, or an isopropyl group. Examples of the alkoxy group include one having 1 to 4 carbon atoms, such as a methoxy group, an ethoxy group, a propoxy group, and a butoxy group. The alkyl group and the alkoxy group may further have a substituent. Examples of the substituent which is further included in the alkyl group and the alkoxy group include a hydroxyl group, a halogen atom, and an alkoxy group.

As the acid-decomposable group having an alicyclic structure, a group represented by any one of the following General Formulae (pI) to (pV) is preferable.

(pI)

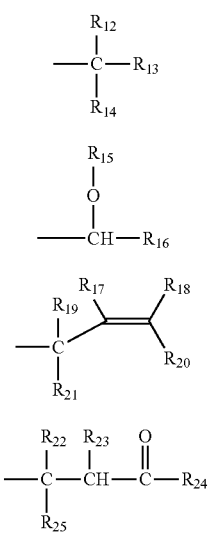

(pII)

(pIII)

(pIV)

(pV)

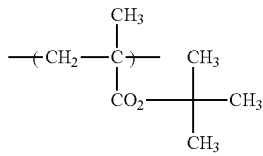

Moreover, in another embodiment, a case where the he repeating unit represented by General Formula (A2) is a repeating unit represented by General Formula (A3) shown below is also preferable.

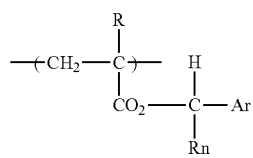

(A3)

In General Formulae (pI) to (pV), $R_{11}$ represents a methyl group, an ethyl group, an n-propyl group, an isopropyl group, an n-butyl group, an isobutyl group, or a sec-butyl group, and Z represents an atomic group required for formation of an alicyclic hydrocarbon group together with a carbon atom.

$R_{12}$ to $R_{16}$ each independently represent an alicyclic hydrocarbon group or a linear or branched alkyl group, having 1 to 4 carbon atoms, provided that at least one of $R_{12}, \ldots,$ or $R_{14}$ or any one of $R_{15}$ and $R_{16}$ represents an alicyclic hydrocarbon group.

$R_{17}$ to $R_{21}$ each independently represent a hydrogen atom, or an alicyclic hydrocarbon group or a linear or branched alkyl group, having 1 to 4 carbon atoms, provided that at least one of $R_{17}, \ldots,$ or $R_{21}$ represents an alicyclic hydrocarbon group. Any one of $R_{19}$ and $R_{21}$ represents an alicyclic hydrocarbon group or a linear or branched alkyl group having 1 to 4 carbon atoms.

$R^{22}$ to $R_{25}$ each independently represent a hydrogen atom, or an alicyclic hydrocarbon group or a linear or branched alkyl group having 1 to 4 carbon atoms, provided that at least one of $R_{22}, \ldots,$ or $R_{25}$ represents an alicyclic hydrocarbon group. $R_{23}$ and $R_{24}$ may be bonded to each other to form a ring.

In General Formulae (pI) to (pV), the alkyl group in each of $R_{12}$ to $R_{25}$ is a linear or branched alkyl group having 1 to 4 carbon atoms, which may be substituted or unsubstituted. Examples of the alkyl group include a methyl group, an ethyl group, an n-propyl group, an isopropyl group, an n-butyl group, an isobutyl group, a sec-butyl group, and a t-butyl group.

Examples of the substituent of the alkyl group include an alkoxy group having 1 to 4 carbon atoms, a halogen atom (a fluorine atom, a chlorine atom, a bromine atom, or an iodine atom), an acyl group, an acyloxy group, a cyano group, a hydroxyl group, a carboxyl group, an alkoxycarbonyl group, and a nitro group.

Examples of the alicyclic hydrocarbon group in each of $R_{11}$ to $R_{25}$ and the alicyclic hydrocarbon groups formed by Z and a carbon atom include those set forth above as alicyclic structures.

In one embodiment, a case where the repeating unit represented by General Formula (A2) is a repeating unit represented by the following formula is preferable.

In General Formula (A3),

AR represents an aryl group.

Rn represents an alkyl group, a cycloalkyl group, or an aryl group. Rn and AR may be bonded to each other to form a non-aromatic ring.

R represents a hydrogen atom, an alkyl group, a cycloalkyl group, a halogen atom, a cyano group, or an alkyloxycarbonyl group.

The repeating unit represented by General Formula (A3) will be described.

As described above, AR represents an aryl group. The aryl group represented by AR is preferably one having 6 to 20 carbon atoms, such as a phenyl group, a naphthyl group, an anthryl group, or a fluorene group, and more preferably an aryl group having 6 to 15 carbon atoms.

In a case where AR is a naphthyl group, an anthryl group, or a fluorene group, the position of bonding of AR to the carbon atom to which Rn is bonded is not particularly limited. For example, in a case where AR is a naphthyl group, the carbon atom may be bonded to either the α-position or the β-position of the naphthyl group. In a case where AR is an anthryl group, the carbon atom may be bonded to any of the 1-position, the 2-position, or the 9-position of the anthryl group.

The aryl group as AR may have one or more substituents. Specific examples of the substituent include a linear or branched alkyl group having 1 to 20 carbon atoms, such as a methyl group, an ethyl group, a propyl group, an isopropyl group, an n-butyl group, an isobutyl group, a t-butyl group, a pentyl group, a hexyl group, an octyl group, and a dodecyl group, an alkoxy group including such an alkyl group moiety, a cycloalkyl group such as a cyclopentyl group and a cyclohexyl group, a cycloalkoxy group including such a cycloalkyl group moiety, a hydroxyl group, a halogen atom, an aryl group, a cyano group, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as a pyrrolidone residue. The substituent is preferably a linear or branched alkyl group having 1 to 5 carbon atoms or an alkoxy group including such an alkyl group moiety, and more preferably a para-methyl group or a para-methoxy group.

In the case where the aryl group as AR has a plurality of substituents, at least two members of the plurality of substituents may be bonded to each other to form a ring. The ring is preferably a 5- to 8-membered ring, more preferably a 5- or 6-membered ring. The ring may be a heterocycle containing a heteroatom such as an oxygen atom, a nitrogen atom, and a sulfur atom, in the ring members.

Furthermore, this ring may have a substituent. Examples of the substituent are the same ones as those which will be described later with regard to a substituent which Rn may have.

Moreover, from the viewpoints of the roughness performance, the repeating unit represented by General Formula (A3) preferably contains two or more aromatic rings. Typically, the number of aromatic rings contained in the repeating unit is preferably 5 or less, or more preferably 3 or less.

In addition, from the viewpoint of roughness performance, in the repeating unit represented by General Formula (A3), it is more preferable that AR contains two or more aromatic rings, and it is still more preferable that AR is a naphthyl group or a biphenyl group. Typically, the number of aromatic rings contained in AR is preferably 5 or less, and more preferably 3 or less.

As described above, Rn represents an alkyl group, a cycloalkyl group, or an aryl group. The alkyl group of Rn may be a linear alkyl group or a branched alkyl group. The alkyl group is preferably an alky group having 1 to 20 carbon atoms, such as a methyl group, an ethyl group, a propyl group, an isopropyl group, an n-butyl group, an isobutyl group, a t-butyl group, a pentyl group, a hexyl group, a cyclohexyl group, an octyl group, and a dodecyl group. The alkyl group of Rn is preferably an alkyl group having 1 to 5 carbon atoms, and more preferably an alkyl group having 1 to 3 carbon atoms.

The cycloalkyl group of Rn is, for example, a cycloalkyl group having 3 to 15 carbon atoms, such as a cyclopentyl group and a cyclohexyl group.

The aryl group of Rn is preferably, for example, an aryl group having 6 to 14 carbon atoms, such as a phenyl group, a xylyl group, a toluyl group, a cumenyl group, a naphthyl group, and an anthryl group.

Each of the alkyl group, the cycloalkyl group, and the aryl group as Rn may further have a substituent. Examples of the substituent include an alkoxy group, a hydroxyl group, a halogen atom, a nitro group, an acyl group, an acyloxy group, an acylamino group, a sulfonylamino group, a dialkylamino group, an alkylthio group, an arylthio group, an aralkylthio group, a thiophenecarbonyloxy group, a thiophenemethylcarbonyloxy group, and a heterocyclic residue such as a pyrrolidone residue. Among these, an alkoxy group, a hydroxyl group, a halogen atom, a nitro group, an acyl group, an acyloxy group, an acylamino group, and a sulfonylamino group are particularly preferable.

As described above, R represents a hydrogen atom, an alkyl group, a cycloalkyl group, a halogen atom, a cyano group, or an alkyloxycarbonyl group.

Examples of the alkyl group and the cycloalkyl group of R include the same ones as those described above with regard to Rn. Each of the alkyl group and the cycloalkyl group may have a substituent. Examples of the substituent include the same ones as those described above with regard to Rn.

In a case where R is a substituted alkyl group or cycloalkyl group, particularly preferred examples of R include a trifluoromethyl group, an alkyloxycarbonylmethyl group, an alkylcarbonyloxymethyl group, a hydroxymethyl group, and an alkoxymethyl group.

Examples of the halogen atom of R include a fluorine atom, a chlorine atom, a bromine atom, and an iodine atom. Among these, a fluorine atom is particularly preferred.

Examples of the alkyl group moiety included in the alkyloxycarbonyl group of R include the configurations mentioned above as the alkyl group of R.

It is preferable that Rn and AR are bonded to each other to form a non-aromatic ring, and thus, in particular, the roughness performance can be further improved. The non-aromatic ring that may be formed by the mutual bonding of Rn and AR is preferably a 5- to 8-membered ring, and more preferably a 5- or 6-membered ring.

The non-aromatic ring may be an aliphatic ring or a heterocycle containing a heteroatom such as an oxygen atom, a nitrogen atom, and a sulfur atom, as a ring member. The non-aromatic ring may have a substituent. Examples of the substituent include the same ones as those described above with regard to the substituent that Rn may have.

Specific examples of the repeating unit represented by General Formula (A2) or the monomers corresponding to the repeating unit are shown below, but are not limited thereto.

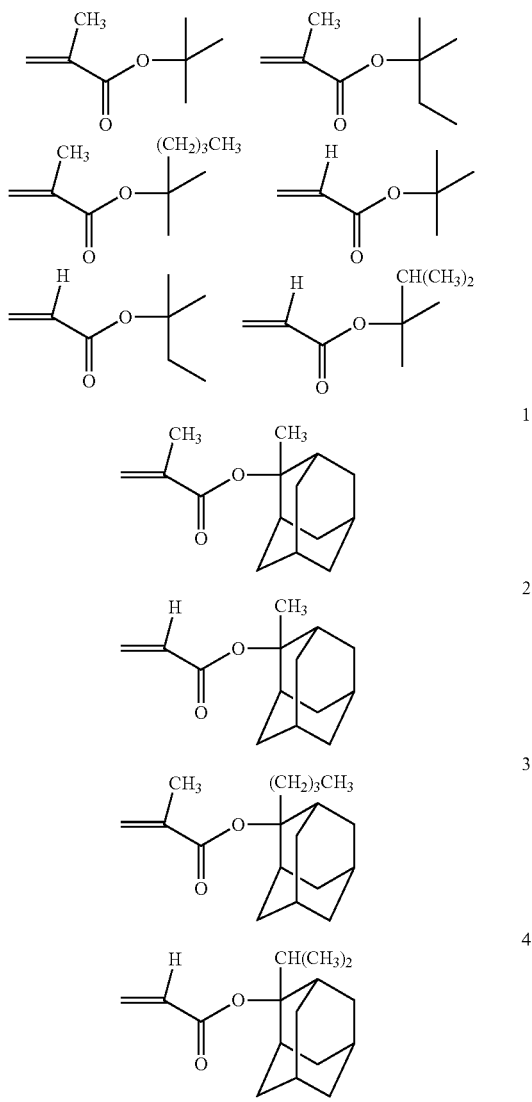

-continued
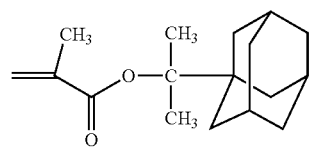
5
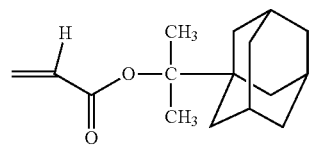
6
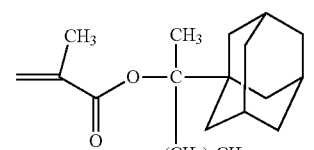
7
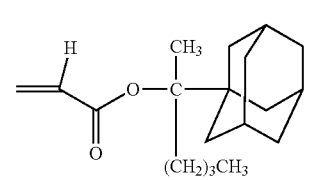
8
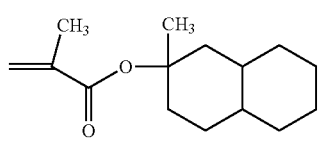
9
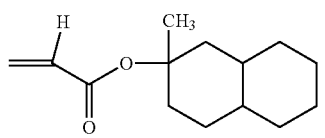
10
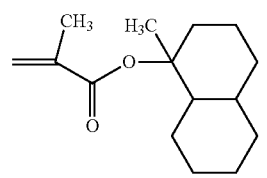
11
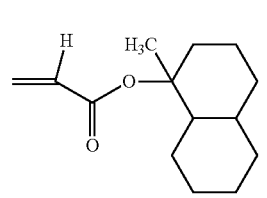
12
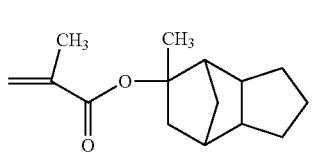
13
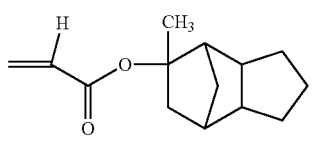
14
-continued
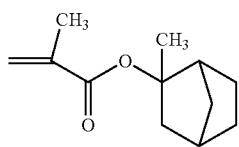
15
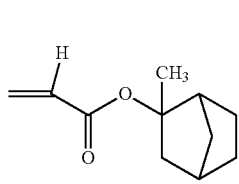
16
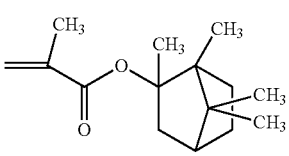
17
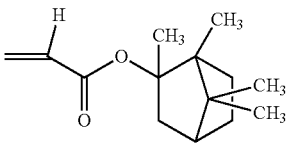
18
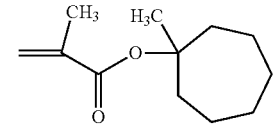
19
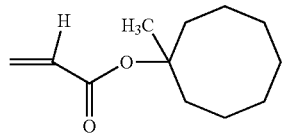
20
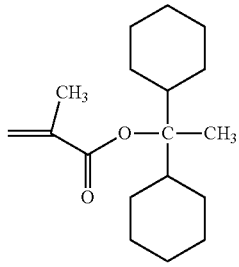
21
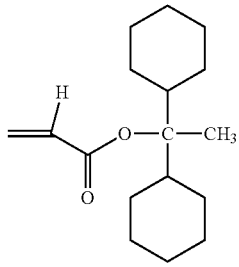
22

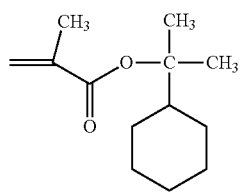
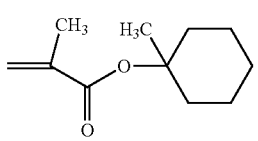
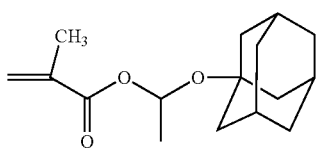
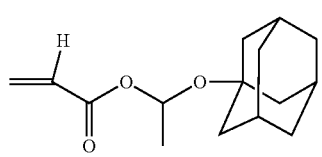
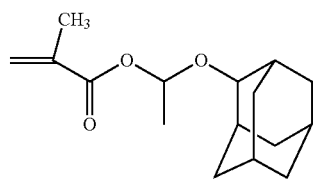
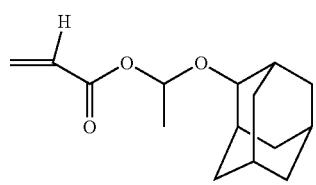
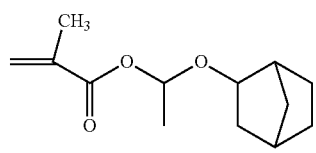
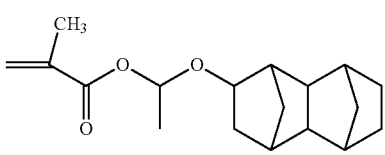
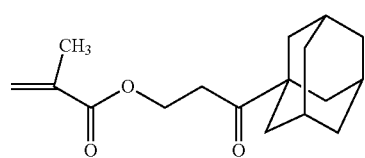
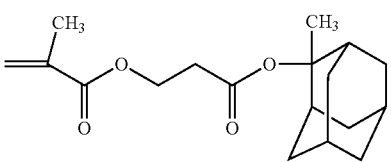
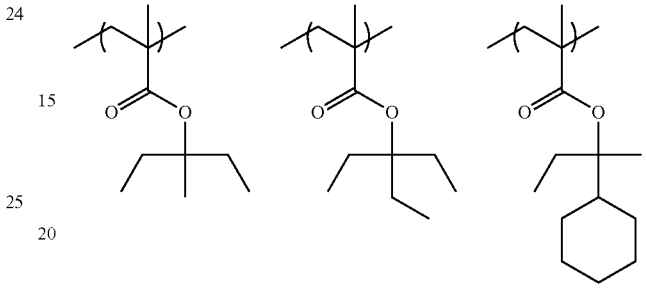
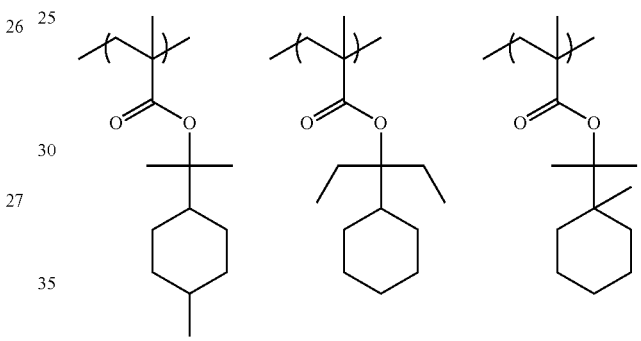
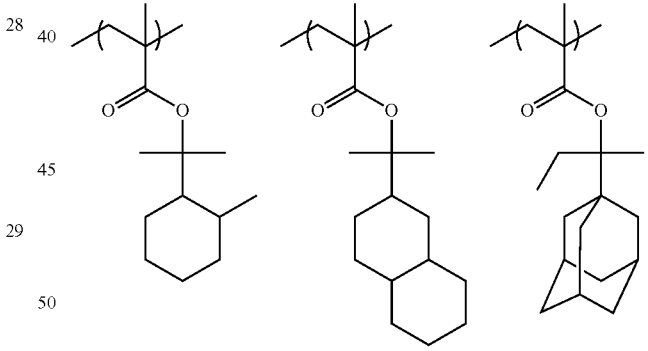
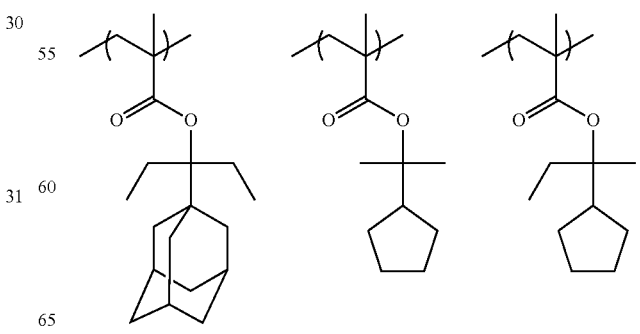

-continued
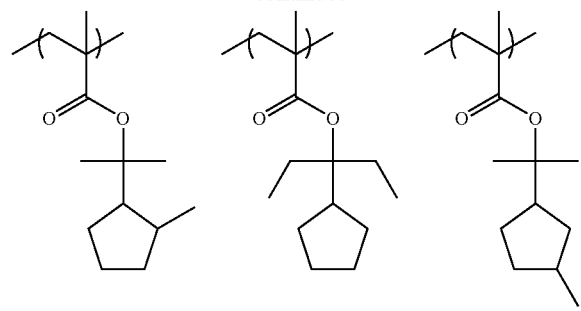
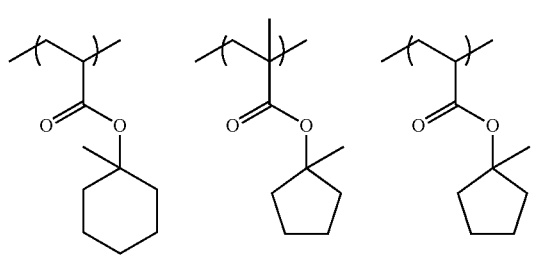
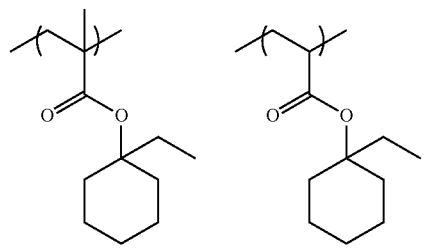
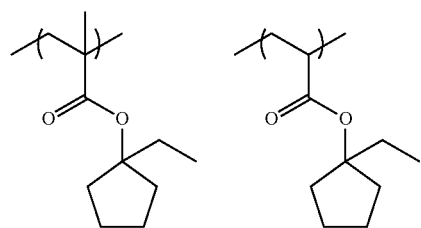
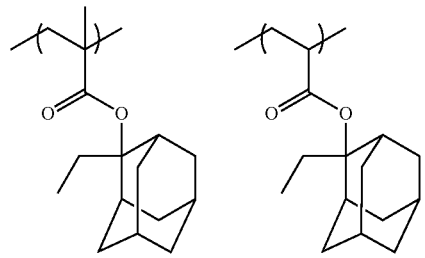
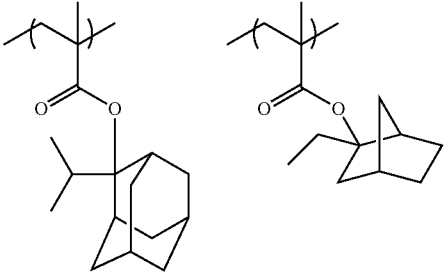
-continued
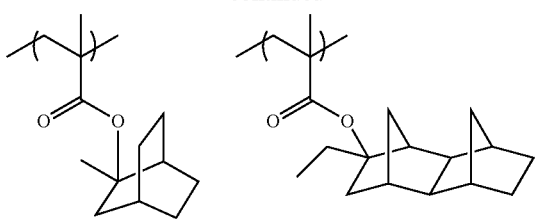
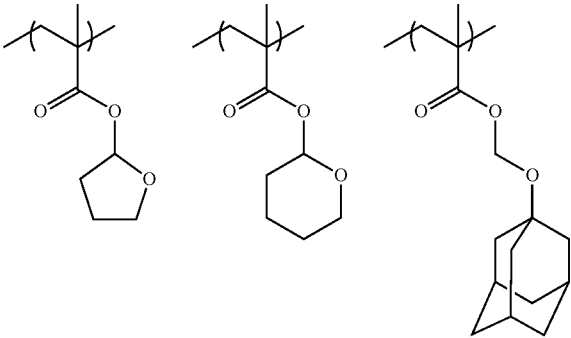
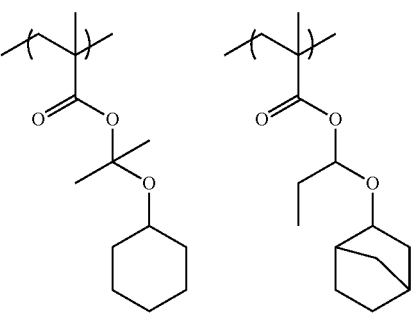
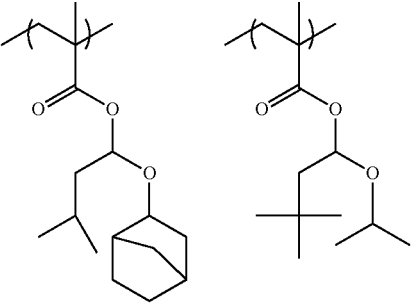
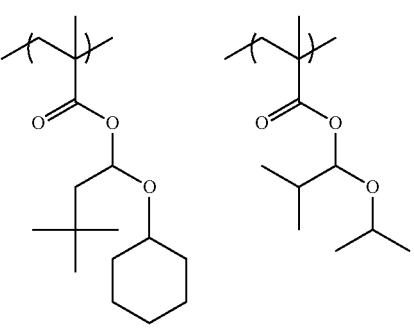

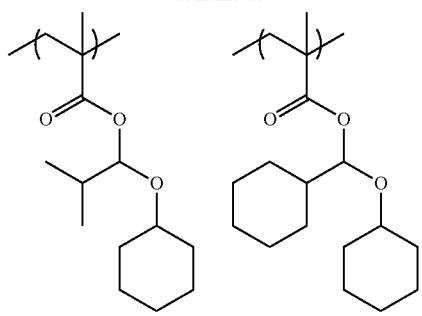
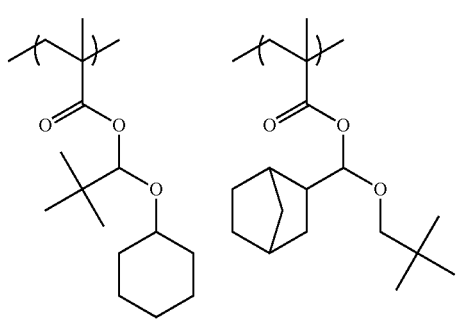
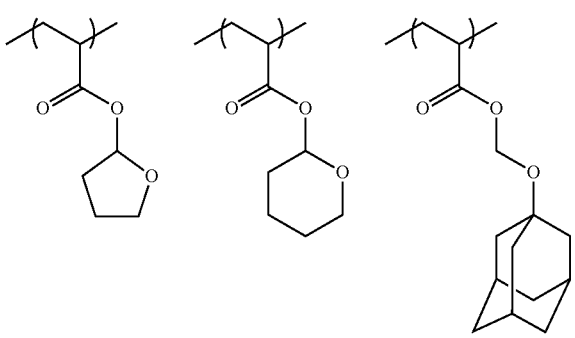
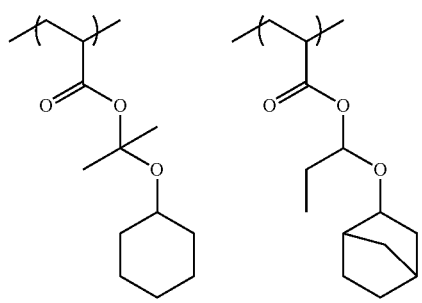
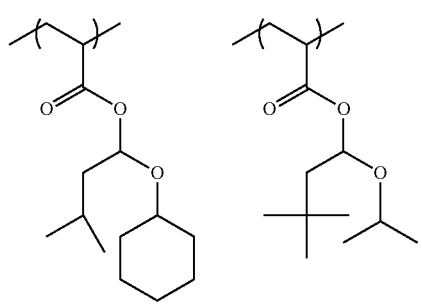
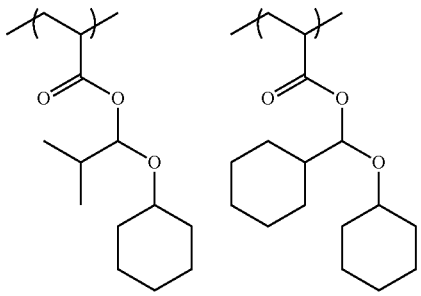
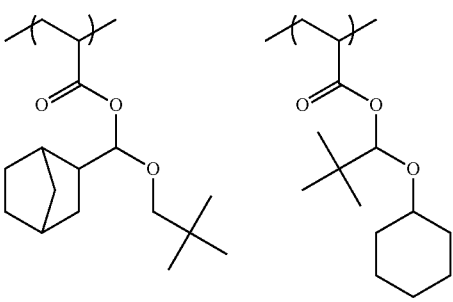
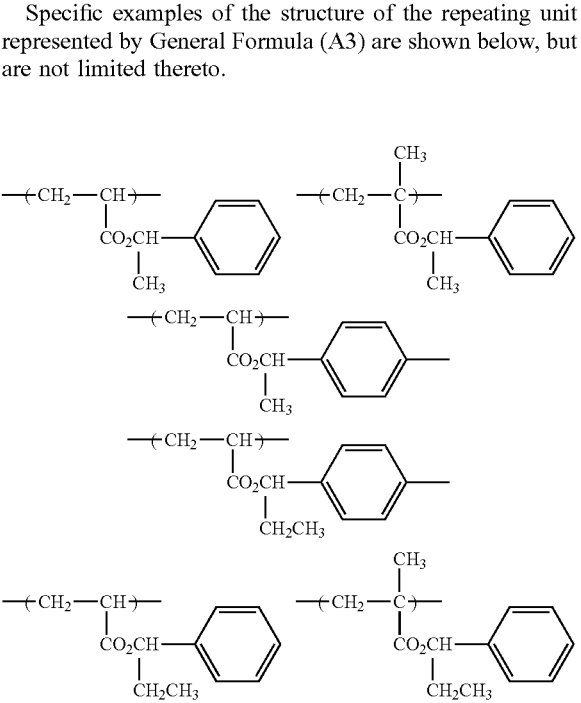
Specific examples of the structure of the repeating unit represented by General Formula (A3) are shown below, but are not limited thereto.
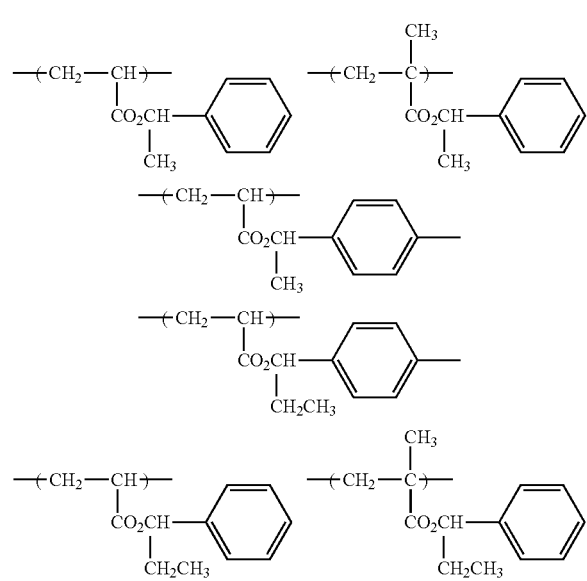

-continued
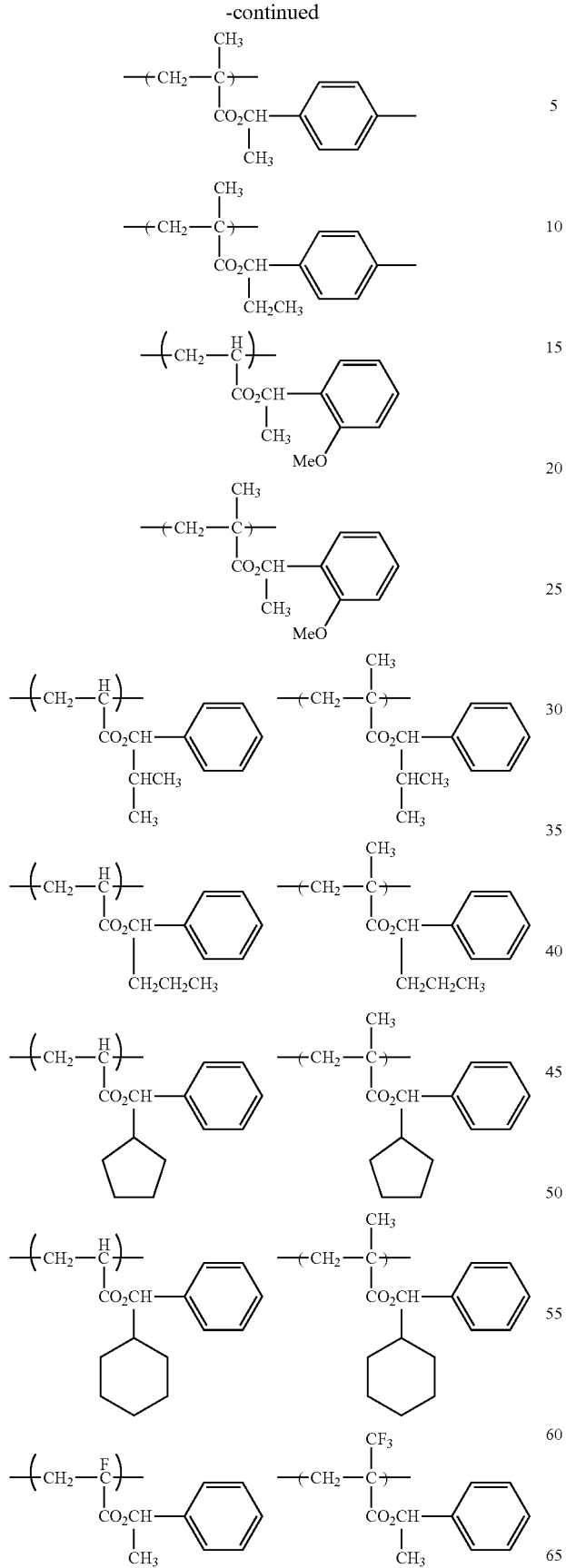
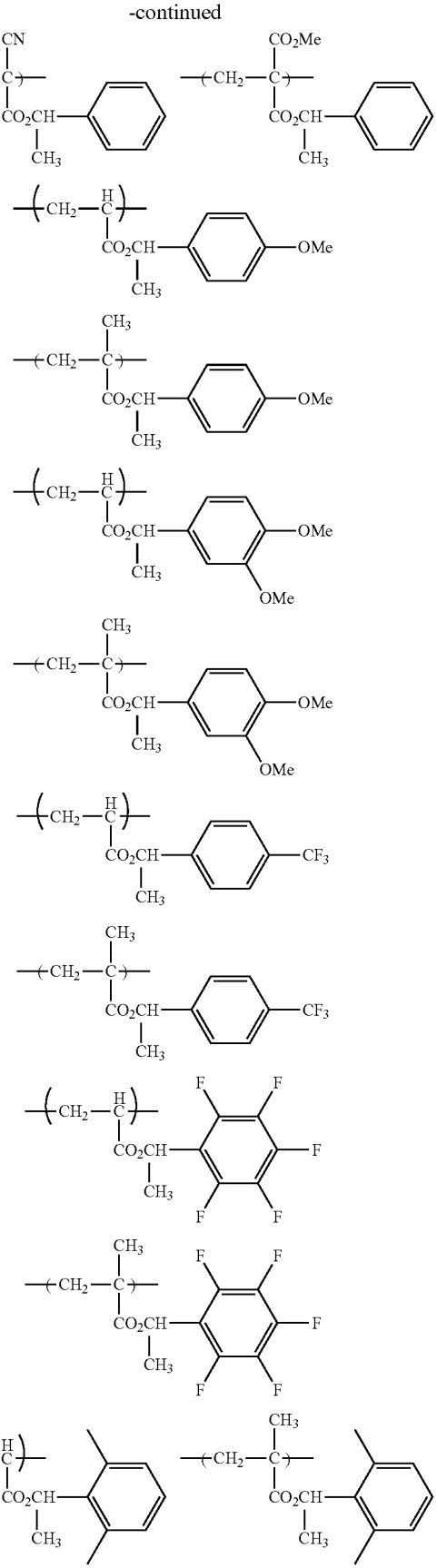

-continued
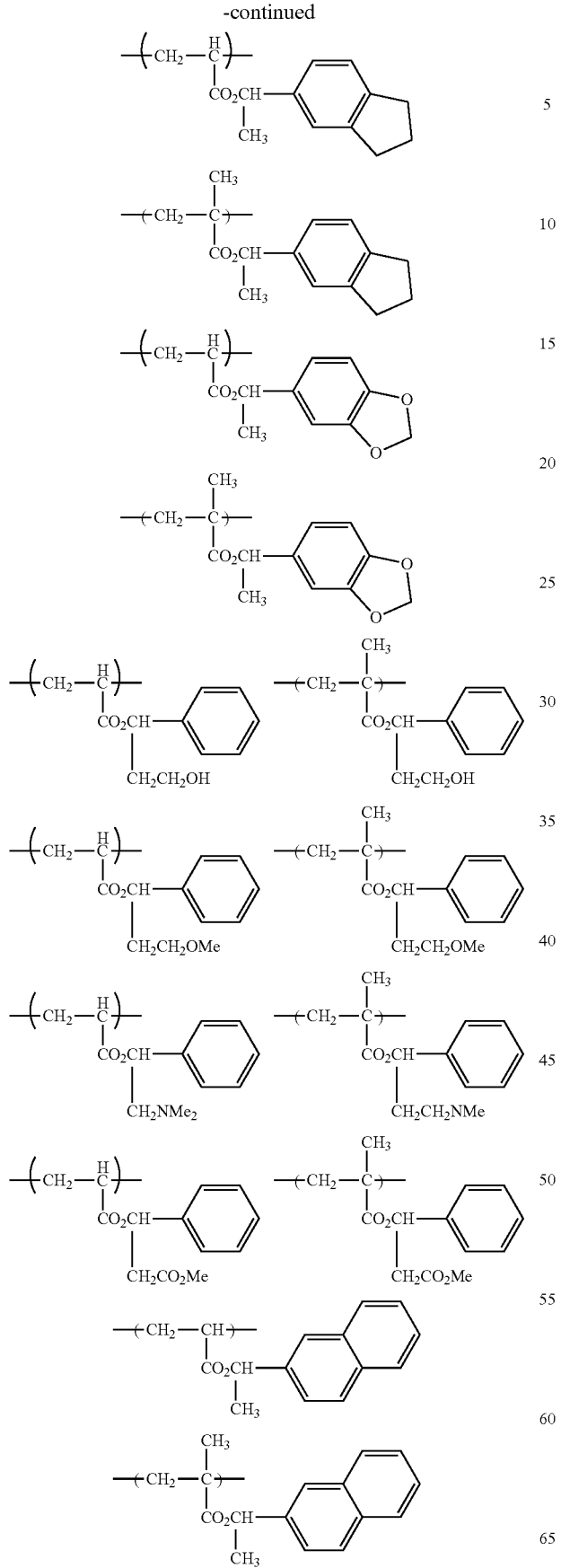
-continued
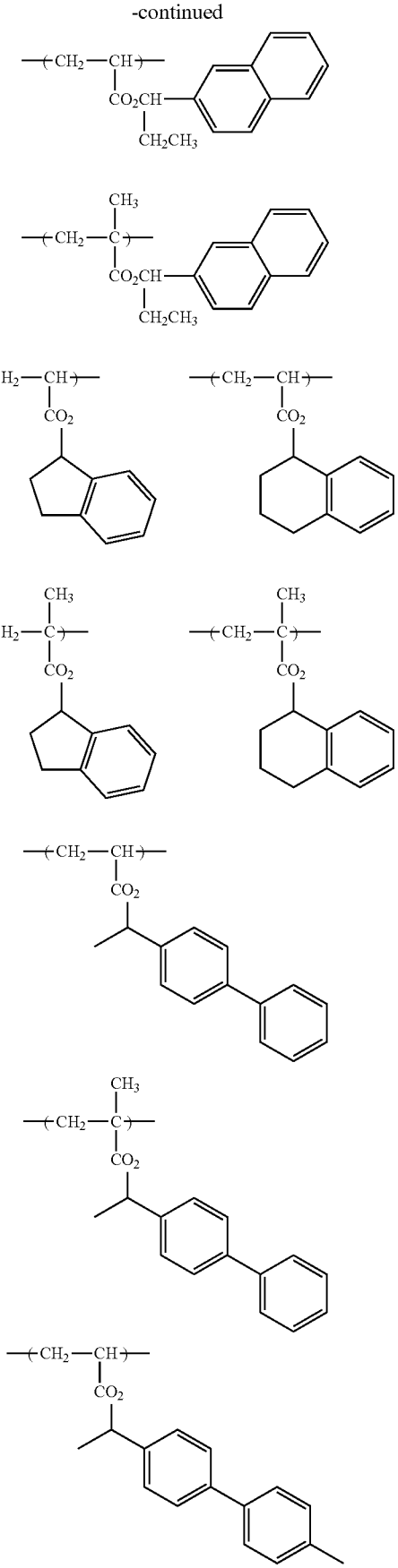

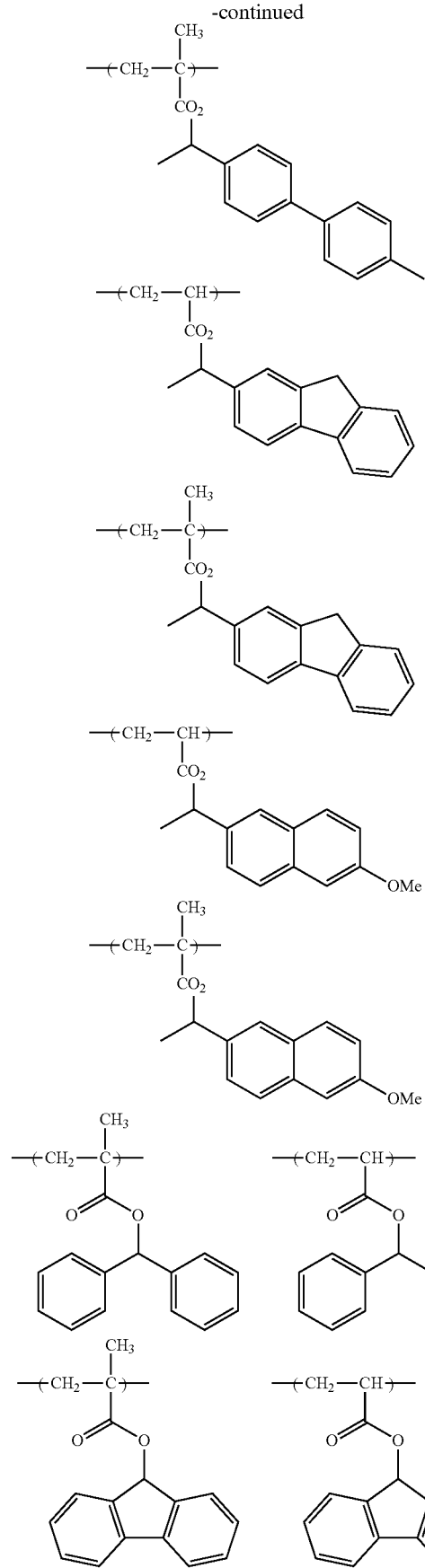
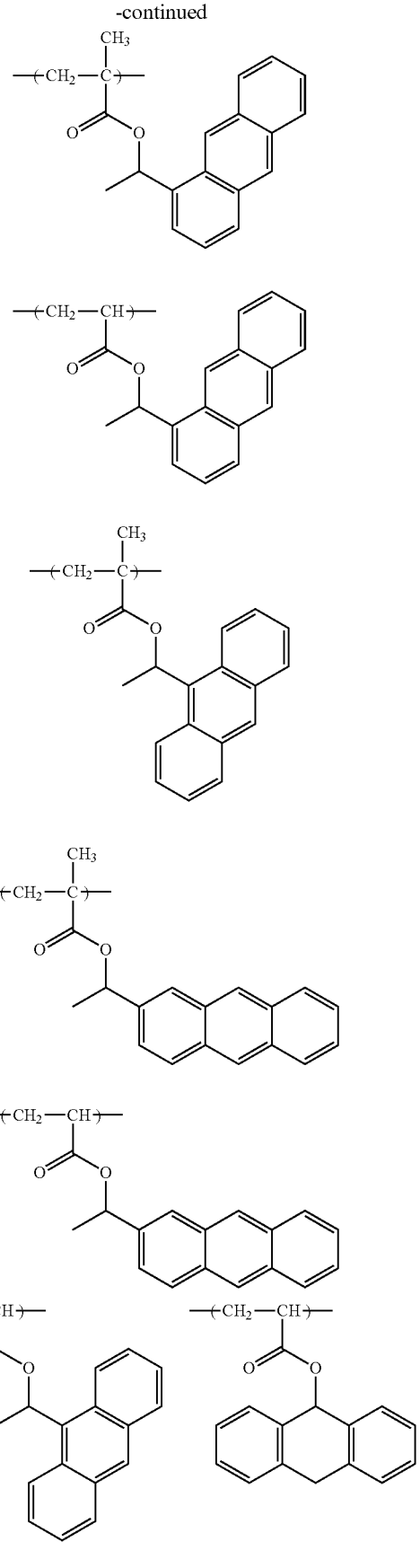

-continued

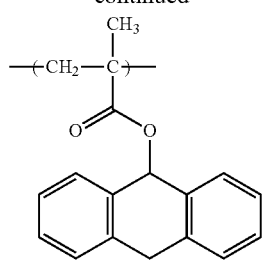

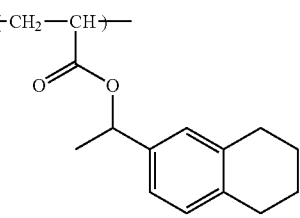

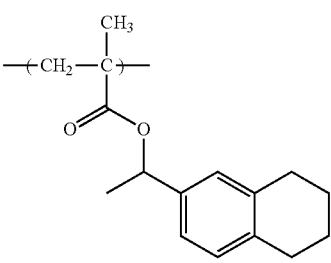

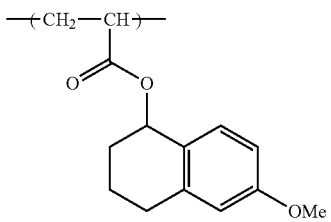

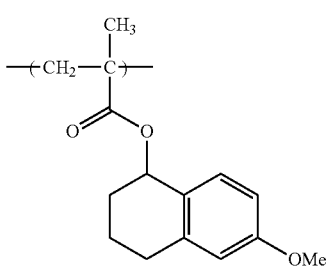

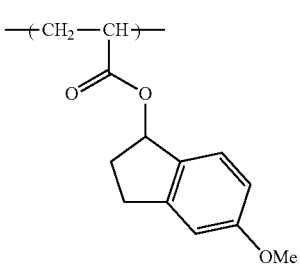

-continued

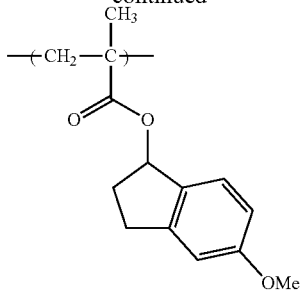

Among these, the repeating units described in paragraphs [0309] and [0310] of JP2013-83966A are more preferable.

In one embodiment, the repeating unit represented by General Formula (A2) is preferably a repeating unit of t-butyl methacrylate or ethylcyclopentyl methacrylate.

The monomer corresponding to the repeating unit represented by General Formula (A2) can be synthesized by performing an esterification between (meth)acrylic chloride and an alcohol compound in a solvent such as tetrahydrofuran (THF), acetone, and methylene chloride in the presence of a basic catalyst such as triethylamine, pyridine, and diazabicycloundecene (DBU). Alternatively, commercially available monomers may be used.

The resin (Ab) may further contain a repeating unit including a group that decomposes by the action of an acid to generate an alcoholic hydroxyl group as an acid-decomposable group. Examples of the repeating unit including a group that decomposes by the action of an acid to generate an alcoholic hydroxyl group include the repeating units described in paragraphs [0030] to [0071] of JP2011-203644A.

The resin (Ab) may further contain a repeating unit represented by the following General Formula (A5).

(A5)

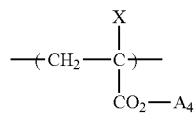

In Formula (A5),

X represents a hydrogen atom, an alkyl group, a hydroxyl group, an alkoxy group, a halogen atom, a cyano group, a nitro group, an acyl group, an acyloxy group, a cycloalkyl group, an aryl group, a carboxyl group, an alkyloxycarbonyl group, an alkylcarbonyloxy group, and an aralkyl group, which is the same as X in General Formula (A2b).

$A_4$ represents a hydrocarbon group that does not leave by the action of an acid.

Examples of the hydrocarbon group that does not leave by the action of an acid, represented by $A_4$ in General Formula (A5), include hydrocarbon groups other than the acid-decomposable groups as described above, for example, an alkyl group (preferably having 1 to 15 carbon atoms) that does not leave by the action of an acid, a cycloalkyl group (preferably having 3 to 15 carbon atoms) that does not leave by the action of an acid, and an aryl group (preferably having 6 to 15 carbon atoms) that does not leave by the action of an acid.

The hydrocarbon group that does not leave by the action of an acid, of $A_4$, may further be substituted with a hydroxyl group, an alkyl group, a cycloalkyl group, an aryl group, or the like.

It is also preferable that the resin (Ab) further has a repeating unit represented by General Formula (A6).

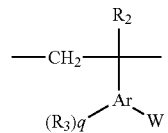
(A6)

In General Formula (A6), $R_2$ represents a hydrogen atom, a methyl group, a cyano group, a halogen atom, or a perfluoro group having 1 to 4 carbon atoms.

$R_3$ represents a hydrogen atom, an alkyl group, a cycloalkyl group, a halogen atom, an aryl group, an alkoxy group, or an acyl group.

q represents an integer of 0 to 4.

Ar represents a (q+2)-valent aromatic ring.

W represents a group that does not decompose by the action of an acid or a hydrogen atom.

The aromatic ring represented by Ar is preferably a benzene ring, a naphthalene ring, or an anthracene ring, and more preferably a benzene ring.

W represent a group that does not decompose by the action of an acid (also referred to as an acid-stable group), and examples thereof include groups other than the above acid-decomposable groups. Specific examples thereof include a halogen atom, an alkyl group, a cycloalkyl group, an alkenyl group, an aryl group, an acyl group, an alkylamido group, an arylamidomethyl group, and an arylamido group. The acid-stable group is preferably an acyl group or an alkylamido group, and more preferably an acyl group, an alkylcarbonyloxy group, an alkyloxy group, a cycloalkyloxy group, or an aryloxy group.

With regard to the acid-stable group of W, the alkyl group is preferably one having 1 to 4 carbon atoms, such as a methyl group, an ethyl group, a propyl group, an n-butyl group, a sec-butyl group, and a t-butyl group. The cycloalkyl group is preferably one having 3 to 10 carbon atoms, such as a cyclopropyl group, a cyclobutyl group, a cyclohexyl group, and an adamantyl group. The alkenyl group is preferably one having 2 to 4 carbon atoms, such as a vinyl group, a propenyl group, an allyl group, or a butenyl group. The aryl group is preferably one having 6 to 14 carbon atoms, such as a phenyl group, a xylyl group, a toluyl group, a cumenyl group, a naphthyl group, or an anthracenyl group. The site of W on the benzene ring is not limited. Preferably, W is positioned at the meta- or para-position of the styrene skeleton. Particularly preferably, W is positioned at the para-position.

Specific examples of the repeating unit represented by General Formula (A6) are shown below, but are not limited thereto.

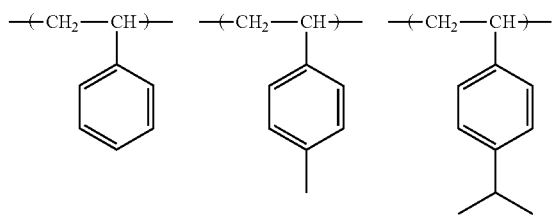

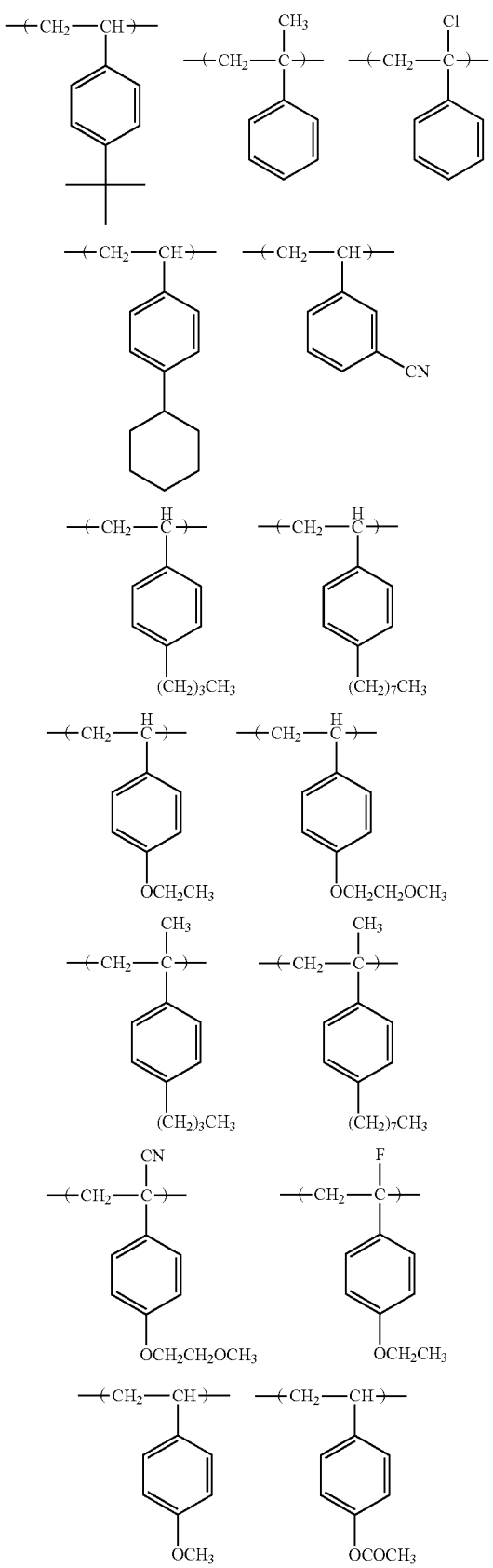

-continued

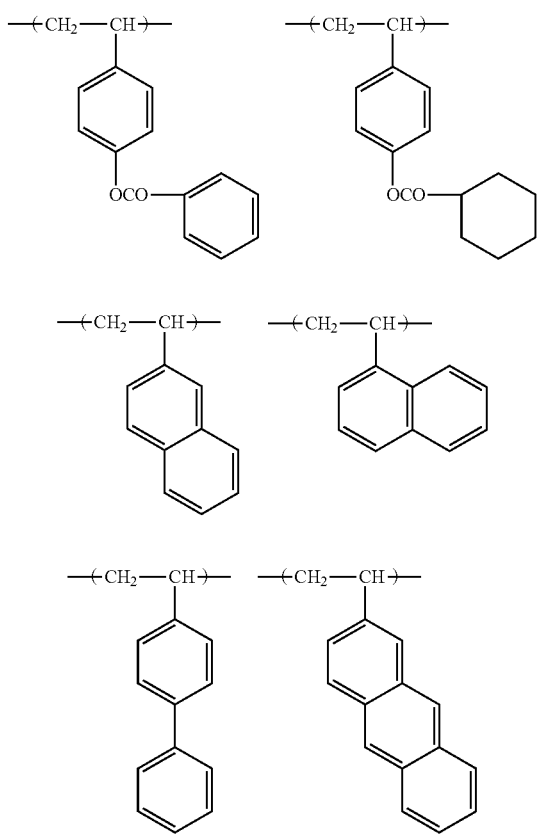

In addition, it is also preferable that the resin (Ab) further has at least one selected from repeating units represented by the following General Formulae (c1) to (c5).

-continued

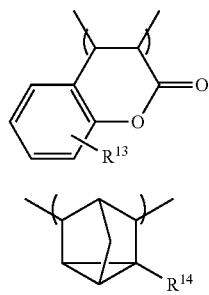

In the formulae, $R^{10}$ to $R^{14}$ each independently represent a hydrogen atom, an alkyl group, an alkyl group in which a part or all of hydrogen atoms bonded to a carbon atom are substituted with halogen atoms, an alkoxy group, an alkanoyl group, an alkoxycarbonyl group, an aryl group, a halogen atom, or a 1,1,1,3,3,3-hexafluoro-2-propanol group. $Z^2$ is a methylene group, an oxygen atom, or a sulfur atom.

The alkyl group and the alkyl group in which a part or all of hydrogen atoms bonded to a carbon atom are substituted with halogen atoms as each of $R^{10}$ to $R^{14}$ preferably have 1 to 30 carbon atoms.

The alkoxy group as each of $R^{10}$ to $R^{14}$ preferably has 1 to 8 carbon atoms.

The alkanoyl group as each of $R^{10}$ to $R^{14}$ preferably has 1 to 8 carbon atoms.

The alkoxycarbonyl group as each of $R^{10}$ to $R^{14}$ preferably has 2 to 8 carbon atoms.

The aryl group as each of $R^{10}$ to $R^{14}$ preferably has 6 to 10 carbon atoms.

The content of the repeating units represented by General Formula (c1) to (c5) in the resin (Ab) is preferably 5% to 95% by mole, more preferably 5% to 60% by mole, and particularly preferably 5% to 30% by mole, with respect to all the repeating units.

It is also preferable that the resin (Ab) further has a repeating unit including a (meth)acrylic acid derivative that does not decompose by the action of an acid. Specific examples thereof are shown below, but are not limited thereto.

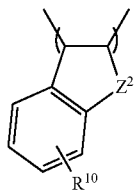

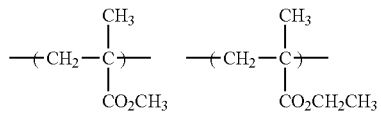

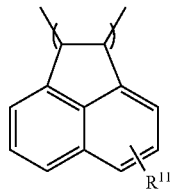

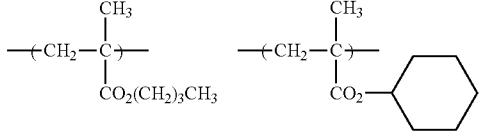

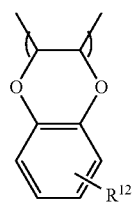

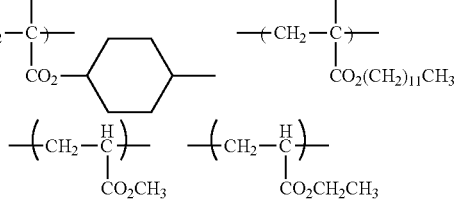

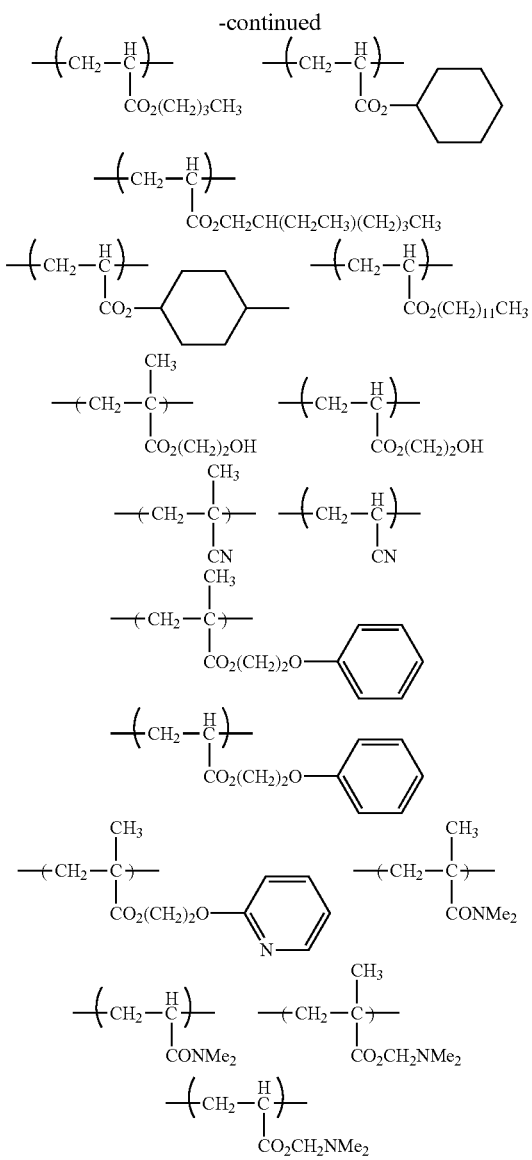

The content of the repeating units having an acid-decomposable group in the resin (Ab) is preferably 5% to 95% by mole, more preferably 10% to 60% by mole, and particularly preferably 15% to 50% by mole, with respect to all the repeating units.

The content of the repeating unit represented by General Formula (A1) in the resin (Ab) is preferably 0% to 90% by mole, more preferably 10% to 70% by mole, and particularly preferably 20% to 50% by mole, with respect to all the repeating units.

The content of the repeating unit represented by General Formula (A2) in the resin (Ab) is preferably 0% to 90% by mole, more preferably 5% to 75% by mole, and particularly preferably 10% to 60% by mole, with respect to all the repeating units.

The content of the repeating unit represented by General Formula (A3) in the resin (Ab) is preferably 0% to 90% by mole, more preferably 5% to 75% by mole, and particularly preferably 10% to 60% by mole, with respect to all the repeating units.

The content of the repeating unit represented by General Formula (A5) in the resin (Ab) is preferably 0% to 50% by mole, more preferably 0% to 40% by mole, and particularly preferably 0% to 30% by mole, with respect to all the repeating units.

The resin (Ab) may further have the repeating unit represented by General Formula (A6), which is preferred from the viewpoint of an enhancement of film quality, suppression of any film thinning in unexposed areas, or the like. The content of the repeating unit represented by General Formula (A6) is preferably 0% to 50% by mole, more preferably 0% to 40% by mole, and particularly preferably 0% to 30% by mole, with respect to all the respective repeating units.

Moreover, in order to maintain the satisfactory developability with respect to an alkaline developer, the resin (Ab) may be prepared by copolymerization with another appropriate polymerizable monomer for the introduction of an alkali-soluble group, for example, a phenolic hydroxyl group or a carboxyl group, or by copolymerization with another hydrophobic polymerizable monomer such as alkyl acrylate and alkyl methacrylate, in order to enhance film quality.

The monomer corresponding to the repeating unit represented by General Formula (A2) can be synthesized by performing an esterification between (meth)acrylic chloride and an alcohol compound in a solvent such as THF, acetone, and methylene chloride, in the presence of a basic catalyst such as triethylamine, pyridine, and DBU. Alternatively, commercially available monomers may be used.

The monomers corresponding to the repeating unit represented by General Formula (A1) can be synthesized by acetalizing a hydroxy-substituted styrene monomer and a vinyl ether compound in a solvent such as THF or methylene chloride, in the presence of an acidic catalyst such as p-toluenesulfonic acid and a pyridine salt of p-toluenesulfonic acid, or by effecting t-Boc protection with t-butyl dicarbonate in the presence of a basic catalyst such as triethylamine, pyridine, and DBU. Alternatively, commercially available monomers may be used.

In one embodiment, it is preferable that the resin (Ab) contains a repeating unit represented by the following General Formula (A).

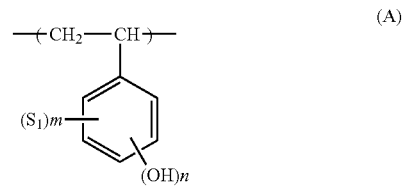

(A)

In the formula, n represents an integer of 1 to 5, and m represents an integer of 0 to 4 satisfying the relationship $1 \leq m+n \leq 5$. n is preferably 1 or 2, and more preferably 1. m is preferably 0 to 2, more preferably 0 or 1, and particularly preferably 0.

$S_1$ represents a substituent. In a case where m is 2 or more, a plurality of $S_1$'s may be the same as or different from each other.

Examples of the substituent represented by $S_1$ include an alkyl group, an alkoxy group, an acyl group, an acyloxy group, an aryl group, an aryloxy group, an aralkyl group, an aralkyloxy group, a hydroxyl group, a halogen atom, a cyano group, a nitro group, a sulfonylamino group, an alkylthio group, an arylthio group, and an aralkylthio group.

As the alkyl group or the cycloalkyl group, linear or branched alkyl groups and cycloalkyl groups, each having 1 to 20 carbon atoms, such as a methyl group, an ethyl group, a propyl group, an isopropyl group, an n-butyl group, an isobutyl group, a t-butyl group, a pentyl group, a cyclopentyl group, a hexyl group, a cyclohexyl group, an octyl group, and a dodecyl group, are preferable. These groups may further have a substituent.

Preferred examples of the substituent that can further be introduced include an alkyl group, an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group, and a heterocyclic residue such as a pyrrolidone residue, with a substituent having 12 or less carbon atoms being preferable.

Examples of the alkyl group having a substituent include a cyclohexylethyl group, an alkylcarbonyloxymethyl group, an alkylcarbonyloxyethyl group, a cycloalkylcarbonyloxymethyl group, a cycloalkylcarbonyloxyethyl group, an arylcarbonyloxyethyl group, an aralkylcarbonyloxyethyl group, an alkyloxymethyl group, a cycloalkyloxymethyl group, an aryloxymethyl group, an aralkyloxymethyl group, an alkyloxyethyl group, a cycloalkyloxyethyl group, an aryloxyethyl group, an aralkyloxyethyl group, an alkylthiomethyl group, a cycloalkylthiomethyl group, an arylthiomethyl group, an aralkylthiomethyl group, an alkylthioethyl group, a cycloalkylthioethyl group, an arylthioethyl group, and an aralkylthioethyl group.

The alkyl group and the cycloalkyl group in these groups are not particularly limited, and may further have a substituent such as the above-mentioned alkyl group, cycloalkyl group, and alkoxy group.

Examples of the alkylcarbonyloxyethyl group and the cycloalkylcarbonyloxyethyl group include a cyclohexylcarbonyloxyethyl group, a t-butylcyclohexylcarbonyloxyethyl group, and an n-butylcyclohexylcarbonyloxyethyl group.

The aryl group is also not particularly limited, and in general, examples thereof include one having 6 to 14 carbon atoms, such as a phenyl group, a xylyl group, a toluyl group, a cumenyl group, a naphthyl group, and an anthracenyl group. The aryl group may further have a substituent such as the above-mentioned alkyl group, cycloalkyl group, and alkoxy group.

Examples of the aryloxyethyl group include a phenyloxyethyl group and a cyclohexylphenyloxyethyl group. These groups may further have a substituent.

The aralkyl group is also not particularly limited, and examples thereof include a benzyl group.

Examples of the aralkylcarbonyloxyethyl group include a benzylcarbonyloxyethyl group. These groups may further have a substituent.

Examples of the repeating unit represented by General Formula (A) are shown below.

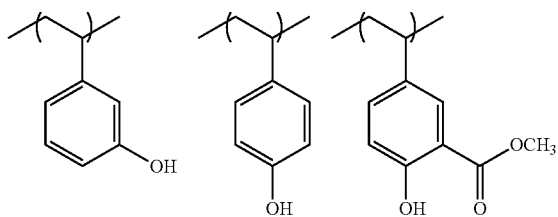

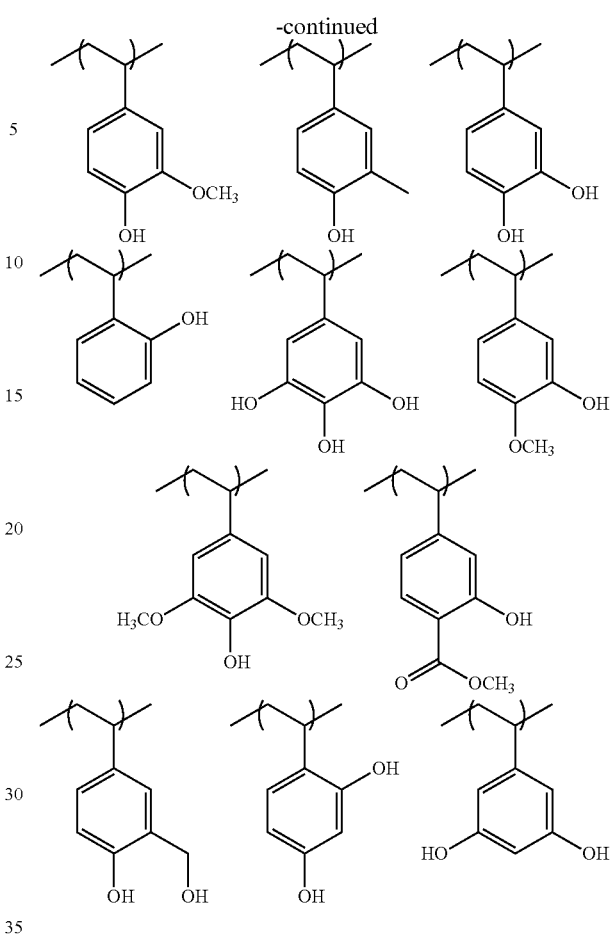

The content of the repeating unit represented by General Formula (A) in the resin (Ab) is preferably 0% to 90% by mole, more preferably 5% to 80% by mole, still more preferably 10% to 70% by mole, and particularly preferably 20% to 60% by mole, with respect to all the repeating units of the resin (Ab).

It is also preferable that the resin (Ab) has the repeating units described in paragraphs [0345] and [0346] of JP2013-83966A.

In one embodiment, the resin (Ab) may include a repeating unit (B) (hereinafter referred to as an "acid-generating repeating unit (B)" or a "repeating unit (B)") including a structural moiety that decomposes upon irradiation with active light or radiation to generate an acid.

This structural moiety may be, for example, a structural moiety that decomposes upon irradiation with active light or radiation to generate an acid anion in the repeating unit (B), or a structural moiety that releases an acid anion to generate a cation structure in the repeating unit (B).

In this case, it is considered that the acid-generating repeating unit (B) corresponds to a compound that generates an acid upon irradiation with active light or radiation which will be described later.

Suitable examples of the acid-generating repeating unit (B) include the repeating units described in paragraphs [0347] to [0485] of JP2013-083966A.

In a case where the resin (Ab) contains the repeating unit (B), the content of the repeating unit (B) in the resin (Ab) is preferably 0.1% to 80% by mole, more preferably 0.5% to 60% by mole, and still more preferably 1% to 40% by mole, with respect to all the repeating units in the resin (Ab).

Moreover, when the active-light-sensitive or radiation-sensitive film obtained from the composition of the present invention is exposed to light by means of an ArF excimer laser, it is preferable to use a resin having no aromatic ring as the resin (Ab) from the viewpoint of the transparency to ArF excimer laser.

It is preferable that the resin (Ab) further has a repeating unit having at least one group selected from a lactone group, a hydroxyl group, a cyano group, or an alkali-soluble group.

The repeating unit having a lactone group that can be contained in the resin (Ab) will be described.

As the lactone group, any group may be used as long as it has a lactone structure, but the structure is preferably a 5- to 7-membered ring lactone structure, and more preferably a 5- to 7-membered ring lactone structure to which another ring structure is fused in the form capable of forming a bicyclo structure or a spiro structure. The resin (Ab) still more preferably has a repeating unit having a lactone structure represented by any one of the following General Formulae (LC1-1) to (LC1-16). Further, the lactone structure may be bonded directly to the main chain.

Preferred examples of the lactone structure include (LC1-1), (LC1-4), (LC1-5), (LC1-6), (LC1-13), and (LC1-14). By using such a specific lactone structure, LER becomes better.

LC1-1

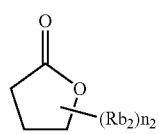

LC1-2

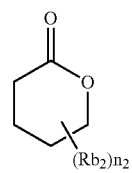

LC1-3

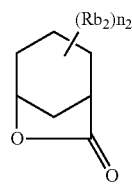

LC1-4

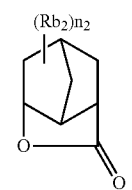

LC1-5

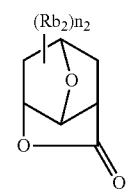

-continued

LC1-6

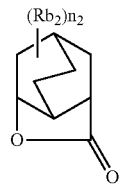

LC1-7

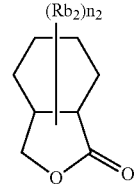

LC1-8

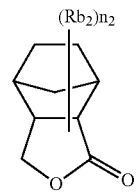

LC1-9

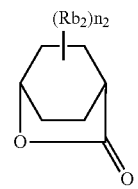

LC1-10

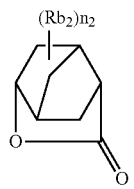

LC1-11

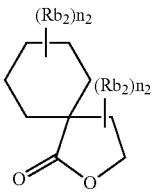

LC1-12

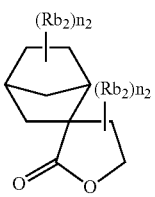

LC1-13

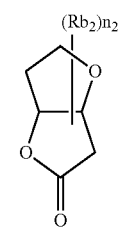

LC1-14

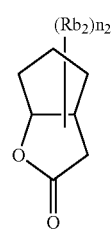

LC1-15

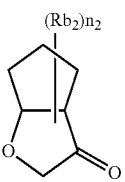

LC1-16

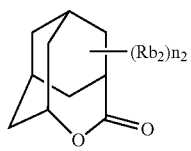

The lactone structural moiety may or may not have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. The substituent is more preferably an alkyl group having 1 to 4 carbon atoms, a cyano group, and an acid-decomposable group. n2 is an integer of 0 to 4. When n2 is 2 or more, the substituents ($Rb_2$) present in plural numbers may be the same as or different from each other. Further, the substituents ($Rb_2$) present in plural numbers may be bonded to each other to form a ring.

Examples of the repeating unit having a lactone structure represented by any one of General Formulae (LC1-1) to (LC1-16) include a repeating unit represented by the following General Formula (AII).

(AII)

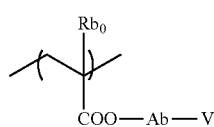

In General Formula (AII), $Rb_0$ represents a hydrogen atom, a halogen atom, or an alkyl group having 1 to 4 carbon atoms. Preferred examples of the substituent which may be contained in the alkyl group of $Rb_0$ include a hydroxyl group and a halogen atom. Examples of the halogen atoms of $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom or a methyl group.

Ab represents a single bond, an alkylene group, a divalent linking group having a monocyclic or polycyclic alicyclic hydrocarbon structure, an ether bond, an ester bond, a carbonyl group, or a divalent linking group obtained by combining these groups. Ab is preferably a single bond or a divalent linking group represented by -$Ab_1$-$CO_2$—.

$Ab_1$ is a linear or branched alkylene group, or a monocyclic or polycyclic cycloalkylene group, and preferably a methylene group, an ethylene group, a cyclohexylene group, an adamantylene group, or a norbornylene group.

V represents a group having the structure represented by any one of General Formulae (LC1-1) to (LC1-16).

The repeating unit having a lactone group usually has an optical isomer, and any optical isomer may be used. Further, one kind of optical isomer may be used singly or a plurality of optical isomers may be mixed and used. In the case of mainly using one kind of optical isomer, the optical purity (ee) thereof is preferably 90 or more, and more preferably 95 or more.

The content of the repeating units having a lactone group is preferably 15% to 60% by mole, more preferably 20% to 50% by mole, and still more preferably 30% to 50% by mole, with respect to all the repeating units in the resin (Ab).

Specific examples of the repeating unit having a lactone group are shown below, but the present invention is not limited thereto.

(in the formulae, Rx represents H, $CH_3$, $CH_2OH$, or $CF_3$)

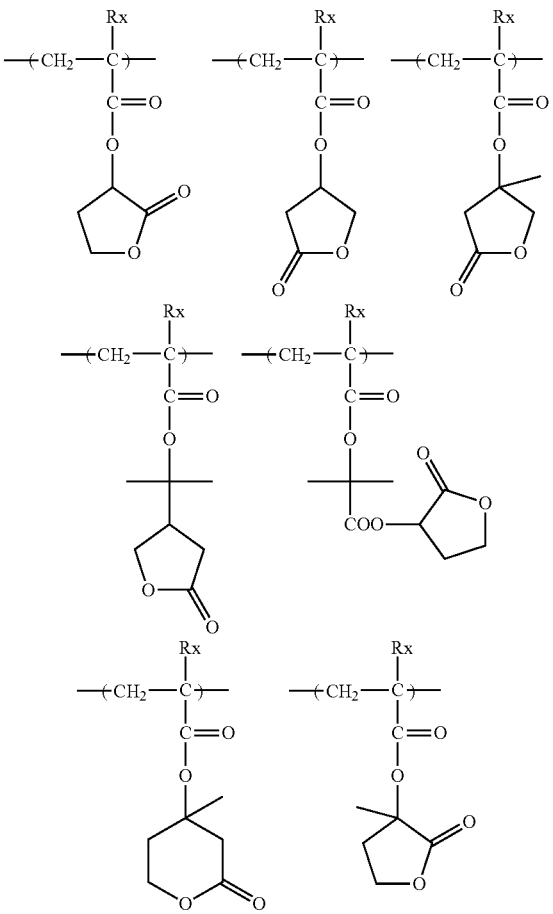

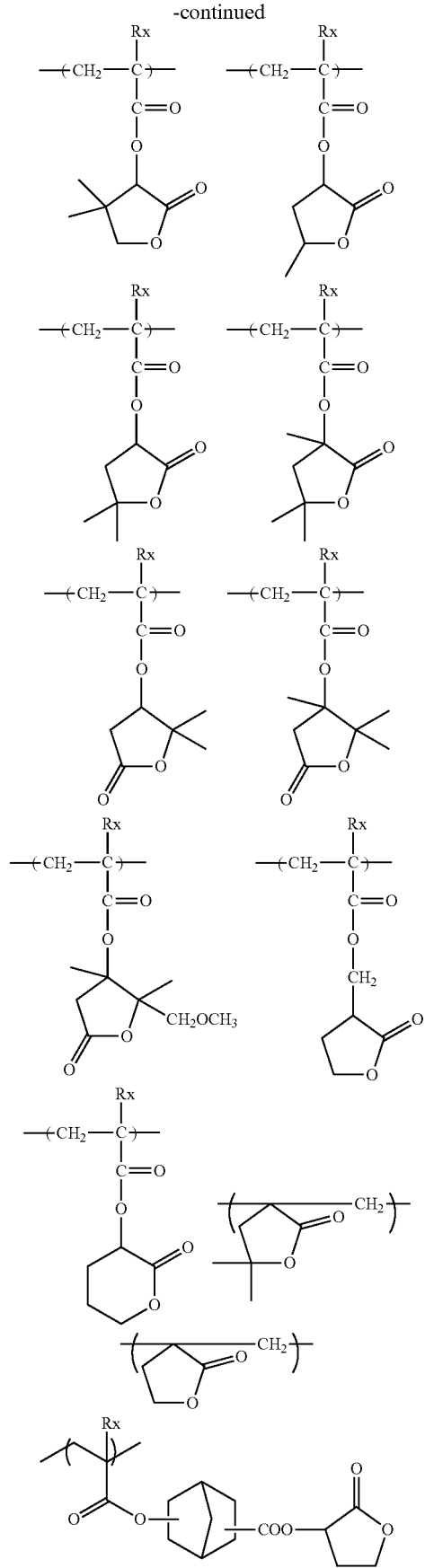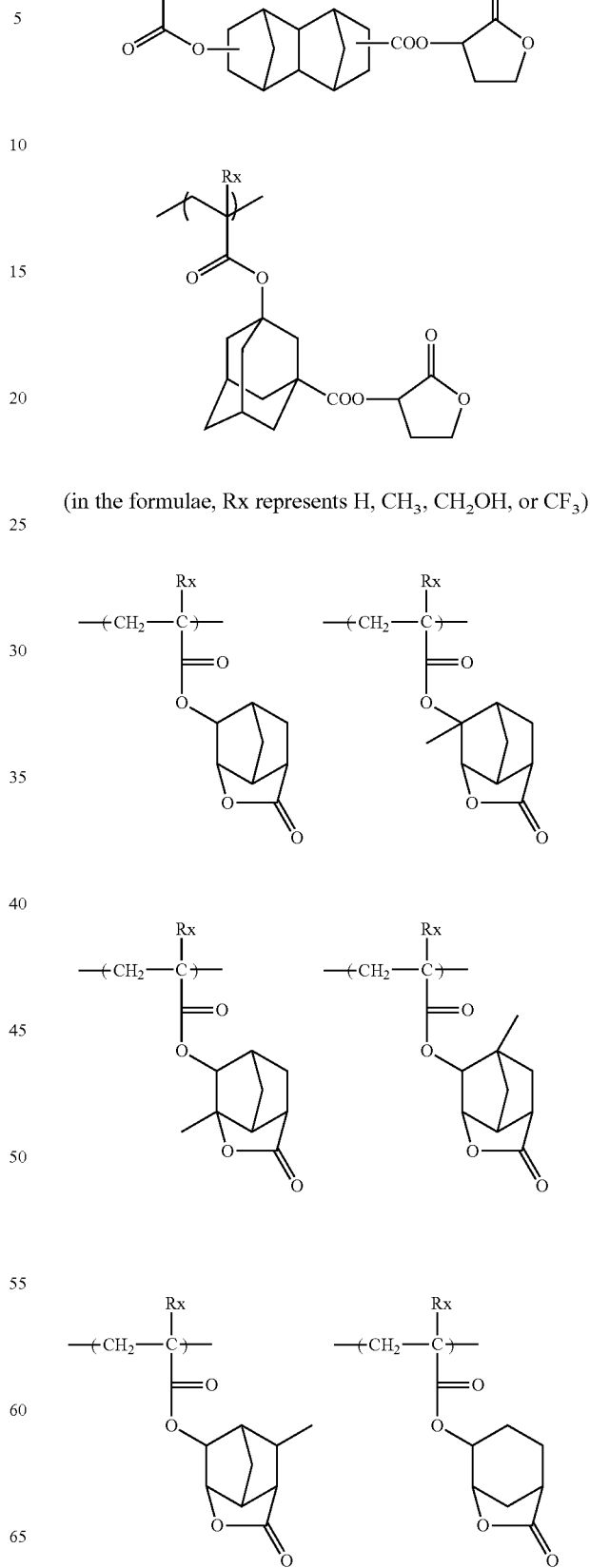
(in the formulae, Rx represents H, CH$_3$, CH$_2$OH, or CF$_3$)

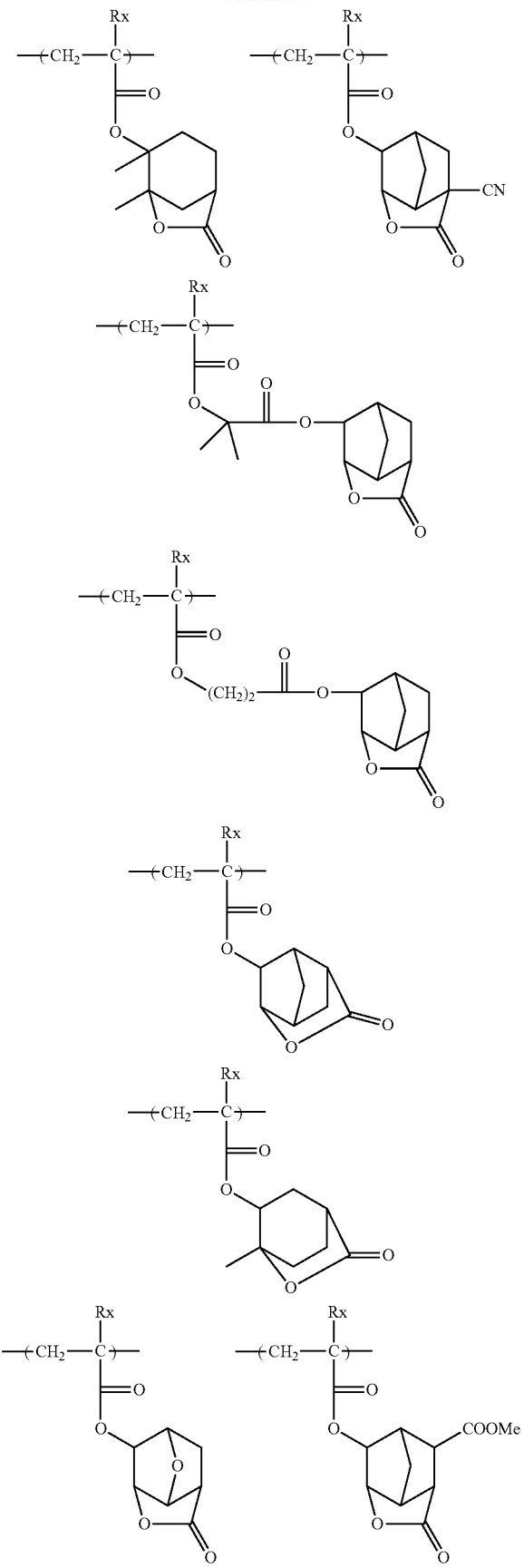
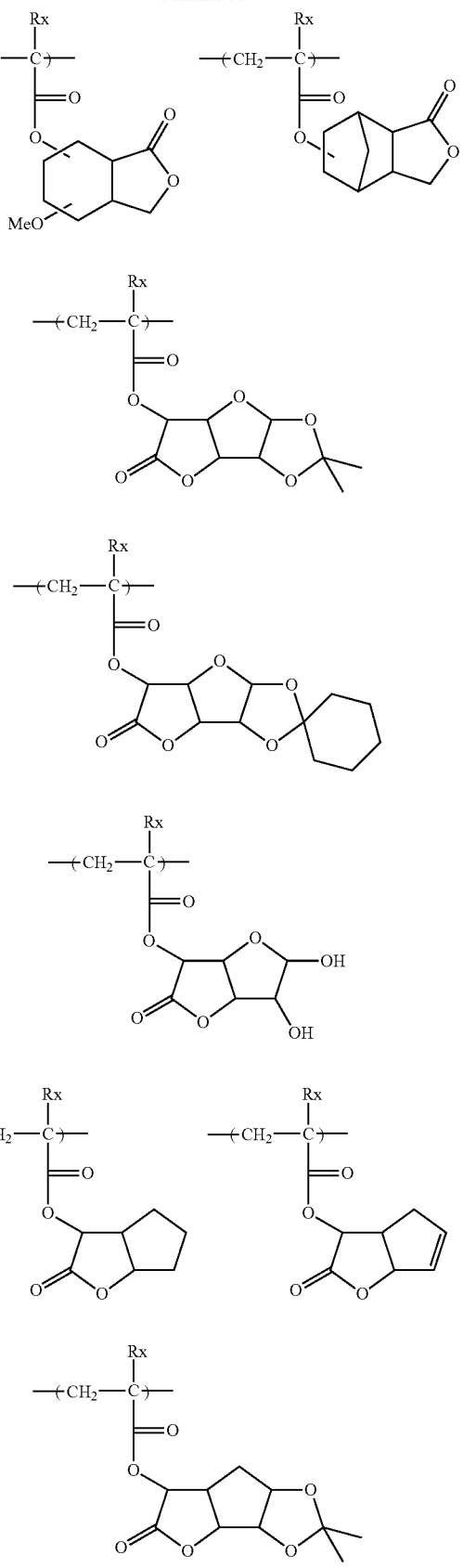

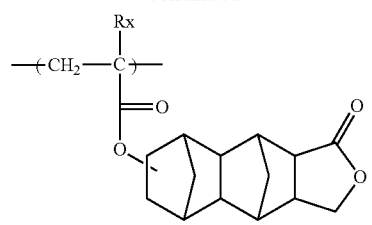

(in the formulae, Rx represents H, CH$_3$, CH$_2$OH, or CF$_3$)

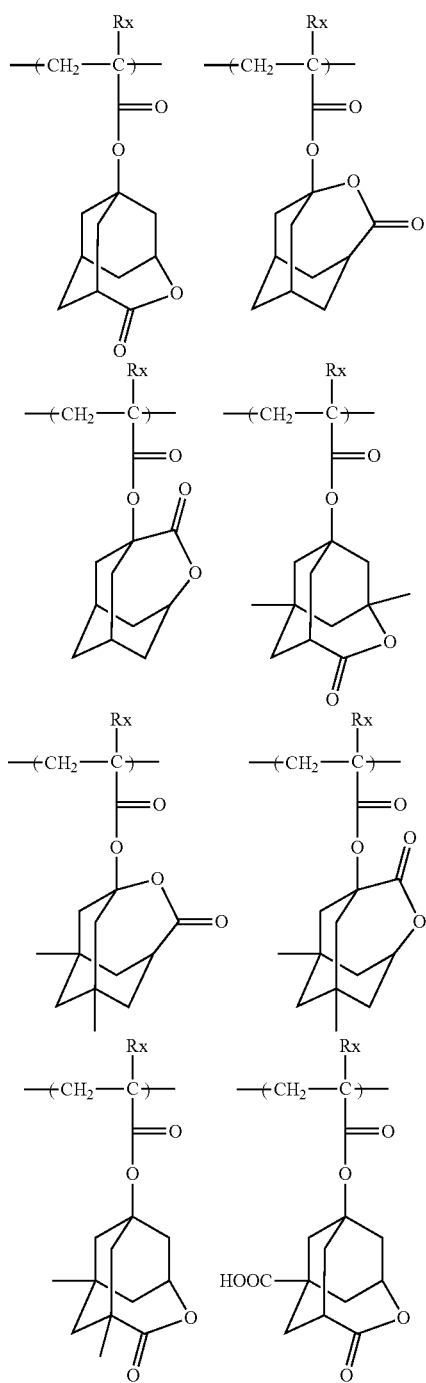

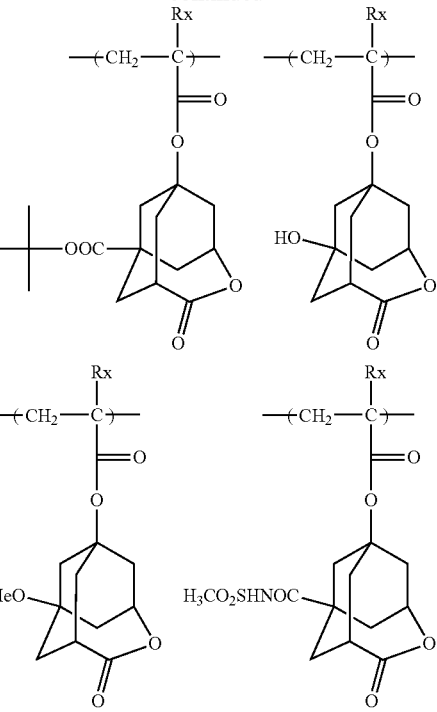

It is preferable that the resin (Ab) has a repeating unit having a hydroxyl group or a cyano group. Thus, adhesiveness to a substrate and developer affinity are improved. The repeating unit having a hydroxyl group or a cyano group is preferably a repeating unit having an alicyclic hydrocarbon structure substituted with a hydroxyl group or a cyano group. In the alicyclic hydrocarbon structure substituted with a hydroxyl group or a cyano group, the alicyclic hydrocarbon structure is preferably an adamantyl group, a diamantyl group, or a norbornane group. Preferred examples of the alicyclic hydrocarbon structure substituted with a hydroxyl group or a cyano group include partial structures represented by the following General Formulae (VIIa) to (VIId).

(VIIa)

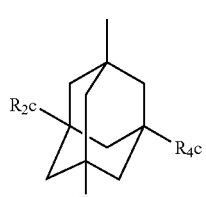

(VIIb)

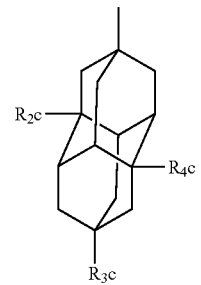

(VIIc)

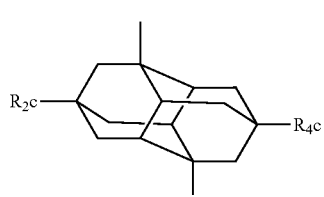

(VIId)

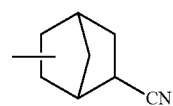

In General Formulae (VIIa) to (VIIc),

R$_2$c to R$_4$c each independently represent a hydrogen atom, a hydroxyl group, or a cyano group, provided that at least one of R$_2$c, . . . , or R$_4$c represents a hydroxyl group or a cyano group. It is preferable that one or two of R$_2$c to R$_4$c are a hydroxyl group and the remainders are hydrogen atoms. In General Formula (VIIa), it is more preferable that two of R$_2$c to R$_4$c are hydroxyl groups and the remainder is a hydrogen atom.

Examples of the repeating unit having the partial structure represented by any one of General Formulae (VIIa) to (VIId) include repeating units represented by the following General Formulae (AIIa) to (AIId).

(AIIa)

(AIIb)

(AIIc)

(AIId)

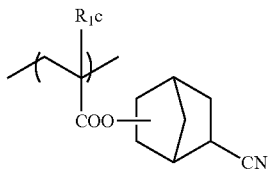

In General Formulae (AIIa) to (AIId),

R$_1$c represents a hydrogen atom, a methyl group, a trifluoromethyl group, or a hydroxymethyl group.

R$_2$c to R$_4$c each have the same definitions as R$_2$c to R$_4$c in General Formulae (VIIa) to (VIIc).

The content of the repeating unit having a hydroxyl group or a cyano group with respect to all the repeating units of the resin (Ab) is preferably 5% to 40% by mole, more preferably 5% to 30% by mole, and still more preferably 10% to 25% by mole.

Specific examples of the repeating unit having a hydroxyl group or a cyano group are shown below, but the present invention is not limited thereto.

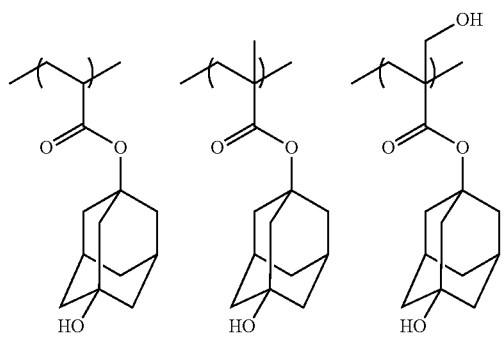

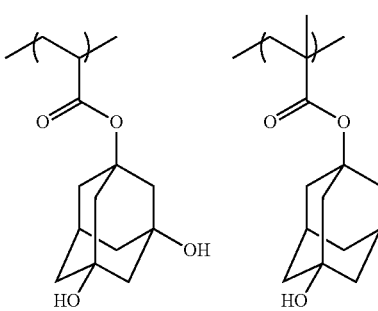

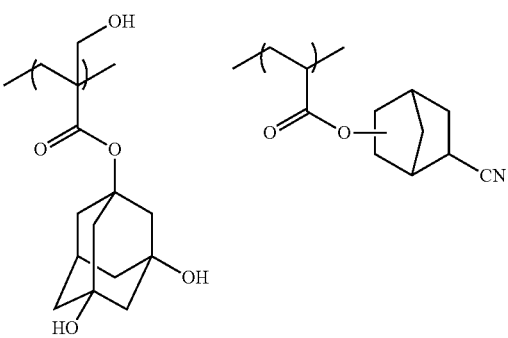

-continued

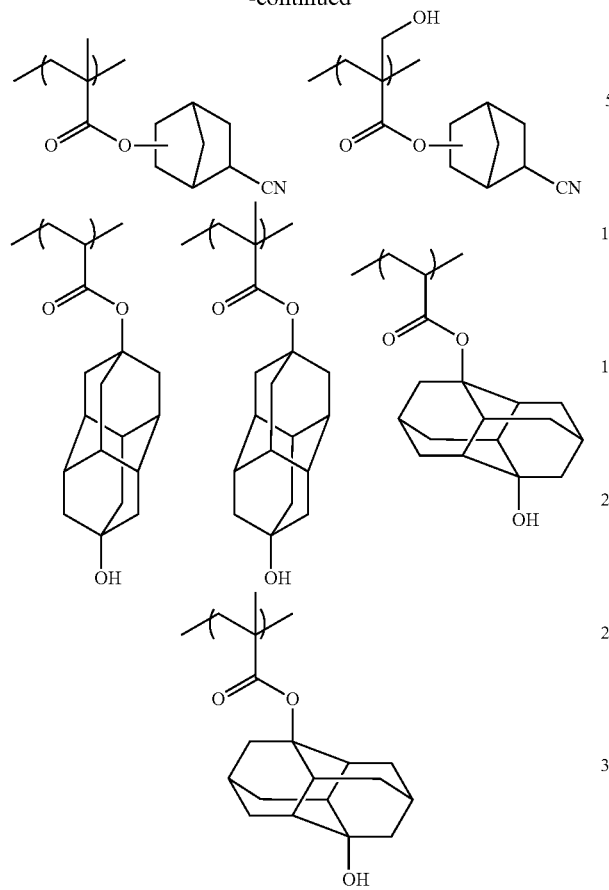

It is preferable that the resin (Ab) has a repeating unit having an alkali-soluble group. Examples of the alkali-soluble group include a carboxyl group, a sulfonamido group, a sulfonylimide group, a bisulfonylimide group, and an aliphatic alcohol with the Ua-position being substituted with an electron-withdrawing group (for example, a hexafluoroisopropanol group). The resin (Ab) more preferably has a repeating unit having a carboxyl group. By virtue of containing a repeating unit having an alkali-soluble group, the resolution increases in the usage of forming contact holes. As the repeating unit having an alkali-soluble group, all of a repeating unit in which an alkali-soluble group is directly bonded to the main chain of the resin, such as a repeating unit with an acrylic acid or a methacrylic acid, a repeating unit in which an alkali-soluble group is bonded to the main chain of the resin through a linking group, and a repeating unit in which an alkali-soluble group is introduced into the polymer chain terminal by using a polymerization initiator or a chain transfer agent containing an alkali-soluble group during the polymerization, are preferable. The linking group may have a cyclic hydrocarbon structure which is monocyclic or polycyclic. A repeating unit with an acrylic acid or a methacrylic acid is particularly preferable.

The content of the repeating units having an alkali-soluble group is preferably 0% to 20% by mole, more preferably 3% to 15% by mole, and still more preferably 5% to 10% by mole, with respect to all the repeating units in the resin (Ab).

Specific examples of the repeating unit having an alkali-soluble group are shown below, but the present invention is not limited thereto.

(in the formulae, Rx represents H, $CH_3$, $CF_3$, or $CH_2OH$)

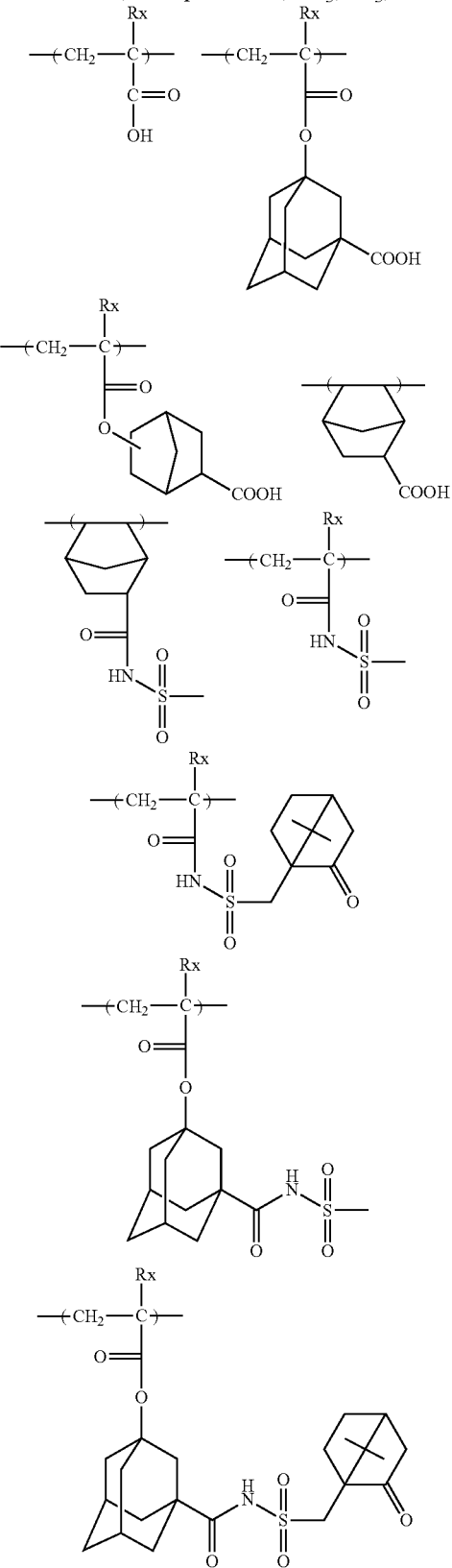

-continued

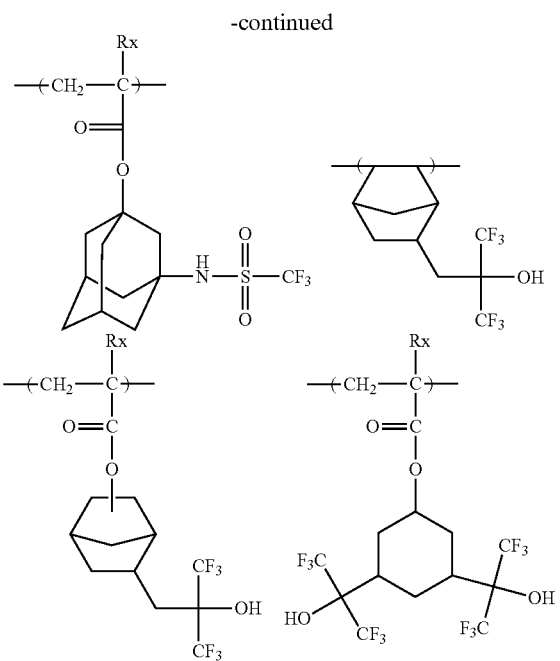

The resin (Ab) may have a repeating unit that further has an alicyclic hydrocarbon structure and does not exhibit acid decomposability. Thus, it is possible to reduce elution of low-molecular components from a resist film into an immersion liquid upon liquid immersion exposure. Examples of such the repeating unit include a repeating unit with 1-adamantyl (meth)acrylate, a repeating unit with diamantyl (meth)acrylate, a repeating unit with tricyclodecanyl (meth) acrylate, and a repeating unit with cyclohexyl (meth)acrylate.

Suitable examples of the combination of the repeating units included in the resin (Ab), other than the above-mentioned repeating units represented by (f1) to (f4), include the combinations of the repeating units described in paragraphs [0527] to [0559] of JP2013-83966A.

Moreover, in a case where the resin (Ab) does not contain the acid-generating repeating unit (B), it is preferable that the content of the repeating unit containing a fluorine atom is 1% by mole or less, and it is more preferable that the resin (Ab) does not contain a fluorine atom. In a case where the resin (Ab) has the repeating unit (B), it is a repeating unit other than the repeating unit (B), it is more preferable that the content of the repeating unit containing a fluorine atom is 1% by mole or less, and it is the most preferable that the resin (Ab) does not contain a fluorine atom.

The weight-average molecular weight (Mw) of the resin (Ab) is preferably in a range of 1,000 to 200,000, and in views of a rate of dissolution of the resin per se in alkali and the sensitivity, is preferably 200,000 or less. The ratio of the weight-average molecular weight (Mw) to the number-average molecular weight (Mn), a dispersity (Mw/Mn), is preferably 1.0 to 3.0, more preferably 1.0 to 2.5, and particularly preferably 1.0 to 2.0.

Above all, the weight-average molecular weight (Mw) of the resin is preferably in a range of 1,000 to 200,000, more preferably in a range of 1,000 to 100,000, particularly preferably in a range of 1,000 to 50,000, and the most preferably in a range of 1,000 to 25,000.

In the present invention, the weight-average molecular weight (Mw) and the number-average molecular weight (Mn) are each defined as polystyrene-equivalent values determined by means of gel permeation chromatography (GPC), using tetrahydrofuran (THF) as a developing solvent (which shall apply hereinafter).

The resin (Ab) having a dispersity of 2.0 or less can be synthesized by performing radical polymerization using an azo-based polymerization initiator. The resin (Ab) having a more preferred dispersity of 1.0 to 1.5 can be synthesized by, for example, living radical polymerization.

The resin (Ab) is preferably polymerized by, for example, a known anion polymerization method, a radical polymerization method, or the like.

In the anion polymerization method, using an alkali metal or organoalkali metal as a polymerization initiator, polymerization is generally performed in an organic solvent at a temperature of −100° C. to 90° C. in an atmosphere of inert gas such as nitrogen and argon. Further, for the copolymerization, a block copolymer is obtained by performing polymerization while sequentially adding monomers to a reaction system, and a random copolymer is obtained by adding a mixture of monomers to a reaction system and performing polymerization.

Examples of the alkali metal of the polymerization initiator include lithium, sodium, potassium, and cesium, and as the organoalkali metal, an alkylation, allylation, or arylation product of the alkali metal can be used. Specific examples thereof include ethyllithium, n-butyllithium, sec-butyllithium, tert-butyllithium, ethylsodium, lithium biphenyl, lithium naphthalene, lithium triphenyl, sodium naphthalene, α-methylstyrene sodium dianion, 1,1-diphenylhexyllithium, and 1,1-diphenyl-3-methylpentyllithium.

The radical polymerization method is carried out in an organic solvent at a temperature of 50° C. to 200° C., in an atmosphere of inert gas, such as nitrogen and argon, using any of known radical polymerization initiators including, for example, an azo compound such as azobisisobutyronitrile and azobisisovaleronitrile, or an organic peroxide such as benzoyl peroxide, methyl ethyl ketone peroxide, and cumene hydroperoxide, if necessary, in combination with any of known chain transfer agents such as 1-dodecanethiol. As this organic solvent, an organic solvent known in the related art can be used, and examples thereof include the organic solvents described in paragraph [0493] of JP2013-83966A.

The resin (Ab) may be used in combination of two or more kinds thereof.

The amount of the resin (Ab) to be added in terms of a total amount is usually 10% to 99% by mass, preferably 20% to 99% by mass, and particularly preferably 30% to 99% by mass, with respect to the total solid content of the composition of the present invention.

[Compound that Generates Acid Upon Irradiation with Active Light or Radiation]

The composition of the present invention further contains a compound that generates an acid upon irradiation with active light or radiation (hereinafter also referred to as a "photoacid generator").

As the photoacid generator, a compound appropriately selected from known compounds that generate an acid upon irradiation with active light or radiation which are used for, for example, a photoinitiator for cationic photopolymerization, a photoinitiator for radical photopolymerization, a coloring agent, a photodiscoloring agent, a microresist, or the like, and a mixture thereof can be used. Examples thereof include onium salts such as a sulfonium salt and an iodonium salt, and diazodisulfone compounds such as a bis(alkylsulfonyldiazomethane).

Preferred examples of the photoacid generator include compounds represented by the following General Formulae (ZI), (ZII), and (ZIII).

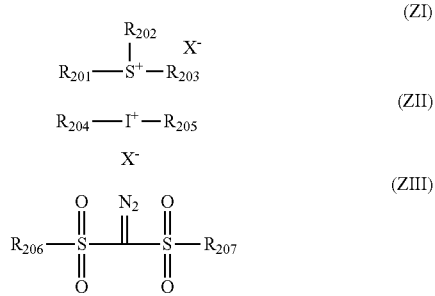

In General Formula (ZI), $R_{201}$, $R_{202}$, and $R_{203}$ each independently represent an organic group. The organic group represented by each of $R_{201}$, $R_{202}$, and $R_{203}$ preferably has, for example, 1 to 30 carbon atoms, and preferably 1 to 20 carbon atoms.

Two members of $R_{201}$ to $R_{203}$ may be bonded to each other through a single bond or a linking group to form a ring structure. In this case, examples of the linking group include an ether bond, a thioether bond, an ester bond, an amide bond, a carbonyl group, a methylene group, and an ethylene group. Examples of the group formed by bonding of two members of $R_{201}$ to $R_{203}$ include alkylene groups such as a butylene group and a pentylene group.

Specific examples of $R_{201}$, $R_{202}$, and $R_{203}$ include corresponding groups in the compound (ZI-1), (ZI-2), or (ZI-3) which will be described later.

X⁻ represents a non-nucleophilic anion. Examples of X⁻ include a sulfonate anion, a bis(alkylsulfonyl)amide anion, a tris(alkylsulfonyl)methide anion, $BF_4^-$, $PF_6^-$, and $SbF_6^-$, with an organic anion containing a carbon atom being preferable. Preferred examples of the organic anion include organic anions represented by the following AN1 to AN3.

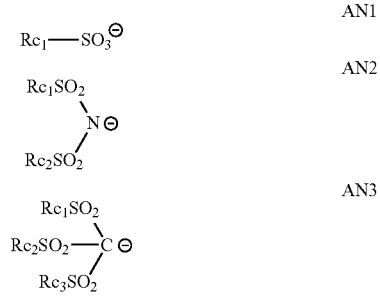

In Formulae AN1 to AN3, $Rc_1$ to $Rc_3$ each independently represent an organic group. Examples of the organic group include those having 1 to 30 carbon atoms, and the organic group is preferably an alkyl group, an aryl group, or a group formed by linking these plural groups through a linking group. Further, examples of the linking group include a single bond, —O—, —CO$_2$—, —S—, —SO$_3$—, and —SO$_2$N(Rd$_1$)-. Here, Rd$_1$ represents a hydrogen atom or an alkyl group, and may form a ring structure together with an alkyl group or an aryl group to which Rd$_1$ is bonded.

The organic group of each of $Rc_1$ to $Rc_3$ may be an alkyl group substituted at the 1-position thereof with a fluorine atom or a fluoroalkyl group, or a phenyl group substituted with a fluorine atom or a fluoroalkyl group. By incorporation of a fluorine atom or a fluoroalkyl group, it is possible to improve the acidity of the acid generated upon irradiation with light. Thus, the sensitivity of the active-light-sensitive or radiation-sensitive resin composition can be improved. Further, $Rc_1$ to $Rc_3$ may be bonded to another alkyl group or aryl group, or the like to form a ring structure.

Moreover, preferred examples of X⁻ include sulfonate anions represented by the following General Formula (SA1) or (SA2).

In Formula (SA1), $Ar_1$ represents an aryl group, and may further have a substituent other than a -(D-B) group.

n represents an integer of 1 or more. n is preferably 1 to 4, more preferably 2 or 3, and the most preferably 3.

D represents a single bond or a divalent linking group. The divalent linking group is an ether group, a thioether group, a carbonyl group, a sulfoxide group, a sulfone group, a sulfonic ester group, or an ester group.

B represents a hydrocarbon group.

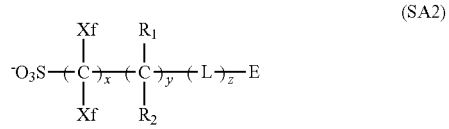

In Formula (SA2),

Xf's each independently represent a fluorine atom or an alkyl group in which at least one hydrogen atom is substituted with a fluorine atom.

$R_1$ and $R_2$ each independently represent a hydrogen atom, a fluorine atom, an alkyl group, or an alkyl group in which at least one hydrogen atom is substituted with a fluorine atom, and in a case where $R_1$'s, and $R_2$'s are present in plural numbers, they may be the same as or different from each other, respectively.

L represents a single bond or a divalent linking group. In a case where L's are present in plural numbers, they may be the same as or different from each other.

E represents a group having a cyclic structure.

x represents an integer of 1 to 20, y represents an integer of 0 to 10, and z represents an integer of 0 to 10.

First, the sulfonate anions represented by Formula (SA1) will be described in detail.

In Formula (SA1), $Ar_1$ is preferably an aromatic ring having 6 to 30 carbon atoms. Specifically, $Ar_1$ is, for example, a benzene ring, a naphthalene ring, a pentalene ring, an indene ring, an azulene ring, a heptalene ring, an indecene ring, a perylene ring, a pentacene ring, an acenaphthalene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, or a phenazine ring. Among these, from the viewpoint of the simultaneous attainment of roughness and sensitivity enhancements, a benzene ring, a naphthalene ring, and an anthracene ring are preferable, and a benzene ring is more preferable.

In a case where $Ar_1$ further has a substituent other than the -(D-B) group, examples of the substituent include the following ones. That is, examples of the substituent include a halogen atom such as a fluorine atom, a chlorine atom, a bromine atom, and an iodine atom; an alkoxy group such as a methoxy group, an ethoxy group, and a tert-butoxy group; an aryloxy group such as a phenoxy group and a p-tolyloxy group; an alkylthioxy group such as a methylthioxy group, an ethylthioxy group, and a tert-butylthioxy group; an arylthioxy group such as a phenylthioxy group, and a p-tolylthioxy group; an alkoxy- or aryloxycarbonyl group such as a methoxycarbonyl group, a butoxycarbonyl group, and a phenoxycarbonyl group; an acetoxy group; a linear or branched alkyl group such as a methyl group, an ethyl group, a propyl group, a butyl group, a heptyl group, a hexyl group, a dodecyl group, and a 2-ethylhexyl group; an alkenyl group such as a vinyl group, a propenyl group, and a hexenyl group; an alkynyl group such as an acetylene group, a propynyl group, and a hexynyl group; an aryl group such as a phenyl group, and a tolyl group; a hydroxyl group; a carboxyl group; and a sulfonic acid group. Among these, a linear or branched alkyl group is preferable from the viewpoint of improvement of roughness.

In Formula (SA1), D is preferably a single bond, or an ether or ester group. More preferably, D is a single bond.

In Formula (SA1), B is, for example, an alkyl group, an alkenyl group, an alkynyl group, an aryl group, or a cycloalkyl group. B is preferably an alkyl group or a cycloalkyl group. Each of the alkyl group, the alkenyl group, the alkynyl group, the aryl group, and the cycloalkyl group as B may further have a substituent.

The alkyl group as B is preferably a branched alkyl group. Examples of the branched alkyl group include an isopropyl group, a tert-butyl group, a tert-pentyl group, a neopentyl group, a sec-butyl group, an isobutyl group, an isohexyl group, a 3,3-dimethylpentyl group, and a 2-ethylhexyl group.

The cycloalkyl group as B may be a monocyclic cycloalkyl group or a polycyclic cycloalkyl group. Examples of the monocyclic cycloalkyl group include a cyclopropyl group, a cyclobutyl group, a cyclopentyl group, a cyclohexyl group, a cycloheptyl group, and a cyclooctyl group. Examples of the polycyclic cycloalkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group.

In a case where the alkyl group, the alkenyl group, the alkynyl group, the aryl group, or the cycloalkyl group as B has a substituent, examples of the substituent include the following ones. That is, examples of this substituent include a halogen atom such as a fluorine atom, a chlorine atom, a bromine atom, and an iodine atom; an alkoxy group such as a methoxy group, an ethoxy group, and a tert-butoxy group; an aryloxy group such as a phenoxy group, and a p-tolyloxy group; an alkylthioxy group such as a methylthioxy group, an ethylthioxy group, and a tert-butylthioxy group; an arylthioxy group such as a phenylthioxy group, and a p-tolylthioxy group; an alkoxycarbonyl group such as a methoxycarbonyl group, a butoxycarbonyl group, and a phenoxycarbonyl group; an acetoxy group; a linear alkyl group such as a methyl group, an ethyl group, a propyl group, a butyl group, a heptyl group, a hexyl group, a dodecyl group, and a 2-ethylhexyl group; a branched alkyl group; a cycloalkyl group such as a cyclohexyl group; an alkenyl group such as a vinyl group, a propenyl group, and a hexenyl group; an acetylene group; an alkynyl group such as a propynyl group, and a hexynyl group; an aryl group such as a phenyl group, and a tolyl group; a hydroxyl group; a carboxyl group; a sulfonic acid group; and a carbonyl group. Among these, a linear alkyl group and a branched alkyl group are preferable from the viewpoint of the simultaneous attainment of roughness and sensitivity enhancements.

Next, the sulfonate anion represented by Formula (SA2) will be described in detail.

In Formula (SA2), Xf is a fluorine atom or an alkyl group in which at least one hydrogen atom is substituted with a fluorine atom. This alkyl group preferably contains 1 to 10 carbon atoms, and more preferably 1 to 4 carbon atoms. Incidentally, the alkyl group substituted with a fluorine atom is preferably a perfluoroalkyl group.

Xf is preferably a fluorine atom or a perfluoroalkyl group having 1 to 4 carbon atoms. Specifically, Xf is preferably a fluorine atom, $CF_3$, $C_2F_5$, $C_3F_7$, $C_4F_9$, $C_5F_{11}$, $C_6F_{13}$, $C_7F_5$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, or $CH_2CH_2C_4F_9$. Among these, a fluorine atom and $CF_3$ are preferable, and a fluorine atom is the most preferable.

In Formula (SA2), $R_1$ and $R_2$ each independently represent a group selected from hydrogen atom, a fluorine atom, an alkyl group, or an alkyl group in which at least one hydrogen atom is substituted with a fluorine atom. The alkyl group which may be substituted with a fluorine atom preferably has 1 to 4 carbon atoms. The alkyl group substituted with a fluorine atom is particularly preferably a perfluoroalkyl group having 1 to 4 carbon atoms. Specific examples thereof include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

In Formula (SA2), x is preferably 1 to 8, and more preferably 1 to 4; y is preferably 0 to 4, and more preferably 0; and z is preferably 0 to 8, and more preferably 0 to 4.

In Formula (SA2), L represents a single bond or a divalent linking group. Examples of the divalent linking group include —COO—, —OCO—, —CO—, —O—, —S—, —SO—, —SO$_2$—, an alkylene group, a cycloalkylene group, and an alkenylene group. Among these, —COO—, —OCO—, —CO—, —O—, —S—, —SO—, and —SO$_2$— are preferable, and —COO—, —OCO—, and —SO$_2$— are more preferable.

In Formula (SA2), E represents a group having a ring structure. Examples of E include a cyclic aliphatic group, an aryl group, and a group having a heterocyclic structure.

The cyclic aliphatic group as E may have a monocyclic structure or a polycyclic structure. The cyclic aliphatic group having a monocyclic structure is preferably a monocyclic cycloalkyl group such as a cyclopentyl group, a cyclohexyl group, and a cyclooctyl group. The cyclic aliphatic group having a polycyclic structure is preferably a polycyclic cycloalkyl group such as a norbornyl group, a tricyclodecanyl group, a tetracyclodecanyl group, a tetracyclododecanyl group, and an adamantyl group. In particular, in a case where a cyclic aliphatic group having a bulky structure of 6 or more-membered ring is employed as E, any in-film diffusion in the post exposure bake (PEB) operation can be suppressed, and the resolving power and exposure latitude (EL) can be more enhanced.

The aryl group as E is, for example, a benzene ring, a naphthalene ring, a phenanthrene ring, or an anthracene ring.

The group having a heterocyclic structure as E may or may not have aromaticity. The heteroatom that may be contained in this group is preferably a nitrogen atom or an oxygen atom. Specific examples of the heterocyclic structure include a furan ring, a thiophene ring, a benzofuran ring, a benzothiophene ring, a dibenzofuran ring, a dibenzothiophene ring, a pyridine ring, a piperidine ring, and a morpholine ring. Among these, a furan ring, a thiophene ring, a pyridine ring, a piperidine ring, and a morpholine ring are preferable.

E may have a substituent. Examples of the substituent include an alkyl group (may be any of linear, branched, and cyclic forms, preferably having 1 to 12 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group.

Examples of the sulfonate anion represented by General Formula (SA1) or (SA2) include the following ones.

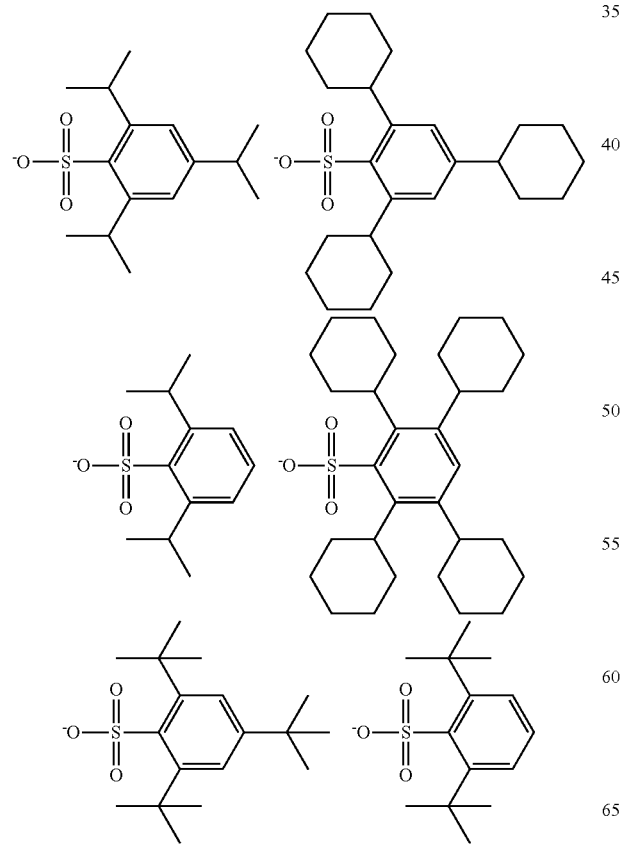

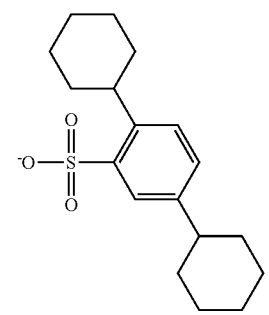

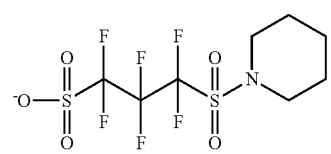

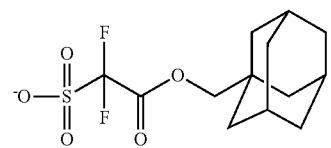

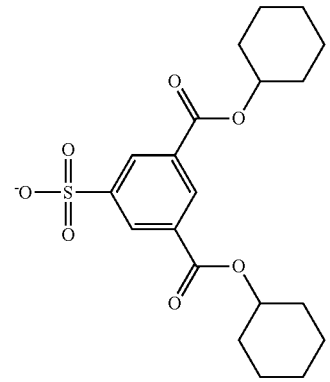

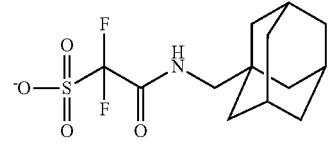

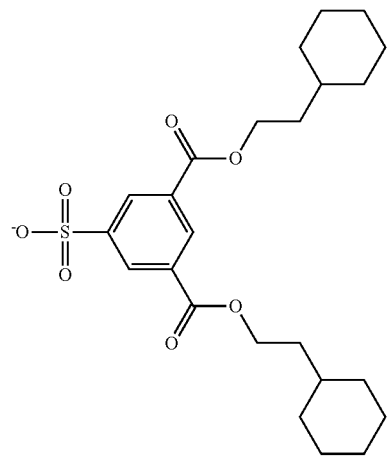

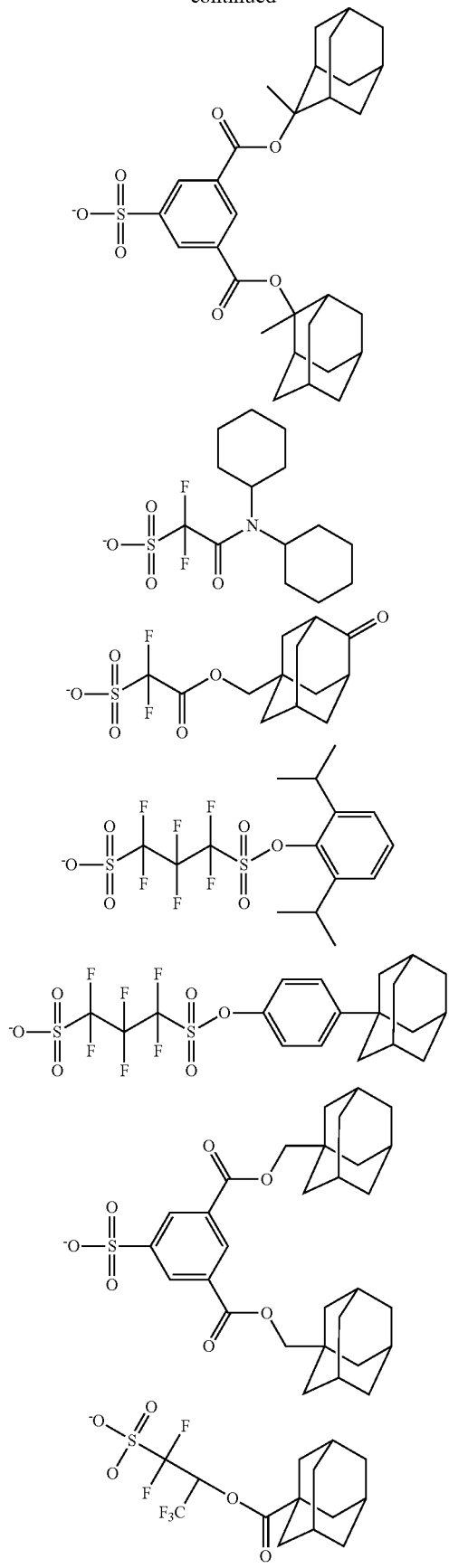
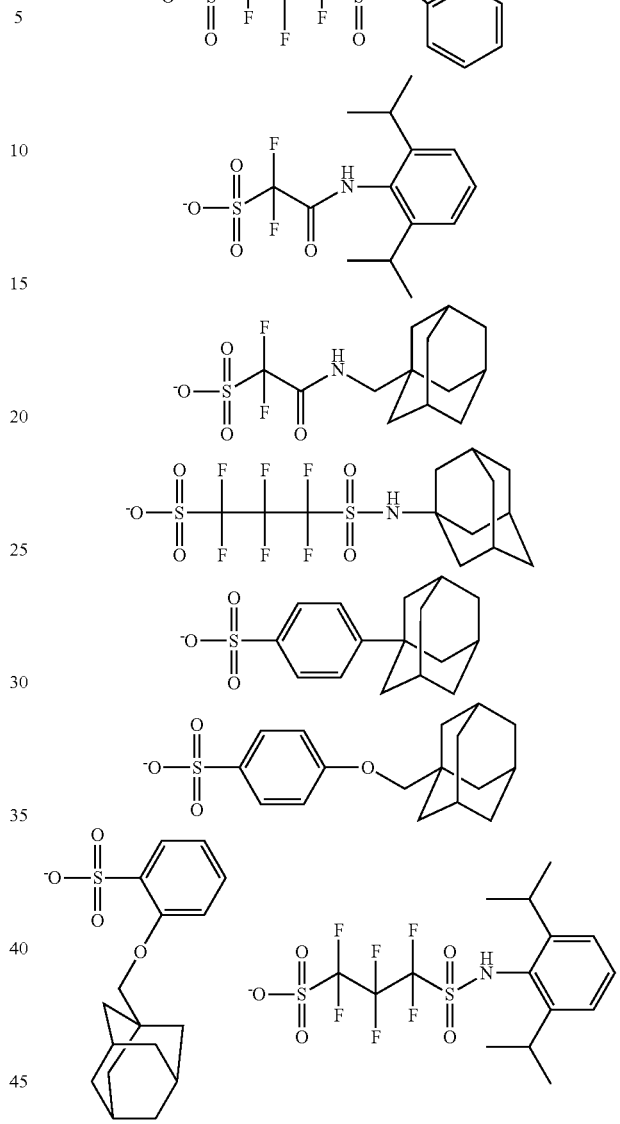

A compound having a plurality of the structures represented by General Formula (ZI) is used as a photoacid generator. For example, the photoacid generator may be a compound with a structure in which at least one of $R_{201}, \ldots,$ or $R_{203}$ of the compound represented by General Formula (ZI) is bonded to at least one of $R_{201}, \ldots,$ or $R_{203}$ of another compound represented by General Formula (ZI).

More preferred examples of the (ZI) components include compounds (ZI-1) to (ZI-4) described below.

The compound (ZI-1) is the compound of General Formula (ZI) in which at least one of $R_{201}, \ldots,$ or $R_{203}$ is an aryl group. That is, the compound (ZI-1) is an arylsulfonium compound, that is, a compound having arylsulfonium as a cation.

With respect to the compound (ZI-1), all of $R_{201}$ to $R_{203}$ may be aryl groups, or some of $R_{201}$ to $R_{203}$ may be aryl groups and the remainder is an alkyl group. Further, in a case where the compound (ZI-1) has a plurality of aryl groups, these aryl groups may be the same as or different from each other.

Examples of the compound (ZI-1) include a triarylsulfonium compound, a diarylalkylsulfonium compound, and an aryldialkylsulfonium compound.

The aryl group in the compound (ZI-1) is preferably a phenyl group, a naphthyl group, or a heteroaryl group such as an indole residue, or a pyrrole residue, and particularly preferably a phenyl group, a naphthyl group, or an indole residue.

The alkyl group which is contained in the compound (ZI-1), if necessary, is preferably a linear, branched, or cyclic alkyl group having 1 to 15 carbon atoms. Examples thereof include a methyl group, an ethyl group, a propyl group, an n-butyl group, a sec-butyl group, a t-butyl group, a cyclopropyl group, a cyclobutyl group, and a cyclohexyl group.

These aryl groups and alkyl groups may each have a substituent. Examples of the substituent include an alkyl group (preferably 1 to 15 carbon atoms), an aryl group (preferably 6 to 14 carbon atoms), an alkoxy group (preferably 1 to 15 carbon atoms), a halogen atom, a hydroxyl group, and a phenylthio group.

Preferred examples of the substituent include a linear, branched, or cyclic alkyl group having 1 to 12 carbon atoms, and a linear, branched, or cyclic alkoxy group having 1 to 12 carbon atoms. Particularly preferred examples of the substituent include an alkyl group having 1 to 6 carbon atoms and an alkoxy group having 1 to 6 carbon atoms. The substituent may be introduced in any one of three $R_{201}$ to $R_{203}$, or alternatively, may be introduced in all three of $R_{201}$ to $R_{203}$. Further, in a case where $R_{201}$ to $R_{203}$ are phenyl groups, the substituent is preferably introduced at the p-position of the aryl group.

Furthermore, an embodiment in which one or two of $R_{201}$, $R_{202}$, and $R_{203}$ are aryl groups that may have substituent, and the remainder is a linear, branched, or cyclic alkyl group is also preferable. Specific examples of the structure include structures described in paragraphs 0141 to 0153 of JP2004-210670A.

Here, the aryl group is specifically the same as the aryl group as to $R_{201}$, $R_{202}$, and $R_{203}$, and is preferably a phenyl group or a naphthyl group. Further, the aryl group preferably has any one of a hydroxyl group, an alkoxy group, and an alkyl group as a substituent. The substituent is more preferably an alkoxy group having 1 to 12 carbon atoms, and still more preferably an alkoxy group having 1 to 6 carbon atoms.

The linear, branched, or cyclic alkyl group as the remainder group is preferably an alkyl group having 1 to 6 carbon atoms. This group may further have a substituent. In a case where there are two remainder groups, these two groups may be bonded to each other to form a ring structure.

The compound (ZI-1) is, for example, a compound represented by the following General Formula (ZI-1A).

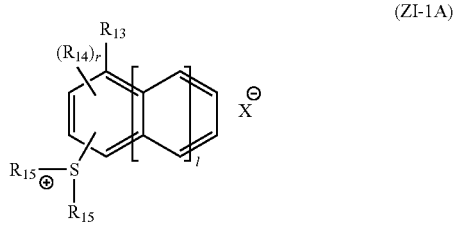

(ZI-1A)

In General Formula (ZI-1A), $R_{13}$ represents a hydrogen atom, a cycloalkyloxy group, a fluorine atom, a hydroxyl group, an alkyl group, a cycloalkyl group, an alkoxy group or an alkoxycarbonyl group.

In a case where $R_{14}$'s are present in plural numbers, they each independently represent an alkyl group, a cycloalkyl group, an alkoxy group, an alkylsulfonyl group, or a cycloalkylsulfonyl group.

$R_{15}$'s each independently represent an alkyl group or a cycloalkyl group. Two $R_{15}$'s may be bonded to each other to form a ring structure.

l represents an integer of 0 to 2.

r represents an integer of 0 to 8.

$X^-$ represents a non-nucleophilic anion, and examples thereof include the same ones as $X^-$ in General Formula (ZI).

The alkyl group of $R_{13}$, $R_{14}$, or $R_{15}$ may be a linear alkyl group or a branched alkyl group. As the alkyl group, one having 1 to 10 carbon atoms is preferable. Examples thereof include a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, and an n-decyl group. Among these alkyl groups, a methyl group, an ethyl group, an n-butyl group, and a t-butyl group are particularly preferable.

Examples of the cycloalkyl group of $R_{13}$, $R_{14}$, or $R_{15}$ include a cyclopropyl group, a cyclobutyl group, a cyclopentyl group, a cyclohexyl group, a cycloheptyl group, a cyclooctyl group, a cyclododecanyl group, a cyclopentenyl group, a cyclohexenyl group, and a cyclooctadienyl group. Among these cycloalkyl groups, a cyclopropyl group, a cyclopentyl group, a cyclohexyl group, and cyclooctyl group are particularly preferable.

Examples of the alkyl group moiety in the alkoxy group of $R_{13}$ or $R_{14}$ include those enumerated above with regard to the alkyl group of $R_{13}$, $R_{14}$, or $R_{15}$. As the alkoxy group, a methoxy group, an ethoxy group, an n-propoxy group, and an n-butoxy group are particularly preferable.

Examples of the cycloalkyl group moiety in the cycloalkyloxy group of $R_{13}$ include those described above with regard to the cycloalkyl group of each of $R_{13}$, $R_{14}$, and $R_{15}$. As the cycloalkoxy group, a cyclopentyloxy group and a cyclohexyloxy group are particularly preferable.

Examples of the alkoxy group moiety in the alkoxycarbonyl group of $R_{13}$ include those described above with regard to the alkoxy group of each of $R_{13}$ and $R_{14}$. As the alkoxycarbonyl group, a methoxycarbonyl group, an ethoxycarbonyl group, and an n-butoxycarbonyl group are particularly preferable.

Examples of the alkyl group moiety in the alkylsulfonyl group of $R_{14}$ include those described above with regard to the alkyl group of each of $R_{13}$, $R_{14}$, and $R_{15}$. As the cycloalkyl group moiety in the cycloalkylsulfonyl group of $R_{14}$ include those described above with regard to the cycloalkyl group of each of $R_{13}$, $R_{14}$, and $R_{15}$. As the alkylsulfonyl group and the cycloalkylsulfonyl group, a methanesulfonyl group, an ethanesulfonyl group, an n-propanesulfonyl group, an n-butanesulfonyl group, a cyclopentanesulfonyl group, and a cyclohexane sulfonyl group are particularly preferable.

l preferably is 0 or 1, and more preferably is 1. r preferably is 0 to 2.

Each of the groups of $R_{13}$, $R_{14}$, and $R_{15}$ may further have a substituent. Examples of the substituent include a halogen atom such as a fluorine atom, a hydroxyl group, a carboxyl group, a cyano group, a nitro group, an alkoxy group, a cycloalkyloxy group, an alkoxyalkyl group, a cycloalkyloxyalkyl group, an alkoxycarbonyl group, a cycloalkyloxycarbonyl group, an alkoxycarbonyloxy group, and a cycloalkyloxycarbonyloxy group.

The alkoxy group may be linear or branched. Examples of the alkoxy group include those having 1 to 20 carbon atoms, such as a methoxy group, an ethoxy group, an n-propoxy group, an i-propoxy group, an n-butoxy group, a 2-methylpropoxy group, a 1-methylpropoxy group, and a t-butoxy group.

Examples of the cycloalkyloxy group include those having 3 to 20 carbon atoms, such as a cyclopentyloxy group and a cyclohexyloxy group.

The alkoxyalkyl group may be linear or branched. Examples of the alkoxyalkyl group include those having 2 to 21 carbon atoms, such as a methoxymethyl group, an ethoxymethyl group, a 1-methoxyethyl group, a 2-methoxyethyl group, a 1-ethoxyethyl group, and a 2-ethoxyethyl group.

Examples of the cycloalkyloxyalkyl group include those having 4 to 21 carbon atoms, such as a cyclohexyloxymethyl group, a cyclopentyloxyethyl group, and a cyclohexyloxyethyl group.

The alkoxycarbonyl group may be linear or branched. Examples of the alkoxycarbonyl group include those having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, and a t-butoxycarbonyl group.

Examples of the cycloalkyloxycarbonyl group include those having 4 to 21 carbon atoms, such as a cyclopentyloxycarbonyl group and a cyclohexyloxycarbonyl group.

The alkoxycarbonyloxy group may be linear or branched. Examples of the alkoxycarbonyloxy group include those having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, and a t-butoxycarbonyloxy group.

Examples of the cycloalkyloxycarbonyloxy group include those having 4 to 21 carbon atoms, such as a cyclopentyloxycarbonyloxy group and a cyclohexyloxycarbonyloxy group.

The ring structure that may be formed by mutual bonding of two $R_{15}$'s is preferably a structure in which a 5- or 6-membered ring, particularly a 5-membered ring (that is, a tetrahydrothiophene ring) is formed by two $R_{15}$'s together with the S atom in General Formula (ZI-1A).

This ring structure may further have a substituent. Examples of the substituent include a hydroxyl group, a carboxyl group, a cyano group, a nitro group, an alkoxy group, an alkoxyalkyl group, an alkoxycarbonyl group, and an alkoxycarbonyloxy group.

It is particularly preferable that $R_{15}$ is a methyl group, an ethyl group, or a divalent group allowing two $R_{15}$'s to be bonded to each other to form a tetrahydrothiophene ring structure together with the sulfur atom.

The alkyl group, the cycloalkyl group, the alkoxy group, and the alkoxycarbonyl group of $R_{13}$, and the alkyl group, the cycloalkyl group, the alkoxy group, the alkylsulfonyl group, and the cycloalkylsulfonyl group of $R_{14}$ may each further have a substituent. Preferred examples of the substituent include a hydroxyl group, an alkoxy group, an alkoxycarbonyl group, and a halogen atom (particularly, a fluorine atom).

Specific preferred examples of the cation in the compound represented by General Formula (ZI-1A) are shown below.

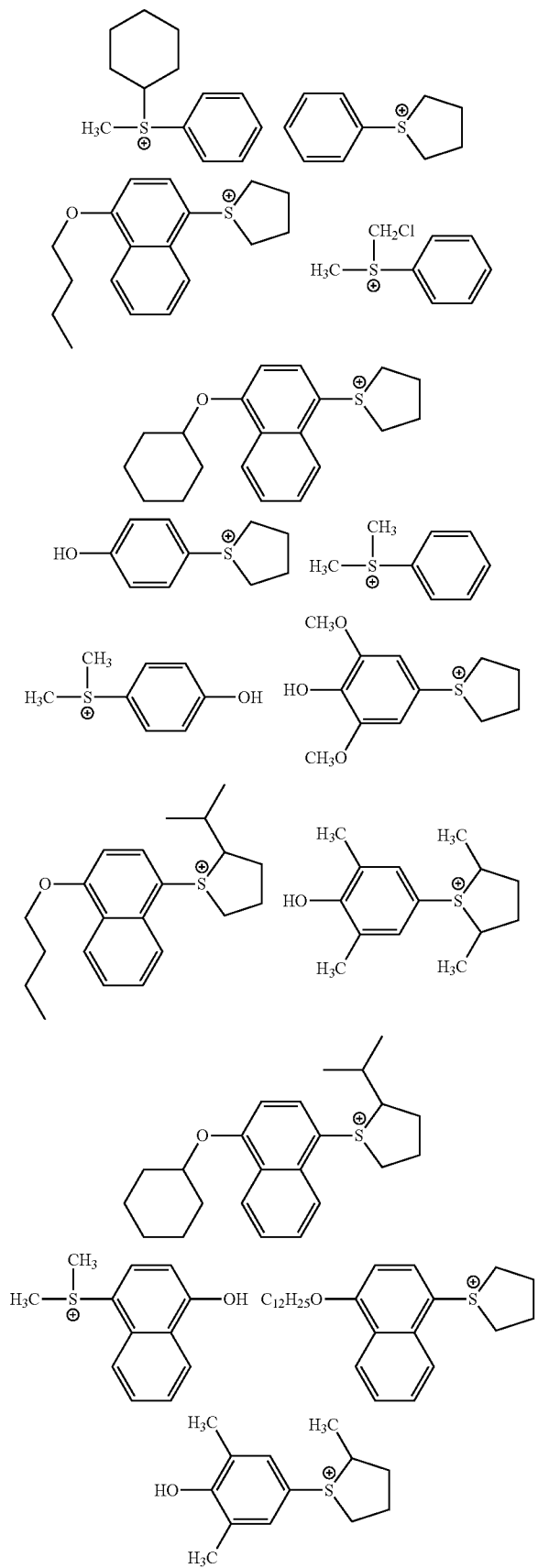

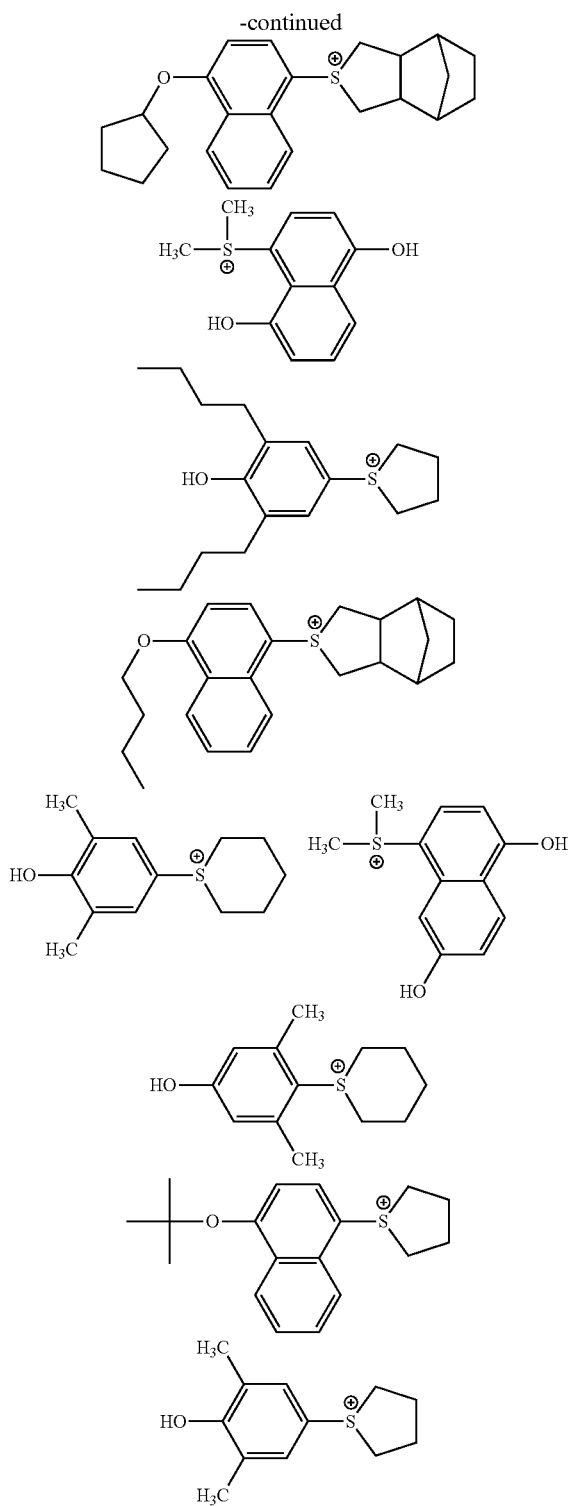

Next, the compound (ZI-2) will be described.

The compound (ZI-2) is the compound in a case where $R_{201}$ to $R_{203}$ in Formula (ZI) each independently represent an organic group containing no aromatic ring. The aromatic ring as mentioned herein also encompasses an aromatic ring containing a heteroatom.

The organic group containing no aromatic ring as each of $R_{201}$ to $R_{203}$ has, for example, 1 to 30 carbon atoms, and preferably 1 to 20 carbon atoms.

Preferably, $R_{201}$ to $R_{203}$ each independently represent an alkyl group, a 2-oxoalkyl group, an alkoxycarbonylmethyl group, an allyl group, or a vinyl group. $R_{201}$ to $R_{203}$ are each more preferably a linear, branched, or cyclic 2-oxoalkyl group or an alkoxycarbonylmethyl group, and particularly preferably a linear or branched 2-oxoalkyl group.

The alkyl group as each of $R_{201}$ to $R_{203}$ may be linear, branched, or cyclic, and preferred examples thereof include a linear or branched alkyl group having 1 to 10 carbon atoms (for example, a methyl group, an ethyl group, a propyl group, a butyl group, and a pentyl group), and a cycloalkyl group having 3 to 10 carbon atoms (a cyclopentyl group, a cyclohexyl group, or a norbornyl group).

The 2-oxoalkyl group as each of $R_{201}$ to $R_{203}$ may be linear, branched, or cyclic, and is preferably a group having $>C=O$ at the 2-position of any of the alkyl group.

Preferred examples of the alkoxy group in the alkoxycarbonylmethyl group as each of $R_{201}$ to $R_{203}$ include an alkoxy group having 1 to 5 carbon atoms (a methoxy group, an ethoxy group, a propoxy group, a butoxy group, and a pentoxy group).

$R_{201}$ to $R_{203}$ may further be substituted with, for example, a halogen atom, an alkoxy group (for example, having 1 to 5 carbon atoms), a hydroxyl group, a cyano group, and/or a nitro group.

Two of $R_{201}$ to $R_{203}$ may be bonded to each other to form a ring structure. This ring structure may contain an oxygen atom, a sulfur atom, an ester bond, an amido bond, and/or a carbonyl group in the ring. Examples of the group formed by mutual bonding of two of $R_{201}$ to $R_{203}$ include an alkylene group (for example, a butylene group and a pentylene group).

Next, the compounds (ZI-3) will be described.

The compound (ZI-3) is a compound represented by the following General Formula (ZI-3), which is a compound having a phenacylsulfonium salt structure.

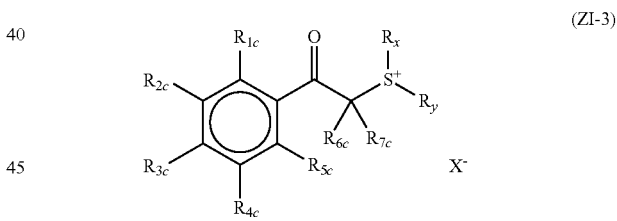

(ZI-3)

In the formula, $R_{1c}$ to $R_{5c}$ each independently represent a hydrogen atom, an alkyl group, an alkoxy group, or a halogen atom. The alkyl group and the alkoxy group each preferably have 1 to 6 carbon atoms.

$R_{6c}$ and $R_{7c}$ each represent a hydrogen atom or an alkyl group. The alkyl group preferably has 1 to 6 carbon atoms.

$R_x$ and $R_y$ each independently represent an alkyl group, a 2-oxoalkyl group, an alkoxycarbonylmethyl group, an allyl group, or a vinyl group. Each of these atomic groups preferably has 1 to 6 carbon atoms.

Any two or more of $R_{1c}$ to $R_{7c}$ may be bonded to each other to form a ring structure. Further, $R_x$ and $R_y$ may be bonded to each other to form a ring structure. Each of these ring structures may contain an oxygen atom, a sulfur atom, an ester bond, and/or an amido bond.

$X^-$ in General Formula (ZI-3) has the same definition as $X^-$ in General Formula (ZI).

Specific examples of the compound (ZI-3) include the compounds described for compounds exemplified in paragraphs 0047 and 0048 of JP2004-233661A and paragraphs 0040 to 0046 of JP2003-35948A.

Next, the compound (ZI-4) will be described.

The compound (ZI-4) is a compound having a cation represented by the following General Formula (ZI-4). This compound (ZI-4) is effective in suppression of outgassing.

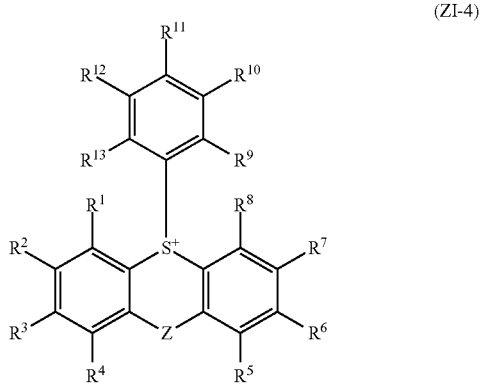

(ZI-4)

In General Formula (ZI-4), $R^1$ to $R^{13}$ each independently represent a hydrogen atom or a substituent. It is preferable that at least one of $R^1$, . . . , or $R^{13}$ is a substituent containing an alcoholic hydroxyl group. Herein, the term "alcoholic hydroxyl group" means a hydroxyl group bonded to a carbon atom of an alkyl group.

Z represents a single bond or a divalent linking group.

In a case where $R^1$ to $R^{13}$ are each a substituent containing an alcoholic hydroxyl group, it is preferable that $R^1$ to $R^{13}$ are each a group represented by —(W—Y), in which Y is an alkyl group substituted with a hydroxyl group and W is a single bond or a divalent linking group.

Preferred examples of the alkyl groups represented by Y include an ethyl group, a propyl group, and an isopropyl group. Particularly preferably, Y includes a structure represented by —$CH_2CH_2OH$.

The divalent linking group represented by W is not particularly limited, but is preferably a single bond, or a divalent group as obtained by substituting any hydrogen atom of an alkoxy group, an acyloxy group, an acylamino group, an alkyl- or arylsulfonylamino group, an alkylthio group, an alkylsulfonyl group, an acyl group, an alkoxycarbonyl group, or a carbamoyl group with a single bond, and more preferably a single bond, or a divalent group as obtained by substituting any hydrogen atom of an acyloxy group, an alkylsulfonyl group, an acyl group, or an alkoxycarbonyl group with a single bond.

In a case where $R^1$ to $R^{13}$ are each a substituent containing an alcoholic hydroxyl group, the number of carbon atoms contained in the substituent is preferably 2 to 10, more preferably 2 to 6, and particularly preferably 2 to 4.

The substituent containing an alcoholic hydroxyl group as each of $R^1$ to $R^{13}$ may contain two or more alcoholic hydroxyl groups. The number of alcoholic hydroxyl groups contained in the substituent containing an alcoholic hydroxyl group as each of $R^1$ to $R^{13}$ is 1 to 6, preferably 1 to 3, and more preferably 1.

The number of alcoholic hydroxyl groups contained in the compound represented by General Formula (ZI-4) as a sum of those of $R^1$ to $R^{13}$ is 1 to 10, preferably 1 to 6, and more preferably 1 to 3.

In a case where $R^1$ to $R^{13}$ each do not contain any alcoholic hydroxyl group, examples of the substituent as each of $R^1$ to $R^{13}$ include a halogen atom, an alkyl group, a cycloalkyl group, an alkenyl group, a cycloalkenyl group, an alkynyl group, an aryl group, a heterocyclic group, a cyano group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkyl- or arylsulfonylamino group, a mercapto group, an alkylthio group, an arylthio group, a heterocyclic thio group, a sulfamoyl group, a sulfo group, an alkyl- or arylsulfinyl group, an alkyl- or arylsulfonyl group, an acyl group, an aryloxycarbonyl group, an alkoxycarbonyl group, a carbamoyl group, an aryl- or heterocyclic azo group, an imido group, a phosphino group, a phosphinyl group, a phosphinyloxy group, a phosphinylamino group, a phosphono group, a silyl group, a hydrazino group, a ureido group, a boronic acid group [—$B(OH)_2$], a phosphato group [—$OPO(OH)_2$], a sulfato group (—$OSO_3H$), and other known substituents.

In a case where $R^1$ to $R^{13}$ each do not contain any alcoholic hydroxyl group, $R^1$ to $R^{13}$ preferably each represent a hydrogen atom, a halogen atom, an alkyl group, a cycloalkyl group, an alkenyl group, a cycloalkenyl group, an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or arylsulfonylamino group, an alkylthio group, an arylthio group, a sulfamoyl group, an alkyl- or arylsulfonyl group, an aryloxycarbonyl group, an alkoxycarbonyl group, a carbamoyl group, an imido group, a silyl group, or a ureido group.

In a case where $R^1$ to $R^{13}$ each do not contain any alcoholic hydroxyl group, $R^1$ to $R^{13}$ more preferably each represent a hydrogen atom, a halogen atom, an alkyl group, a cycloalkyl group, a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group, or a carbamoyl group.

In a case where $R^1$ to $R^{13}$ each do not contain any alcoholic hydroxyl group, $R^1$ to $R^{13}$ each particularly preferably represent a hydrogen atom, an alkyl group, a cycloalkyl group, a halogen atom, or an alkoxy group.

Any two adjacent to each other of $R^1$ to $R^{13}$ may be bonded to each other to form a ring structure. Examples of the ring structure thus formed include an aromatic or non-aromatic hydrocarbon ring and a heterocycle. These ring structures may further be combined to form a fused ring.

With respect to the compound (ZI-4), it is preferable that at least one of $R^1$, . . . , or $R^{13}$ has a structure containing an alcoholic hydroxyl group, and it is more preferable that at least one of $R^9$, . . . , or $R^{13}$ has a structure containing an alcoholic hydroxyl group.

As described above, Z represents a single bond or a divalent linking group. Examples of the divalent linking group include an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH=CH—, an aminocarbonylamino group, and an aminosulfonylamino group.

The divalent linking group may have a substituent. Examples of the substituent include the same ones as those enumerated above with regard to $R^1$ to $R^3$.

Z is preferably a bond or group exhibiting no electron withdrawing properties, such as a single bond, an alkylene group, an arylene group, an ether group, a thioether group, an amino group, —CH=CH—, an aminocarbonylamino group, and an aminosulfonylamino group, more preferably a single bond, an ether group, or a thioether group, and particularly preferably a single bond.

Hereinafter, General formulae (ZII) and (ZIII) will be described.

In General Formulas (ZII) and (ZIII), $R_{204}$ to $R_{207}$ each independently represent an aryl group, an alkyl group, or a cycloalkyl group. The aryl group, the alkyl group, and the cycloalkyl group may have a substituent.

Preferred examples of the aryl group as each of $R_{204}$ to $R_{207}$ include the same ones as those enumerated above with regard to each of $R_{201}$ to $R_{203}$ in the compound (ZI-1).

Preferred examples of the alkyl group and the cycloalkyl group as each of $R_{204}$ to $R_{207}$ include the linear, branched, or cyclic alkyl groups enumerated above with regard to each of $R_{201}$ to $R_{203}$ in the compound (ZI-2).

Furthermore, $X^-$ in General Formulae (ZII) and (ZIII) has the same definition as $X^-$ in General Formula (ZI).

Other preferred examples of the photoacid generator include a compound represented by the following General Formula (ZIV), (ZV), or (ZVI).

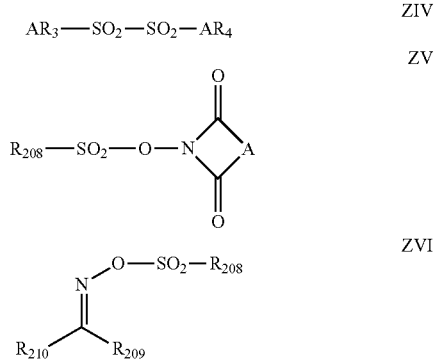

In General Formulae (ZIV) to (ZVI), $Ar_3$ and $Ar_4$ each independently represent a substituted or unsubstituted aryl group.

$R_{208}$'s of General Formulae (ZV) and (ZVI) each independently represent an alkyl group, a cycloalkyl group, or an aryl group. The alkyl group, the cycloalkyl group, and the aryl group may each be substituted or unsubstituted.

These groups are preferably substituted with a fluorine atom. Thus, the strength of the acid generated by the photoacid generator can be enhanced.

$R_{209}$ and $R_{210}$ each independently represent an alkyl group, a cycloalkyl group, an aryl group, or an electron withdrawing group. The alkyl group, the cycloalkyl group, the aryl group, and the electron withdrawing group may each be substituted or unsubstituted.

Preferred examples of $R_{209}$ include a substituted or unsubstituted aryl group.

Preferred examples of $R_{210}$ include an electron withdrawing group. Preferred examples of the electron withdrawing group include a cyano group and a fluoroalkyl group.

A represents an alkylene group, an alkenylene group, or an arylene group. The alkylene group, the alkenylene group, and the arylene group may each have a substituent.

Moreover, a compound having a plurality of structures represented by General Formula (ZVI) is also preferable as a photoacid generator. Examples of such a compound include a compound having a structure in which $R_{209}$ or $R_{210}$ of a compound represented by General Formula (ZVI) is bonded to $R_{209}$ or $R_{210}$ of another compound represented by General Formula (ZVI).

As the photoacid generator, the compounds represented by General Formulae (ZI) to (ZIII) are more preferable, the compound represented by General Formulae (ZI) is still more preferable, and the compounds (ZI-1) to (ZI-3) are particularly preferable.

It is also possible to preferably use a compound having a group that decomposes by the action of an acid to enhance its solubility in an alkaline developer as the acid generator that is used in the present invention. Examples of such an acid generators include the compounds described in JP2005-97254A, JP2007-199692A, or the like.

Specific suitable examples of the photoacid generator include the compounds of B-1 to B-183 described in paragraphs [0665] to [0682] of JP2013-83966A, and the compounds of (Y-1) to (Y-75) described in paragraphs [0683] to [0686] in the same publication, but the present invention is not limited thereto.

Moreover, the photoacid generators may be used singly or in combination of two or more kinds thereof. In the latter case, it is preferable to use a combination of compounds that generate two different organic acids having a total number of all the atoms excluding hydrogen atoms of 2 or more.

In addition, the content of the photoacid generator is preferably 0.1% to 50% by mass, more preferably 0.5% to 40% by mass, and still more preferably 1% to 30% by mass, with respect to the total solid content of the composition of the present invention.

[Compound That Decomposes by Action of Acid to Generate Acid]

The active-light-sensitive or radiation-sensitive composition of the present invention may include one kind or two or more kinds of compound (hereinafter also referred to as an "acid amplifier") that decomposes by the action of an acid to generate an acid. The acid generated by the acid amplifier is preferably a sulfonic acid, a methide acid, or an imidic acid. The content of the acid amplifier is preferably 0.1% to 50% by mass, more preferably 0.5% to 30% by mass, and still more preferably 1.0% to 20% by mass, with respect to the total solid content of the composition.

The amount ratio between the acid amplifier and the acid generator (the solid amount of the acid amplifier with respect to the total solid content in the composition/solid amount of the acid generator with respect to the total solid content of the composition) is not particularly limited, but is preferably 0.01 to 50, more preferably 0.1 to 20, and particularly preferably 0.2 to 1.0.

Examples of the acid amplifier that can be used in the present invention include the compounds described in paragraph [0690] of JP2013-83966A.

[Basic Compound]

The composition of the present invention may further include a basic compound. The basic compound is preferably a compound whose basicity is stronger than that of phenol. Further, this basic compound is preferably an organic basic compound, and more preferably a nitrogen-containing basic compound.

The usable nitrogen-containing basic compound is not particularly limited. However, for example, "(1) a compound represented by General Formula (BS-1)" described in paragraphs [0693] to [0703] of JP2013-83966A, "(2) a compound having a nitrogen-containing heterocyclic structure" described in paragraphs [0704] and [0705] in the same publication, "(3) an amine compound having a phenoxy group" described in paragraphs [0706] to [0709] in the same publication, "(4) an ammonium salt" described in paragraphs [0710] to [0717] in the same publication, "(5) a compound (PA) that has a functional group with proton accepting properties, and decomposes upon irradiation with active light or radiation to reduce or lose the proton accepting properties, or to have its proton accepting properties changed to acidity" described in paragraphs [0718] to [0755] in the same publication, "(6) a guanidine compound" described in paragraphs [0756] to [0768] in the same publication, or "(7) a low-molecular compound which has a nitrogen atom and has a group that leaves by the action of an acid" described in paragraphs [0769] to [0791] in the same publication can be preferably used.

In addition, examples of the basic compound which can be used in the composition of the present invention include the compounds synthesized in Examples of JP2002-363146A and the compounds described in paragraph 0108 of JP2007-298569A.

Furthermore, a photosensitive basic compound may be used as the basic compound. As the photosensitive basic compound, for example, the compounds described in JP2003-524799A, J. Photopolym. Sci & Tech. Vol. 8, P. 543-553 (1995), and the like as can be used.

These basic compounds may be used singly or in combination of two or more kinds thereof.

Furthermore, the molecular weight of the basic compound is usually 100 to 1,500, preferably 150 to 1,300, and more preferably 200 to 1,000.

In a case where the composition of the present invention include a basic compound, the content of the basic compound is preferably 0.01% to 8.0% by mass, more preferably 0.1% to 5.0% by mass, and particularly preferably 0.2% to 4.0% by mass, with respect to the total solid content of the composition.

The molar ratio of the basic compound to the photoacid generator is preferably 0.01 to 10, more preferably 0.05 to 5, and still more preferably 0.1 to 3. Further, the photoacid generator in the molar ratio indicates the total amount of the repeating unit (B) and the photoacid generator in the resin (Ab).

[Surfactant]

The composition of the present invention may further include a surfactant. As the surfactant, a fluorine-based and/or silicon-based surfactant is particularly preferable. Examples of the fluorine-based and/or silicon-based surfactants include MEGAFACE F176 and MEGAFACE R08 manufactured by DIC Corporation; PF656 and PF6320 manufactured by OMNOVA Solution Inc.; TROY SOL S-366 manufactured by Troy Chemical Industries, Inc., FLUORAD FC430 manufactured by Sumitomo 3M Ltd., and Polysiloxane Polymer KP-341 manufactured by Shin-Etsu Chemical Co., Ltd.

Surfactants other than the fluorine-based and/or silicon-based surfactants may also be used. Examples of the surfactants include nonionic surfactants such as polyoxyethylene alkyl ethers and polyoxyethylene alkylaryl ethers.

In addition, known surfactants can be properly used. Examples of the usable surfactant include the surfactants described after 0273 of US2008/0248425A1.

The surfactants may be used singly or in combination of two or more kinds thereof.

In a case where the composition of the present invention further includes a surfactant, the amount of the surfactant to be used is set to preferably 0.0001% to 2% by mass, and more preferably 0.001% to 1% by mass, with respect to the total solid content of the composition.

<Hydrophobic Resin>

The composition of the present invention may contain a hydrophobic resin.

The hydrophobic resin is preferably designed to be unevenly localized on the surface of a resist film, but it does not necessarily have a hydrophilic group in its molecule as different from the surfactant, and does not need to contribute to uniform mixing of polar/nonpolar materials.

Examples of the effect of addition of the hydrophobic resin include control of the static/dynamic contact angle of the resist film surface with respect to water, and suppression of outgassing.

The hydrophobic resin preferably has any one of a "fluorine atom," a "silicon atom," or a "$CH_3$ partial structure which is contained in a side chain moiety of a resin" from the viewpoint of uneven distribution on the film surface layer, and more preferably has two or more kinds.

In a case where hydrophobic resin contains a fluorine atom and/or a silicon atom, the fluorine atom and/or the silicon atom in the hydrophobic resin may be contained in the main chain or the side chain of the resin.

In a case where the hydrophobic resin contains a fluorine atom, the resin is preferably a resin which contains an alkyl group having a fluorine atom, a cycloalkyl group having a fluorine atom, or an aryl group having a fluorine atom, as a partial structure having a fluorine atom.

The alkyl group having a fluorine atom (preferably having 1 to 10 carbon atoms, and more preferably having 1 to 4 carbon atoms) is a linear or branched alkyl group in which at least one hydrogen atom is substituted with a fluorine atom, and may further have a substituent other than a fluorine atom.

The cycloalkyl group having a fluorine atom is a monocyclic or polycyclic cycloalkyl group in which at least one hydrogen atom is substituted with a fluorine atom, and may further have a substituent other than a fluorine atom.

The aryl group having a fluorine atom is an aryl group in which at least one hydrogen atom in an aryl group such as a phenyl group and a naphthyl group is substituted with a fluorine atom, and they may further have a substituent other than a fluorine atom.

Examples of the repeating unit having a fluorine atom or a silicon atom include those exemplified in 0519 of US2012/0251948A1.

Furthermore, it is also preferable that the hydrophobic resin contains a $CH_3$ partial structure in the side chain moiety, as described above.

Here, the $CH_3$ partial structure (hereinafter also simply referred to as a "side chain $CH_3$ partial structure") contained in the side chain moiety in the hydrophobic resin includes a $CH_3$ partial structure contained in an ethyl group, a propyl group, and the like.

On the other hand, a methyl group bonded directly to the main chain of the hydrophobic resin (for example, an α-methyl group in the repeating unit having a methacrylic acid structure) makes only a small contribution of uneven distribution to the surface of the hydrophobic resin due to the effect of the main chain, and it is therefore not included in the CH₃ partial structure in the present invention.

More specifically, in a case where the hydrophobic resin contains a repeating unit derived from a monomer having a polymerizable moiety with a carbon-carbon double bond, such as a repeating unit represented by the following General Formula (M), and in addition, $R_{11}$ to $R_{14}$ are CH₃ "themselves," such CH₃ is not included in the CH₃ partial structure contained in the side chain moiety in the present invention.

On the other hand, a CH₃ partial structure which is present through a certain atom from a C—C main chain corresponds to the CH₃ partial structure in the present invention. For example, in a case where $R_{11}$ is an ethyl group (CH₂CH₃), the hydrophobic resin has "one" CH₃ partial structure in the present invention.

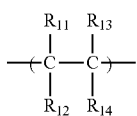

(M)

In General Formula (M), $R_{11}$ to $R_{14}$ each independently represent a side chain moiety.

Examples of $R_{11}$ to $R_{14}$ at the side chain moiety include a hydrogen atom and a monovalent organic group.

Examples of the monovalent organic group for each of $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, and an arylaminocarbonyl group, each of which may further have a substituent.

The hydrophobic resin is preferably a resin including a repeating unit having the CH₃ partial structure in the side chain moiety thereof. It is more preferable that the hydrophobic resin has, as such a repeating unit, at least one repeating unit (x) of a repeating unit represented by the following General Formula (II) or a repeating unit represented by the following General Formula (III).

Hereinafter, the repeating unit represented by General Formula (II) will be described in detail.

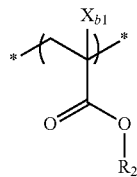

(II)

In General Formula (II), $X_{b1}$ represents a hydrogen atom, an alkyl group, a cyano group, or a halogen atom, and $R_2$ represents an organic group which has one or more CH₃ partial structures and is stable against an acid. Here, more specifically, the organic group which is stable against an acid is preferably an organic group which does not have an "acid-decomposable group" described with respect to the resin (A).

The alkyl group of $X_{b1}$ is preferably an alkyl group having 1 to 4 carbon atoms, and examples thereof include a methyl group, an ethyl group, a propyl group, a hydroxymethyl group, and a trifluoromethyl group, with the methyl group being preferable.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group, each of which has one or more CH₃ partial structures. Each of the cycloalkyl group, the alkenyl group, the cycloalkenyl group, the aryl group and the aralkyl group may further have an alkyl group as a substituent.

$R_2$ is preferably an alkyl group or an alkyl-substituted cycloalkyl group, each of which has one or more CH₃ partial structures.

The number of the CH₃ partial structures contained in the organic group which has one or more CH₃ partial structures and is stable against an acid as $R_2$ is preferably 2 to 10, and more preferably 2 to 8.

Specific preferred examples of the repeating unit represented by General Formula (II) are shown below, but the present invention is not limited thereto.

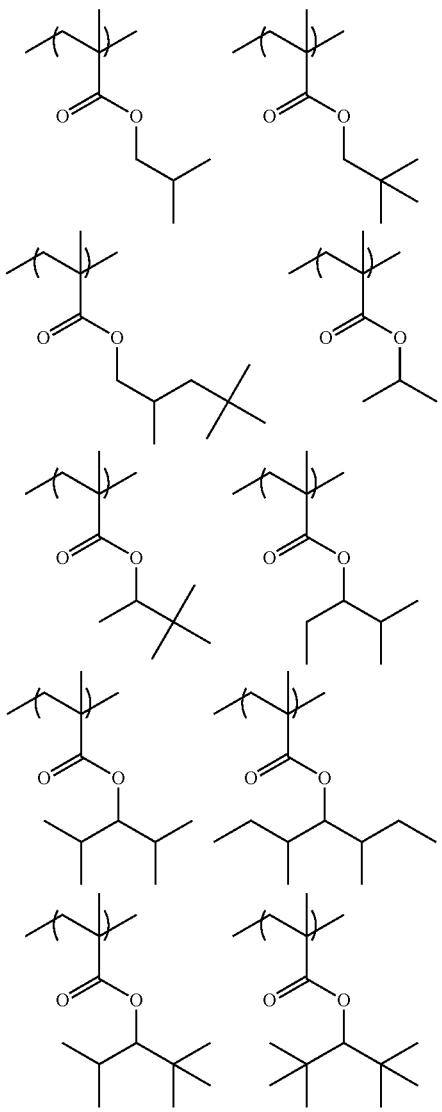

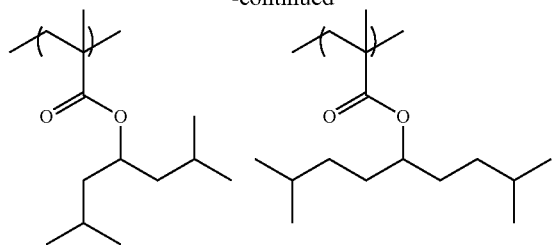
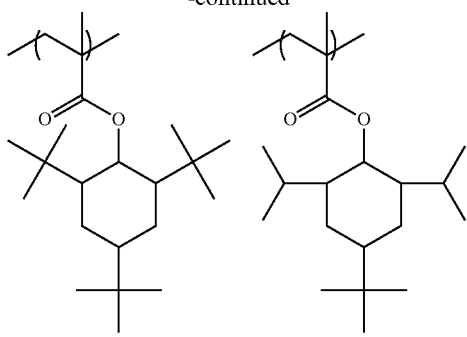
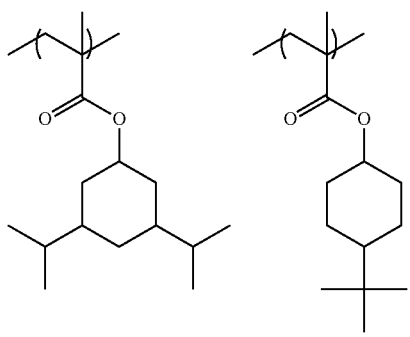
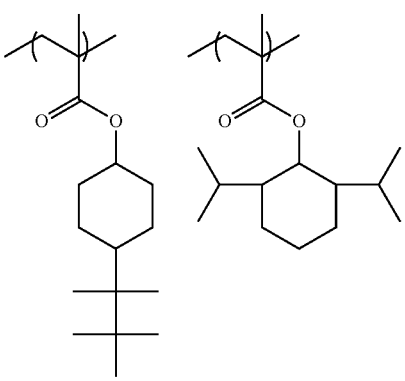
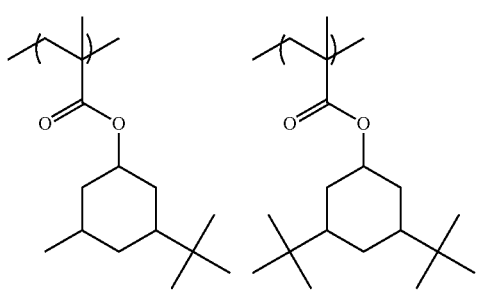
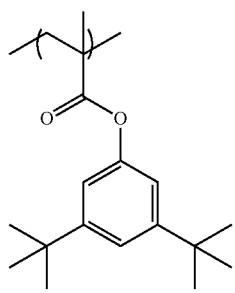
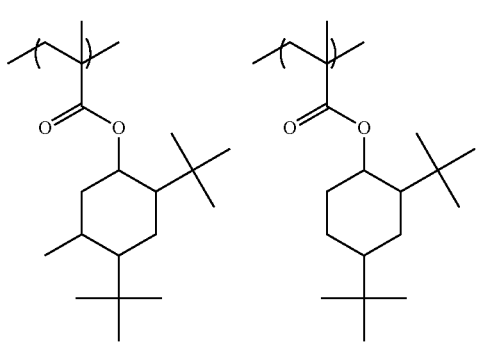
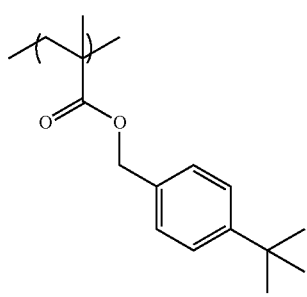
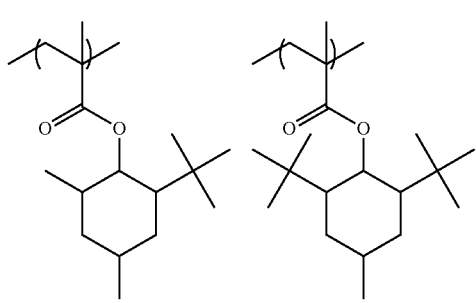
The repeating unit represented by General Formula (II) is preferably a repeating unit which is stable against an acid (acid-indecomposable), and specifically, it is preferably a repeating unit not having a group that decomposes by the action of an acid to generate a polar group.

Hereinafter, the repeating unit represented by General Formula (III) will be described in detail.

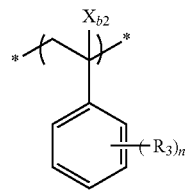
(III)

In General Formula (III), $X_{b2}$ represents a hydrogen atom, an alkyl group, a cyano group, or a halogen atom, $R_3$ represents an organic group which has one or more $CH_3$ partial structures and is stable against an acid, and n represents an integer of 1 to 5.

The alkyl group of $X_{b2}$ is preferably an alkyl group having 1 to 4 carbon atoms, and examples thereof include a methyl group, an ethyl group, a propyl group, a hydroxymethyl group, and a trifluoromethyl group, but a hydrogen atom is preferable.

$X_{b2}$ is preferably a hydrogen atom.

Since $R_3$ is an organic group that is stable against an acid, and more specifically, $R_3$ is preferably an organic group which does not have the "acid-decomposable group" described with respect to the resin (A).

Examples of $R_3$ include an alkyl group having one or more $CH_3$ partial structures.

The number of the $CH_3$ partial structures contained in the organic group which has one or more $CH_3$ partial structures and is stable against an acid as $R_3$ is preferably 1 to 10, more preferably 1 to 8, and still more preferably 1 to 4.

n represents an integer of 1 to 5, more preferably 1 to 3, and still more preferably 1 or 2.

Specific preferred examples of the repeating unit represented by General Formula (III) are shown below, but the present invention is not limited thereto.

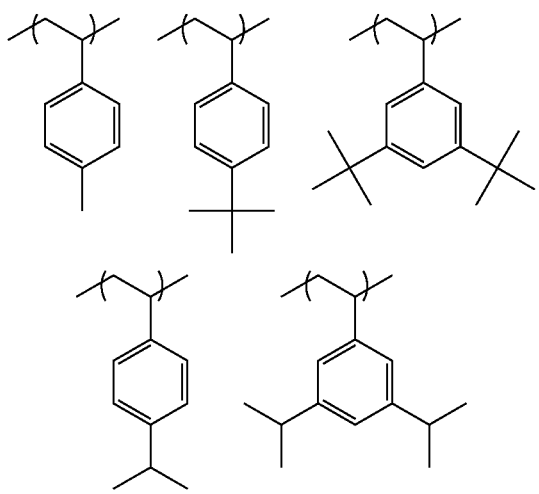

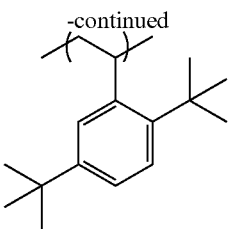

The repeating unit represented by General Formula (III) is preferably a repeating unit which is stable against an acid (acid-indecomposable), and specifically, it is a repeating unit which does not have a group that decomposes by the action of an acid to generate a polar group.

In a case where the hydrophobic resin contains a $CH_3$ partial structure in the side chain moiety thereof, and in particular, it does not have any one of a fluorine atom and a silicon atom, the content of at least one repeating unit (x) of the repeating unit represented by General Formula (II) or the repeating unit represented by General Formula (III) is preferably 90% by mole or more, and more preferably 95% by mole or more, with respect to all the repeating units of the hydrophobic resin. The content is usually 100% by mole or less with respect to all the repeating units of the hydrophobic resin.

By incorporating at least one repeating unit (x) of the repeating unit represented by General Formula (II) or the repeating unit represented by General Formula (III) in a proportion of 90% by mole or more with respect to all the repeating units of the hydrophobic resin into the hydrophobic resin, the surface free energy of the hydrophobic resin is increased. As a result, it becomes easy for the hydrophobic resin to be unevenly distributed on the surface of the resist film.

In addition, in a case where the hydrophobic resin contains (i) a fluorine atom and/or a silicon atom, or (ii) a $CH_3$ partial structure in the side chain moiety, the hydrophobic resin may have at least one group selected from the following groups (x) to (z):

(x) an acid group,
(y) a group having a lactone structure, an acid anhydride group, or an acid imido group, and
(z) a group that decomposes by the action of an acid.

Examples of the acid group (x) include a phenolic hydroxyl group, a carboxylic acid group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group. Preferred examples of the acid group include a fluorinated alcohol group (preferably hexafluoroisopropanol), a sulfonimido group, and a bis(alkylcarbonyl)methylene group.

Examples of the repeating unit having an acid group (x) include a repeating unit in which the acid group is directly bonded to the main chain of the resin, such as a repeating unit with an acrylic acid or a methacrylic acid, and a repeating unit in which the acid group is bonded to the main chain of the resin through a linking group, and the acid group may also be introduced into the polymer chain terminal by using a polymerization initiator or chain transfer agent containing an acid group during the polymerization. All of these cases are preferable. The repeating unit having an acid group (x) may have at least one of a fluorine atom or a silicon atom.

The content of the repeating units having an acid group (x) is preferably 1% to 50% by mole, more preferably 3% to 35% by mole, and still more preferably 5% to 20% by mole, with respect to all the repeating units in the hydrophobic resin.

Specific examples of the repeating unit having an acid group (x) are shown below, but the present invention is not limited thereto. In the formulae, Rx represents a hydrogen atom, $CH_3$, $CF_3$, or $CH_2OH$.

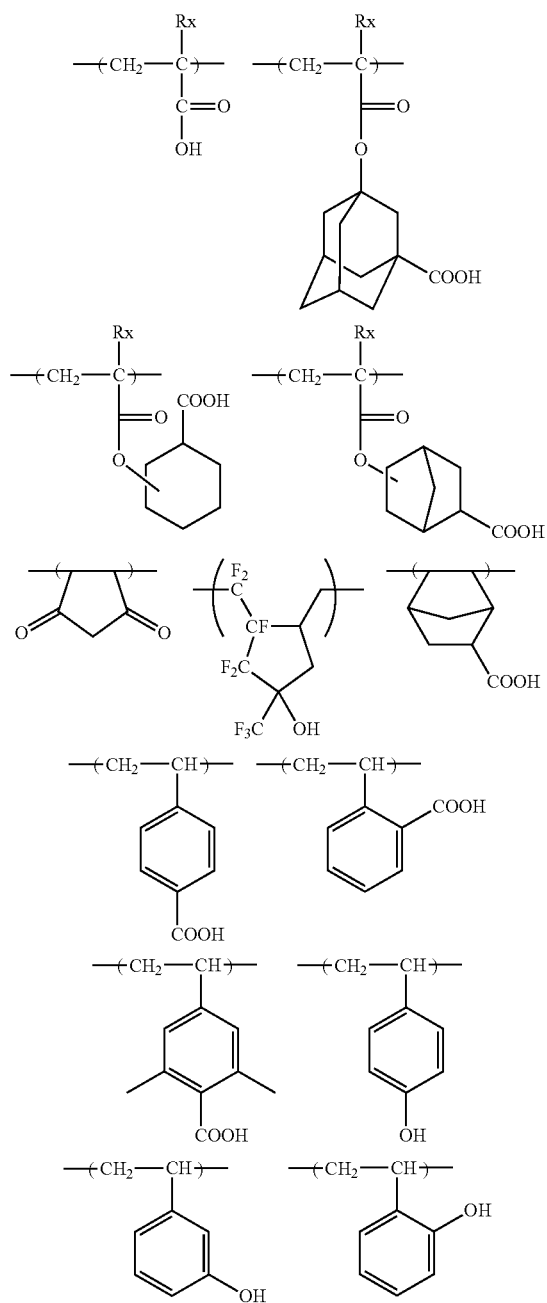
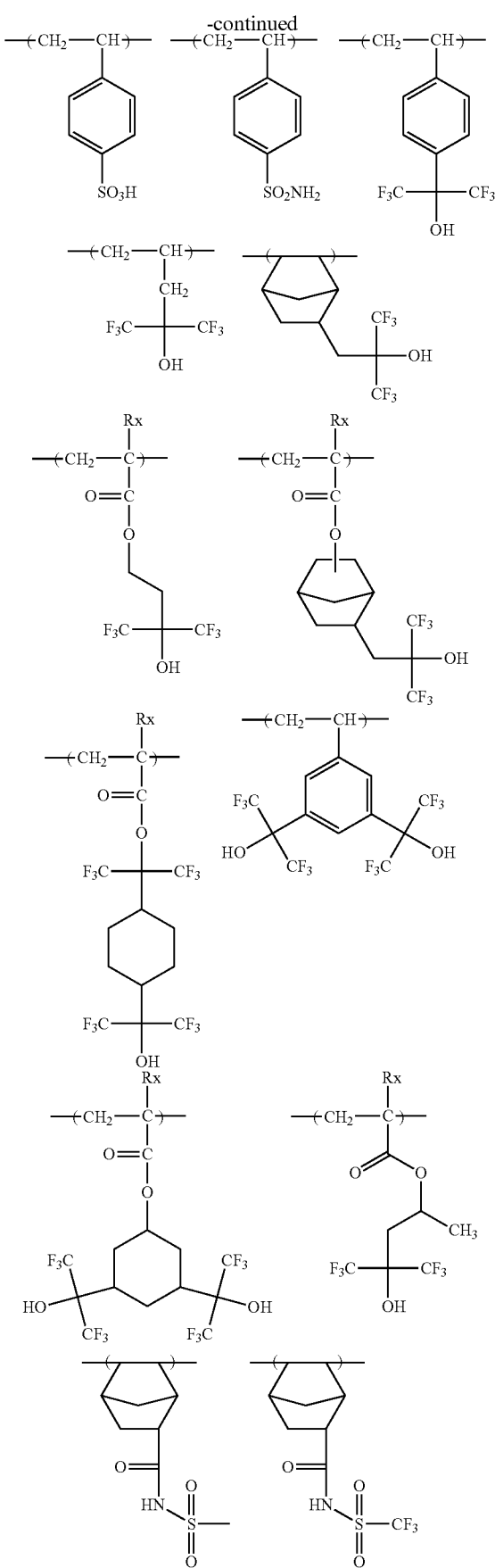

-continued

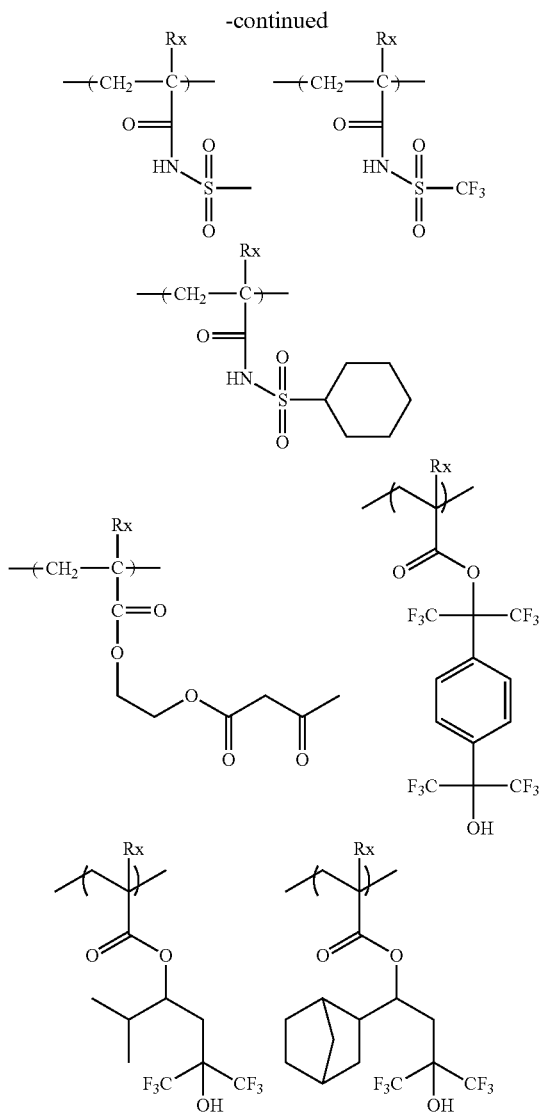

As the group having a lactone structure, the acid anhydride group, or the acid imido group (y), a group having a lactone structure is particularly preferable.

The repeating unit containing such a group is, for example, a repeating unit in which the group is directly bonded to the main chain of the resin, such as a repeating unit with an acrylic ester or a methacrylic ester. This repeating unit may be a repeating unit in which the group is bonded to the main chain of the resin through a linking group. Alternatively, this repeating unit may be introduced into the terminal of the resin by using a polymerization initiator or chain transfer agent containing the group during the polymerization.

Examples of the repeating unit containing a group having a lactone structure include the same ones as the repeating unit having a lactone structure as described earlier in the section of the resin (A).

The content of the repeating units having a group having a lactone structure, an acid anhydride group, or an acid imido group is preferably 1% to 100% by mole, more preferably 3% to 98% by mole, and still more preferably 5% to 95% by mole, with respect to all the repeating units in the hydrophobic resin.

With respect to the hydrophobic resin, examples of the repeating unit having a group (z) that decomposes by the action of an acid include the same ones as the repeating units having an acid-decomposable group, exemplified as the resin (A). The repeating unit having a group (z) that decomposes by the action of an acid may have at least one of a fluorine atom or a silicon atom. With respect to the hydrophobic resin, the content of the repeating units having a group (z) that decomposes by the action of an acid is preferably 1% to 80% by mole, more preferably 10% to 80% by mole, and still more preferably 20% to 60% by mole, with respect to all the repeating units in the hydrophobic resin.

In a case where the hydrophobic resin has a fluorine atom, the content of the fluorine atom is preferably 5% to 80% by mass, and more preferably 10% to 80% by mass, with respect to the weight-average molecular weight of the hydrophobic resin. Further, the content of the repeating units including the fluorine atom is preferably 10% to 100% by mole, and more preferably 30% to 100% by mole, with respect to all the repeating units included in the hydrophobic resin.

In a case where the hydrophobic resin has a silicon atom, the content of the silicon atom is preferably 2% to 50% by mass, and more preferably 2% to 30% by mass, with respect to the weight-average molecular weight of the hydrophobic resin. Further, the content of the repeating units including the silicon atom is preferably 10% to 100% by mole, and more preferably 20% to 100% by mole, with respect to all the repeating units included in the hydrophobic resin.

On the other hand, in particular, in a case where the hydrophobic resin includes a $CH_3$ partial structure in the side chain moiety thereof, an embodiment where the hydrophobic resin substantially does not have any one of a fluorine atom and a silicon atom is also preferable. In this case, specifically the content of the repeating units containing a fluorine atom or a silicon atom is preferably 5% by mole or less, more preferably 3% by mole or less, still more preferably 1% by mole or less, and ideally 0% by mole, that is, containing neither a fluorine atom nor a silicon atom, with respect to all the repeating units in the hydrophobic resin. In addition, it is preferable that the hydrophobic resin is composed substantially of only a repeating unit constituted with only an atom selected from the group consisting of a carbon atom, an oxygen atom, a hydrogen atom, a nitrogen atom, and a sulfur atom. More specifically, the proportion of the repeating unit constituted with only an atom selected from the group consisting of a carbon atom, an oxygen atom, a hydrogen atom, a nitrogen atom, and a sulfur atom is preferably 95% by mole or more, more preferably 97% by mole or more, still more preferably 99% by mole or more, and ideally 100% by mole, with respect to all the repeating units in the hydrophobic resin.

The weight-average molecular weight of the hydrophobic resin in terms of standard polystyrene is preferably 1,000 to 100,000, more preferably 1,000 to 50,000, and still more preferably 2,000 to 15,000.

Furthermore, the hydrophobic resins may be used singly or in combination of plural kinds thereof.

The content of the hydrophobic resins in the composition is preferably 0.01% to 10% by mass, more preferably 0.05% to 8% by mass, and still more preferably 0.1% to 7% by mass, with respect to the total solid content of the composition of the present invention.

In the hydrophobic resin, it is certain that the content of impurities such as metal is small, but the content of residual monomers or oligomer components is also preferably 0.01% to 5% by mass, more preferably 0.01% to 3% by mass, and still more preferably 0.05% to 1% by mass. Within these ranges, a composition free from in-liquid extraneous materials and a change in sensitivity or the like with aging can be obtained. Further, from the viewpoints of a resolution, a resist profile, the side wall of a resist pattern, a roughness, and the like, the molecular weight distribution (Mw/Mn, also referred to as a dispersity) is preferably in the range of 1 to 5, more preferably in the range of 1 to 3, and still more preferably in the range of 1 to 2.

As the hydrophobic resin, various commercial products may be used, or the hydrophobic resin may be synthesized by an ordinary method (for example, radical polymerization). Examples of the general synthesis method include a batch polymerization method of dissolving monomer species and an initiator in a solvent and heating the solution, thereby performing the polymerization, and a dropping polymerization method of adding dropwise to a solution containing monomer species and an initiator to a heated solvent for 1 to 10 hours, with the dropping polymerization method being preferable.

The reaction solvent, the polymerization initiator, the reaction conditions (a temperature, a concentration, and the like) and the method for purification after reaction are the same as ones described for the resin (A), but in the synthesis of the hydrophobic resin, the concentration of the reactant is preferably 30% to 50% by mass.

[Dye]

The composition of the present invention may further include a dye. Suitable examples of the dye include an oily dye and a basic dye. Specific examples thereof include the dyes described in paragraph [0803] of JP2013-83966A.

[Photobase Generator]

The composition of the present invention may further include a photobase generator. By incorporation of the photobase generator, it is possible to form a better pattern. Examples of the photobase generator include compounds described in JP1992-151156A (JP-H04-151156A), JP1992-162040A (JP-H04-162040A), JP1993-197148A (JP-H05-197148A), JP1993-5995A (JP-H05-5995A), JP1994-194834A (JP-H06-194834A), JP1996-146608A (JP-H08-146608A), JP1998-83079A (JP-H10-83079A), and EP622682B. Preferred examples of the photobase generator include the photobase generators described in paragraph [0804] of JP2013-83966A.

[Antioxidant]

The composition of the present invention may further include an antioxidant. By incorporation of the antioxidant, it is possible to suppress oxidation of an organic material in the presence of oxygen.

As the antioxidant, for example, the antioxidant described in paragraphs [0808] to [0812] of JP2013-83966A can be suitably used, and can be added in the amount described in paragraph [0813] in the same document.

[Solvent]

The composition of the present invention may further include a solvent. As this solvent, an organic solvent is typically used. Examples of this organic solvent include alkylene glycol monoalkyl ether carboxylate, alkylene glycol monoalkyl ether, alkyl lactate ester, alkyl alkoxypropionate, a cyclic lactone (preferably having 4 to 10 carbon atoms), a monoketone compound (preferably having 4 to 10 carbon atoms) which may contain a ring, alkylene carbonate, alkyl alkoxyacetate, and alkyl pyruvate.

Preferred examples of the alkylene glycol monoalkyl ether carboxylate include propylene glycol monomethyl ether acetate (PGMEA; also known as 1-methoxy-2-acetoxypropane), propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether (PGME; also known as 1-methoxy-2-propanol), propylene glycol monoethyl ether, propylene glycol monopropyl ether, propylene glycol monobutyl ether, ethylene glycol monomethyl ether, and ethylene glycol monoethyl ether.

Examples of the alkyl lactate include methyl lactate, ethyl lactate, propyl lactate, methyl 2-hydroxyisobutyrate, and butyl lactate.

Examples of the alkyl alkoxypropionate include ethyl 3-ethoxypropionate, methyl 3-methoxypropionate, methyl 3-ethoxypropionate, and ethyl 3-methoxypropionate.

Examples of the cyclic lactone include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Examples of the monoketone compound which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

As the solvent, a solvent having a boiling point of 130° C. or higher under the conditions of normal temperature and normal pressure is preferably used. Specific examples thereof include cyclopentanone, γ-butyrolactone, cyclohexanone, ethyl lactate, ethylene glycol monoethyl ether acetate, PGMEA, ethyl 3-ethoxypropionate, ethyl pyruvate, 2-ethoxyethyl acetate, 2-(2-ethoxyethoxy)ethyl acetate, and propylene carbonate.

These solvents may be used singly or in combination of two or more kinds thereof. In the latter case, it is preferable to use a mixed solvent obtained by mixing a solvent containing a hydroxyl group with a solvent not containing a hydroxyl group.

Examples of the solvent containing a hydroxyl group include ethylene glycol, ethylene glycol monomethyl ether, ethylene glycol monoethyl ether, propylene glycol, PGME, propylene glycol monoethyl ether, methyl 2-hydroxyisobutyrate, and ethyl lactate. Among these, PGME, methyl 2-hydroxyisobutyrate, and ethyl lactate are particularly preferable.

Examples of the solvent not containing a hydroxyl group include PGMEA, ethyl ethoxypropionate, 2-heptanone, γ-butyrolactone, cyclohexanone, butyl acetate, N-methylpyrrolidone, N,N-dimethylacetamide, and dimethyl sulfoxide, and in particular, propylene glycol monomethyl ether acetate, ethyl ethoxypropionate, 2-heptanone, γ-butyrolactone, cyclohexanone, and butyl acetate. Among these, PGMEA, ethyl ethoxypropionate, and 2-heptanone are particularly preferable.

In a case of using a mixed solvent of a solvent containing a hydroxyl group and a solvent not containing a hydroxyl group, the mass ratio of the solvent containing a hydroxyl group to the solvent not containing a hydroxyl group is preferably 1/99 to 99/1, more preferably 10/90 to 90/10 and still more preferably 20/80 to 60/40.

Furthermore, if a mixed solvent including 50% by mass or more of a solvent not containing a hydroxyl group is used, in particular, excellent uniform applicability can be accomplished. Further, the solvent is particularly preferably a mixed solvent of PGMEA and one or more other kinds of solvents.

The content of the solvent in the composition of the present invention can be appropriately adjusted in accordance with a desired film thickness, or the like, but the solvent is adjusted such that the concentration of the total solid content of the composition is generally 0.5% to 30% by mass, preferably 1.0% to 20% by mass, and more preferably 1.5% to 10% by mass.

[Active-Light-Sensitive or Radiation-Sensitive Film]

The present invention relates to an active-light-sensitive or radiation-sensitive film which is formed using the above-mentioned composition of the present invention. Hereinafter, the "active-light-sensitive or radiation-sensitive film" is also referred to as a "resist film".

[Pattern Forming Method]

The pattern forming method of the present invention includes at least:

(i) a step of forming an active-light-sensitive or radiation-sensitive film (resist film) using the above-mentioned composition of the present invention, (ii) a step of exposing the resist film, and (iii) a step of developing the exposed resist film using a developer to form a pattern.

The developer in the step (iii) may be a developer including an organic solvent or an alkaline developer. In a case where development is performed using a developer including an organic solvent, a negative tone pattern is formed, and in a case where development is performed using an alkaline developer, a positive tone pattern is formed.

Furthermore, the exposure in the step (ii) may be a liquid immersion exposure.

The pattern forming method of the present invention preferably has a heating step (iv) after the exposure step (ii).

In a case where the developer in the step (iii) is a developer including an organic solvent, the pattern forming method of the present invention may further have (v) a step of performing development using an alkaline developer. On the other hand, in a case where the developer in the step (iii) is an alkaline developer, the pattern forming method may further have (v) a step of performing development using a developer including an organic solvent.

In the present invention, a portion having weak exposure intensity is removed by an organic solvent developing step, and a portion having strong exposure intensity is also removed by further performing the alkaline developing step. Since pattern formation is performed without dissolving only a region having intermediate exposure intensity by the multiple development process performing development multiple times in this manner, a finer pattern than usual can be formed (the same mechanism as that in paragraph [0077] of JP2008-292975A).

In the pattern forming method of the present invention, the order of the alkaline developing step and the organic solvent developing step is not particularly limited, but it is more preferable that the alkaline developing step is performed before the organic solvent developing step.

The resist film is formed of the composition of the present invention as described above, and more specifically, is preferably formed on a substrate. In the pattern forming method of the present invention, a step of forming a film formed of the active-light-sensitive or radiation-sensitive resin composition on a substrate, a step of exposing the film, and a step of developing can be performed by a generally known method.

The composition is coated onto, for example, a substrate (e.g.: a silicon/silicon dioxide coating, and a quartz substrate deposited with silicon nitride or chromium) which is used in manufacture of precision integrated circuit elements or a mold for imprint, using a spinner, a coater, or the like. Thereafter, by drying the resultant product, an active-light-sensitive or radiation-sensitive film can be formed.

Before forming the resist film, an antireflection film may be applied on the substrate in advance.

As the antireflection film, any of an inorganic film type such as titanium, titanium dioxide, titanium nitride, chromium oxide, carbon, and amorphous silicon, or an organic film type formed of a light absorber and a polymer material can be used. In addition, as the organic antireflection film, a commercially available organic antireflection film such as DUV-30 series or DUV-40 series manufactured by Brewer Science, Inc., or AR-2, AR-3, AR-5, or the like manufactured by Shipley Company, L.L.C. can also be used.

After film formation and before the exposing step, a preheating step (PB; Prebake) is also preferably included. In addition, after the exposing step and before the developing step, a post exposure heating step (PEB; Post Exposure Bake) is also preferably included.

Both PB and PEB are carried out at a heating temperature of preferably 70° C. to 120° C., and more preferably 80° C. to 110° C.

The heating time is preferably 30 to 300 seconds, more preferably 30 to 180 seconds, and still more preferably 30 to 90 seconds.

Heating may be carried out using a means installed in an ordinary exposure or development machine, or may also be carried out using a hot plate or the like.

Baking accelerates the reaction in the exposed areas, and thus, the sensitivity and the pattern profile are enhanced.

Furthermore, it is preferable that a heating step (Post Bake) is included after the rinsing step. The developer and the rinsing liquid, remaining between and inside the patterns, are removed by the baking.

A top coat may be provided on the upper layer of the resist film. The functions required for the top coat are coating suitability on the upper layer part of a resist film, and solubility in a developer. It is preferable that the top coat is not mixed with the resist film and can be uniformly coated onto the upper layer of a resist film.

The top coat is not particularly limited, and top coats known in the related art can be formed according to the methods known in the related art, and can be formed, for example, according to the description in paragraphs [0072] to [0082] of JP2014-059543A.

Moreover, the above-mentioned hydrophobic resin can be suitably used in applications for forming a top coat.

In a case where a developer containing an organic solvent is used in the developing step which will be described later, it is preferable that a top coat containing the basic compound described in JP2013-61648A is formed on a resist film.

Examples of the active light or radiation include infrared light, visible light, ultraviolet light, far-ultraviolet light, X-rays, and electron beams. As the active light or radiation, for example, those having a wavelength of 250 n or less, and in particular, 220 nm or less are more preferable. Examples of such the active light or radiation include a KrF excimer laser (248 nm), an ArF excimer laser (193 nm), an $F_2$ excimer laser (157 nm), X-rays, and electron beams. Preferred examples of the active light or radiation include a KrF excimer laser, ArF excimer laser, electron beams, X-rays, and EUV light. More preferred examples of the active light or radiation include electron beams, X-rays, and EUV light.

The substrate on which the film is formed in the present invention is not particularly limited, and a substrate generally used in a process for manufacturing a semiconductor such as an IC, in a process for manufacturing a circuit board for a liquid crystal, a thermal head or the like, and in other lithographic processes of photofabrication can be used. Examples of the substrate include an inorganic substrate such as silicon, SiN, and $SiO_2$; and a coating type inorganic substrate such as Spin On Glass (SOG). Further, if desired, an organic antireflection film may be formed between the film and the substrate.

In a case where the pattern forming method of the present invention has a step of performing development using an alkaline developer, as the alkaline developer, an alkaline aqueous solution can be used, for example, inorganic alkalis such as Sodium hydroxide, potassium hydroxide, sodium carbonate, sodium silicate, sodium metasilicate, and aqueous ammonium; primary amines such as ethyl amine and n-propyl amine; secondary amines such as diethyl amine and di-n-butyl amine; tertiary amines such as triethyl amine and methyl diethyl amine; alcohol amines such as dimethyl ethanol amine and triethanol amine; tetraalkyl ammonium hydroxides such as tetramethyl ammonium hydroxide, tetraethyl ammonium hydroxide, tetrapropyl ammonium hydroxide, tetrabutyl ammonium hydroxide, tetrapentyl ammonium hydroxide, tetrahexyl ammonium hydroxide, tetraoctyl ammonium hydroxide, ethyl trimethyl ammonium hydroxide, butyl trimethyl ammonium hydroxide, methyl triamyl ammonium hydroxide, and dibutyl dipentyl ammonium hydroxide; quaternary ammonium salts such as trimethyl phenyl ammonium hydroxide, trimethyl benzyl ammonium hydroxide, and triethyl benzyl ammonium hydroxide; or cyclic amines such as pyrrole and piperidine.

Moreover, the alkaline aqueous solution to which an appropriate amount of alcohols or surfactants has been added can also be used.

Typically, the alkali concentration in the alkaline developer is 0.1% to 20% by mass.

Typically, pH of the alkaline developer is 10.0 to 15.0.

In particular, an aqueous solution of tetramethyl ammonium hydroxide of 2.38% by mass is desired.

As a rinsing liquid in a rinsing treatment performed after the alkaline development, pure water is used, and the rinsing liquid to which an appropriate amount of a surfactant has been added can also be used.

Furthermore, after the developing treatment or the rinsing treatment, a treatment of removing a developer or a rinsing liquid adhered on a pattern by using supercritical fluid can be performed.

In a case where the pattern forming method of the present invention has a step of performing development using a developer including an organic solvent, as the developer including an organic solvent (hereinafter also referred to as an organic developer), a polar solvent such as a ketone-based solvent, an ester-based solvent, an alcohol-based solvent, an amide-based solvent, and an ether-based solvent, or a hydrocarbon-based solvent can be used.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutylacetate, 3-methyl-3-methoxybutylacetate, butyl butanoate, methyl formate, ethyl formate, butyl formate, propyl formate, ethyl lactate, butyl lactate, propyl lactate, and methyl 2-hydroxyisobutyrate.

Examples of the alcohol-based solvent include alcohols such as methyl alcohol, ethyl alcohol, n-propyl alcohol, isopropyl alcohol, n-butyl alcohol, sec-butyl alcohol, 4-methyl-2-pentanol, tert-butyl alcohol, isobutyl alcohol, n-hexyl alcohol, n-heptyl alcohol, n-octyl alcohol, and n-decanol; glycol-based solvents such as ethylene glycol, diethylene glycol, and triethylene glycol; and glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxymethylbutanol.

Examples of the ether-based solvent include anisole, dioxane, and tetrahydrofuran, in addition to the glycol ether-based solvents.

Examples of the amide-based solvent include N-methyl-2-pyrrolidone, N,N-dimethylacetamide, N,N-dimethylformamide, hexamethylphosphoric triamide, and 1,3-dimethyl-2-imidazolidinone.

Examples of the hydrocarbon-based solvent include aromatic hydrocarbon-based solvents such as toluene, xylene, and anisole, and aliphatic hydrocarbon-based solvents such as pentane, hexane, octane, and decane.

The above solvents may be used by mixing a plurality of the solvents or may be used by mixing the solvents with other solvents or water. Here, in order to sufficiently exhibit the effects of the present invention, the moisture content in the whole volume of the developer is preferably less than 10% by mass, but a developer having substantially no moisture is more preferable.

That is, the amount of the organic solvent to be used relative to the developer is preferably from 90% by mass to 100% by mass, and more preferably from 95% by mass to 100% by mass, with respect to the total amount of the developer.

In particular, the organic developer is preferably a developer containing at least one kind of organic solvent selected from the group consisting of a ketone-based solvent, an ester-based solvent, an alcohol-based solvent, an amide-based solvent, and an ether-based solvent.

The vapor pressure of the organic developer is preferably 5 kPa or less, more preferably 3 kPa or less, and particularly preferably 2 kPa or less at 20° C. By setting the vapor pressure of the organic developer to 5 kPa or less, evaporation of the developer on the substrate or in a development cup is suppressed, the temperature evenness in the wafer surface is improved, and as a result, the dimensional evenness in the wafer surface is improved.

Specific examples of the organic developer having a vapor pressure of 5 kPa or less (2 kPa or less) include the solvents described in paragraph [0165] of JP2014-71304A.

The organic developer may include a basic compound. Specific examples and preferred examples of the basic compound that can be included in the developer used in the present invention are the same ones as for the basic compound included in the active-light-sensitive or radiation-sensitive resin composition as described above.

An appropriate amount of a surfactant can be added to the organic developer, if necessary. The surfactant is not particularly limited, and, for example, ionic or non-ionic fluorine-based and/or silicon-based surfactants, or the like can be used. Examples of the fluorine-based and/or the silicon-based surfactant include the surfactants described in the documents cited in paragraph [0166] of JP2014-71304A.

In addition, the amount of the surfactant to be used is preferably 0% to 2% by mass, more preferably 0.0001% to 2% by mass, and particularly preferably 0.0005% to 1% by mass, with respect to the total amount of the developer.

Examples of the developing method include a method in which a substrate is immersed in a tank filled with a developer for a certain period of time (a dipping method), a method in which a developer is heaped up to the surface of a substrate by surface tension and developed by stopping for a certain period of time (a paddle method), a method in which a developer is sprayed on the surface of a substrate (a spray method), and a method in which a developer is continuously discharged on a substrate rotated at a constant rate while scanning a developer discharging nozzle at a constant rate (a dynamic dispense method).

In a case where the various developing methods include a step of discharging a developer toward a resist film from a development nozzle of a developing device, the discharge pressure of the developer discharged (the flow velocity per unit area of the developer discharged) is preferably 2 mL/sec/mm$^2$ or less, and more preferably 1.5 mL/sec/mm$^2$ or less. The flow velocity has no particular lower limit, but is preferably 0.2 mL/sec/mm$^2$ or more. Moreover, the discharge pressure (mL/sec/mm$^2$) of a developer is a value at the developing nozzle exit in the developing device.

Examples of the method for adjusting the discharge pressure of the developer include a method of adjusting the discharge pressure by a pump or the like, and a method of supplying a developer from a pressurized tank and adjusting the pressure to change the discharge pressure.

In addition, after a step of performing development using a developer including an organic solvent, a step of stopping the development while replacing the solvent with another solvent may be performed.

The pattern formation method may include a rinsing step using a rinsing liquid after the step of performing the development using the developer including an organic solvent. The rinsing liquid is not particularly limited as long as it does not dissolve the resist pattern, and a solution including a general organic solvent can be used. As the rinsing liquid, a rinsing liquid containing at least one kind of organic solvent selected from a hydrocarbon-based solvent (preferably decane), a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same solvents as those described above with regard to the developer including an organic solvent.

As the solvent, at least one kind of organic solvent selected from the group consisting of a ketone-based solvent, an ester-based solvent, an alcohol-based solvent, and an amide-based solvent is preferable, an alcohol-based solvent or an ester-based solvent is more preferable, a monohydric alcohol is still more preferable, and a monohydric alcohol having 5 or more carbon atoms is particularly preferable.

Examples of the monohydric alcohol that is used in the rinsing step include linear, branched, or cyclic monohydric alcohols, and specifically, 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, or the like can be used. Particular preferred examples of the monohydric alcohol having 5 or more carbon atoms include 1-hexanol, 2-hexanol, 4-methyl-2-pentanol, 1-pentanol, and 3-methyl-1-butanol.

The respective components may be used in combination of plural kinds types thereof, and may be used in combination with an organic solvent other than the components described above.

The moisture content in the rinsing liquid is preferably 10% by mass or less, more preferably 5% by mass or less, and particularly preferably 3% by mass or less.

The vapor pressure of the rinsing liquid is preferably 0.05 kPa to 5 kPa, more preferably 0.1 kPa to 5 kPa, and still more preferably 0.12 kPa to 3 kPa, at 20° C.

A rinsing liquid to which an appropriate amount of a surfactant has been added can also be used.

In the rinsing step, the wafer that has been subjected to development using a developer including an organic solvent is subjected to a rinsing treatment using a rinsing liquid including the organic solvent as described above. The method for rinsing treatment is not particularly limited, and, for example, a method in which a rinsing liquid is discharged continuously onto a substrate while the substrate is rotated at a constant rate (a spin coating method), a method in which a substrate is dipped in a bath filled with a rinsing liquid for a predetermined period of time (a dipping method), a method in which a rinsing liquid is sprayed onto a substrate surface (a spray method), or the like can be applied. Among these, it is preferable that after a rinsing treatment is performed by the spin coating method, and then, a rinsing liquid is removed from the substrate by rotating the substrate at a rotation speed of 2,000 rpm to 4,000 rpm after rinsing. Further, it is also preferable that the method includes a heating step (Post Bake) after the rinsing step. The developer and the rinsing liquid, remaining between and inside the patterns are removed by baking. The heating step after the rinsing step is carried out at typically 40° C. to 160° C., and preferably at 70° C. to 95° C., and typically for 10 seconds to 3 minutes, and preferably for 30 seconds to 90 seconds.

Moreover, a mold for imprint may be manufactured by using the composition of the present invention, and with regard to the details thereof, reference can be made to, for example, JP4109085B and JP2008-162101A.

The pattern forming method of the present invention can also be used for guide pattern formation (see, for example, ACS Nano Vol. 4, No. 8, Pages 4815-4823) in Directed Self-Assembly (DSA).

In addition, the resist pattern formed according to the method can be used as a core material (core) of a spacer-process disclosed in, for example, JP1991-270227A (JP-H03-270227A) and JP2013-164509A.

[Method for Manufacturing Electronic Device, and Electronic Device]

The present invention also relates to a method of manufacturing an electronic device, including the pattern forming method of the present invention as described above, and an electronic device manufactured by this manufacturing method.

The electronic device of the present invention is suitably mounted on electric or electronic equipment (home electronics, office automation (OA)-related equipment, media-related equipment, optical equipment, telecommunication equipment, and the like).

EXAMPLES

Hereinbelow, embodiments of the present invention will be described in more detail with reference to Examples, but the contents of the present invention are not limited thereto.

[Resin]

Synthesis Example 1: Synthesis of Resin (P-2)

5.11 g of the compound (1), 9.46 g of the compound (2), 3.37 g of the compound (3), 0.62 g of the compound (4), 1.61 g of a polymerization initiator V-601 (manufactured by Wako Pure Chemical Industries, Ltd.), 34.46 g of tetrahydrofuran were put into a reaction container, and the mixture was stirred at room temperature in a nitrogen gas atmosphere. Thereafter, the mixture was warmed to 60° C., heated and stirred over 15 hours, and then left to be cooled to room temperature.

The reaction solution was added dropwise to 700 g of heptane to precipitate polymers, followed by filtration. By using 150 g of heptane, the filtered solid was washed. Thereafter, the washed solid was subjected to drying under reduced pressure to obtain 13.36 g of a resin (P-2).

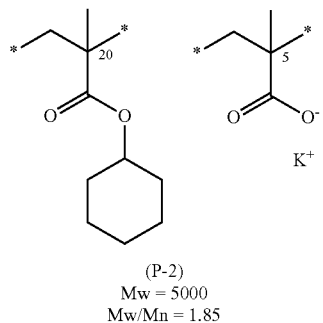

The weight-average molecular weight (Mw: in terms of polystyrene) determined from GPC (carrier: tetrahydrofuran (THF)) of the obtained resin (P-2) was Mw=5,000, and the dispersity was Mw/Mn=1.85. The compositional ratio (molar ratio; in a corresponding order from the left side) measured by $^{13}$C-NMR was 30/45/20/5.

By performing the same operation as in Synthesis Example 1, resins (P-1) to (P-12), and resins (P'-1) to (P'-5) shown below were synthesized.

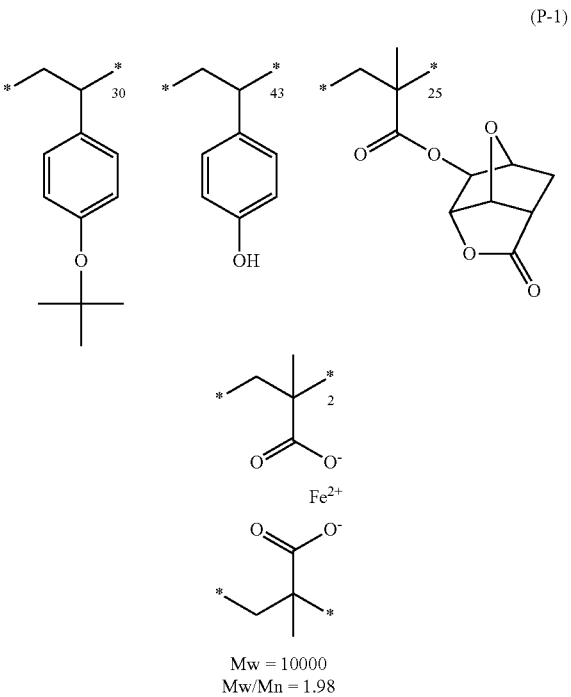

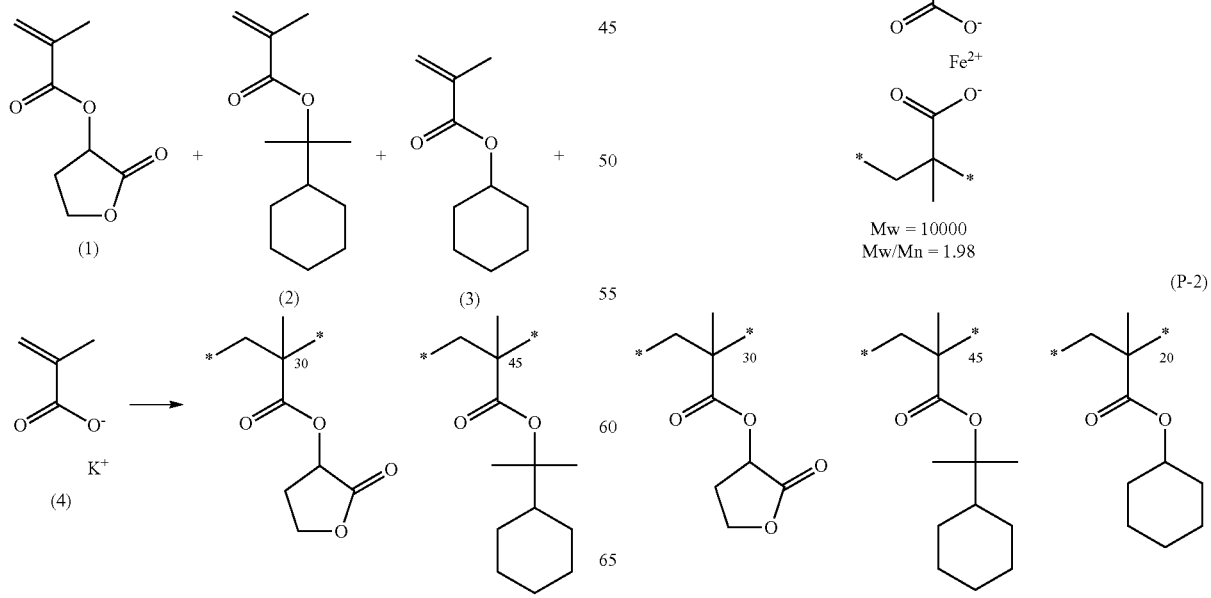

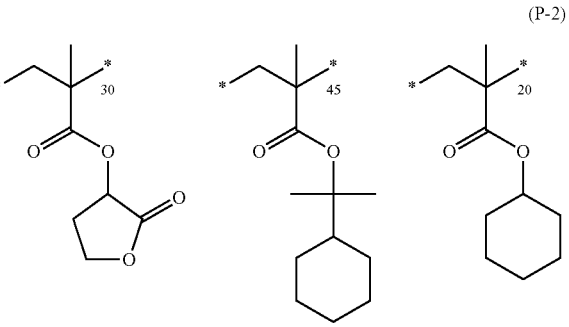

-continued
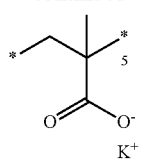
Mw = 5000
Mw/Mn = 1.85
(P-3)
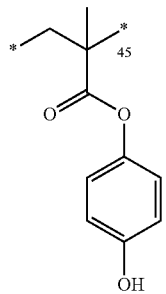
Mw = 15000
Mw/Mn = 1.65
(P-4)
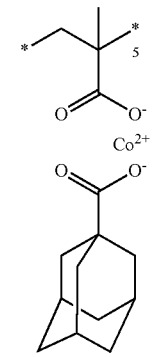
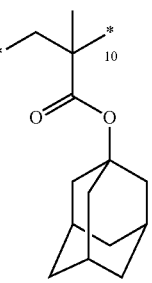
Mw = 9000
Mw/Mn = 1.70
(P-5)
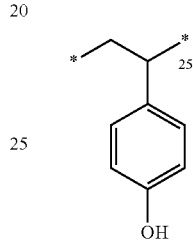
-continued
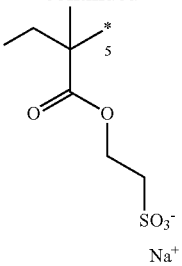
Mw = 9000
Mw/Mn = 1.72
(P-6)
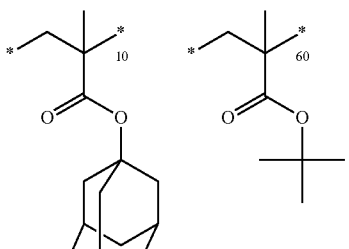
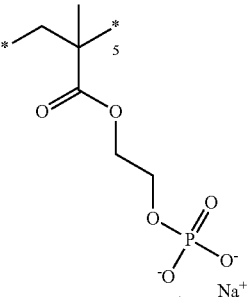
Mw = 9000
Mw/Mn = 1.73
(P-7)
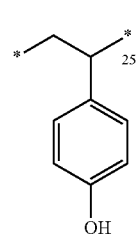 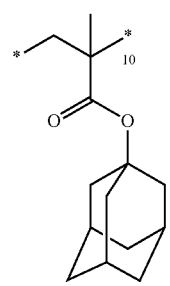 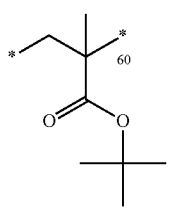 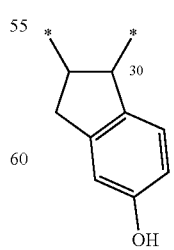 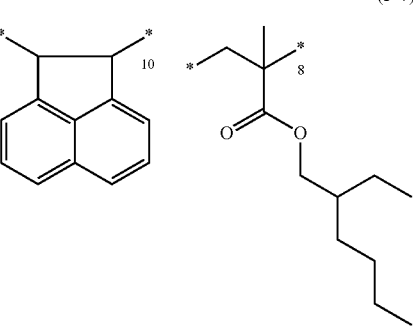

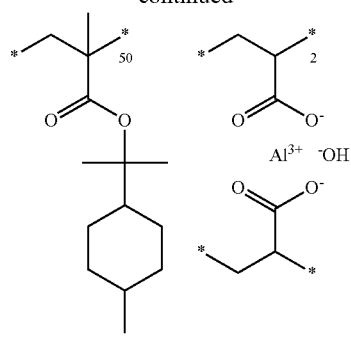
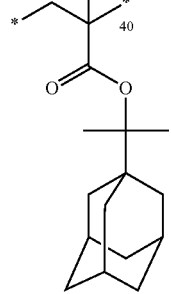
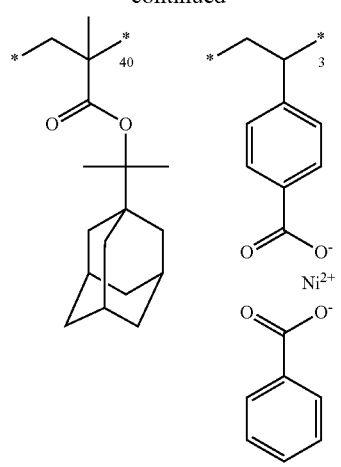
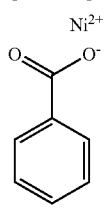
Mw = 18000
Mw/Mn = 1.68
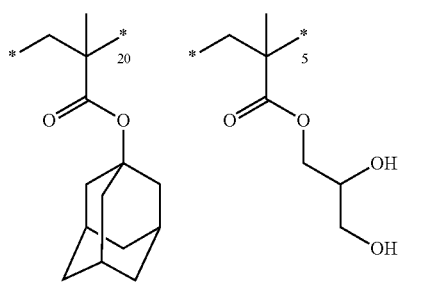
(P-8)
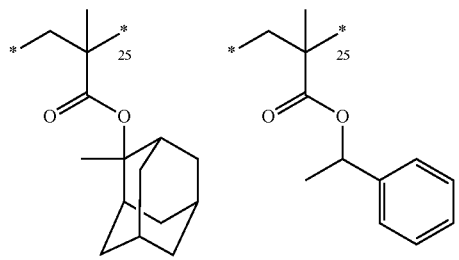
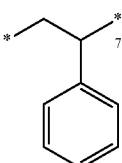
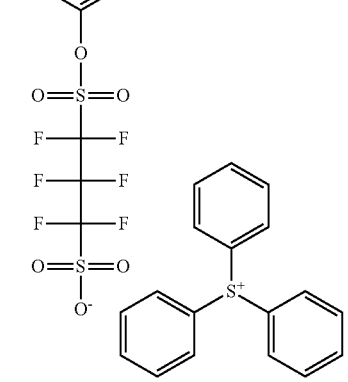
Mw = 15000
Mw/Mn = 1.88
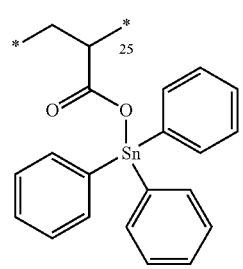
Mw = 12000
Mw/Mn = 1.72
(P-9)
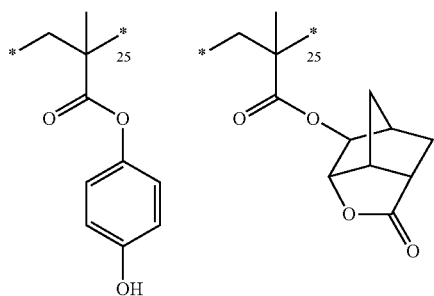
(P-10)
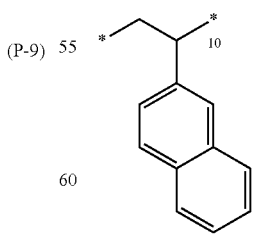
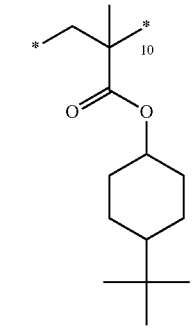
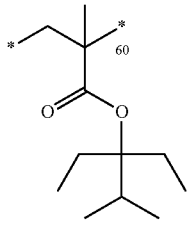

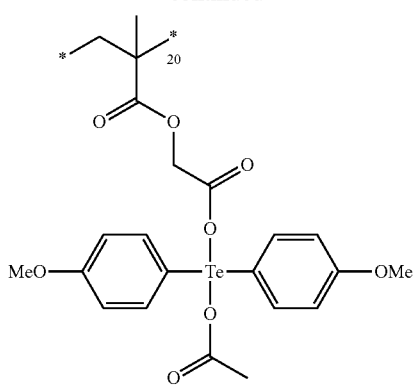
Mw = 20000
Mw/Mn = 1.69
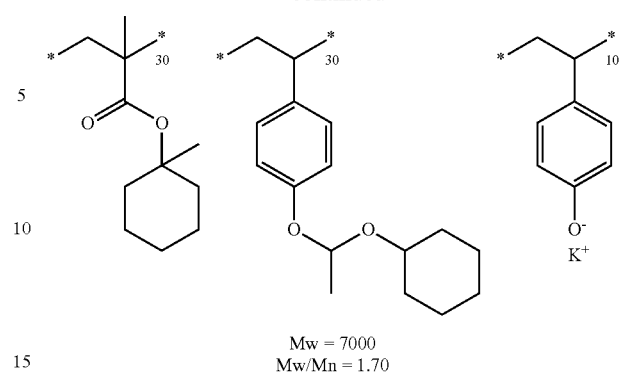
Mw = 7000
Mw/Mn = 1.70
(P-11)
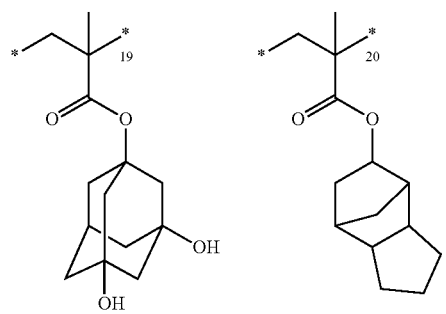
(P'-1)
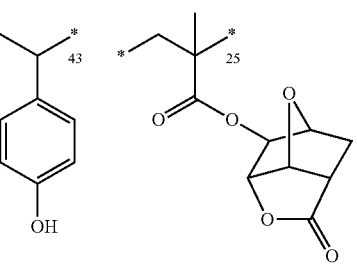
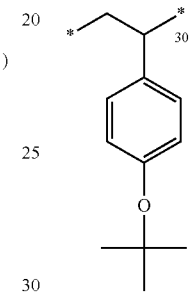
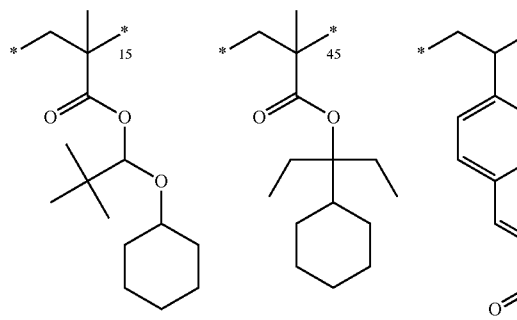
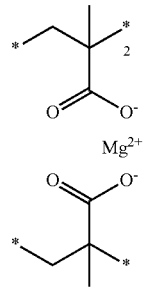
Mw = 10000
Mw/Mn = 2.00
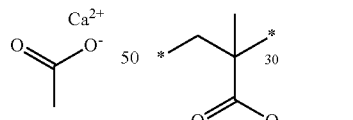
Mw = 8000
Mw/Mn = 1.58
(P-12)
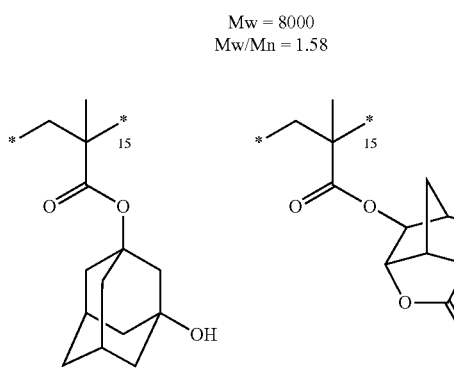
(P'-2)
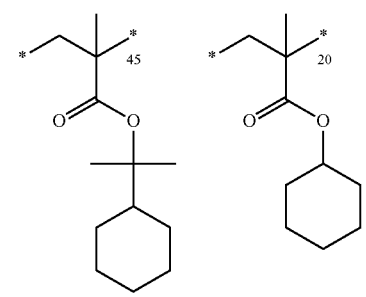
Mw = 5000
Mw/Mn = 1.88

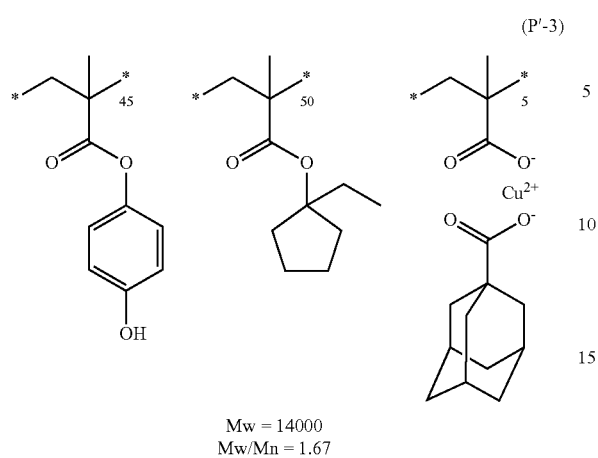
Mw = 14000
Mw/Mn = 1.67
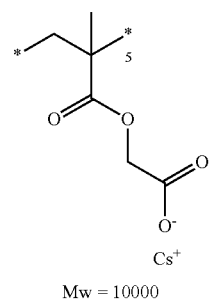
Mw = 10000
Mw/Mn = 1.69
[Photoacid Generator]
As the photoacid generator, the following compounds were used.
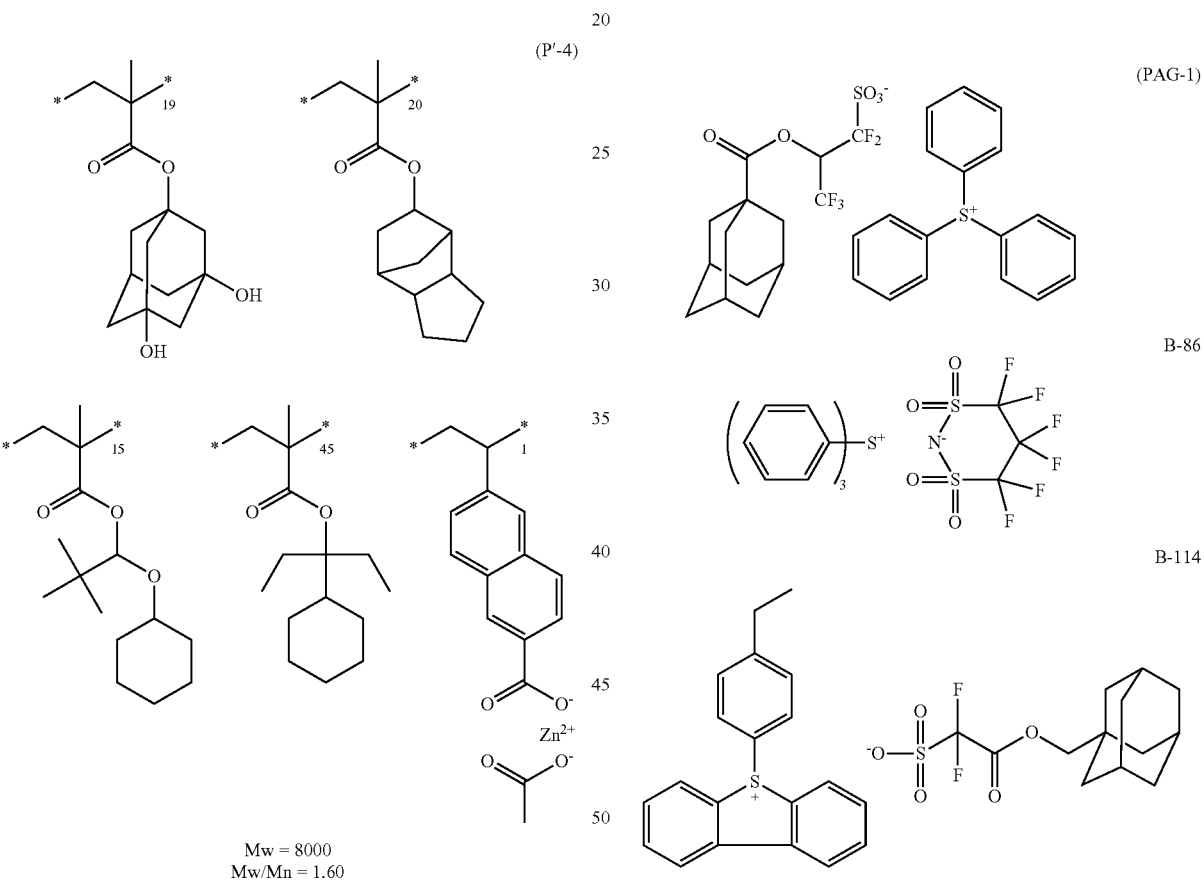
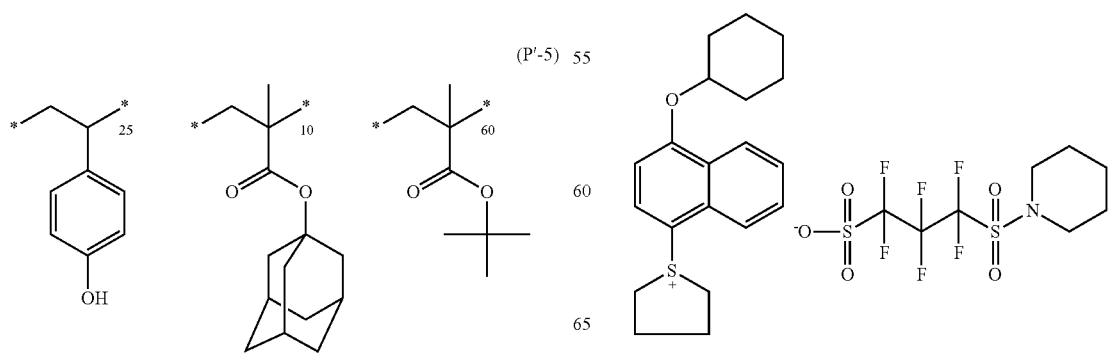

B-121
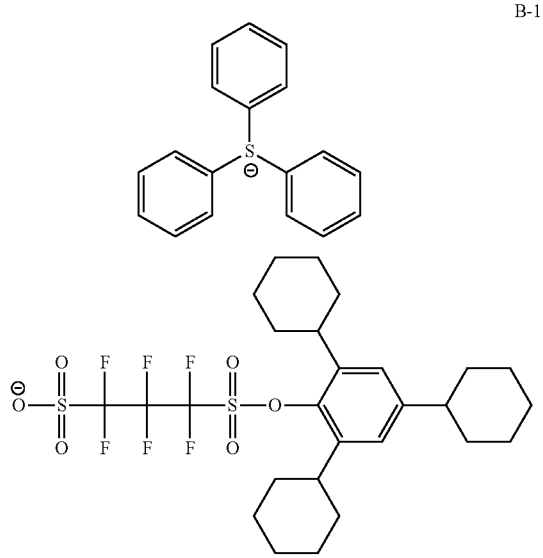
B-142
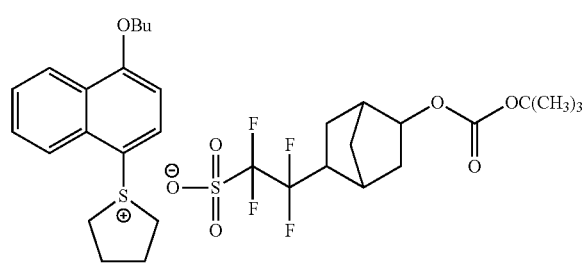
B-154
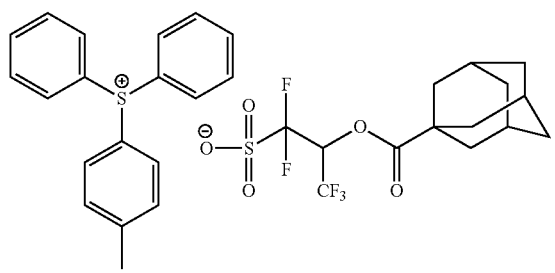
B-161
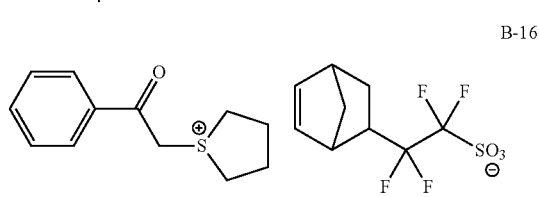
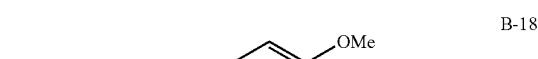
B-183
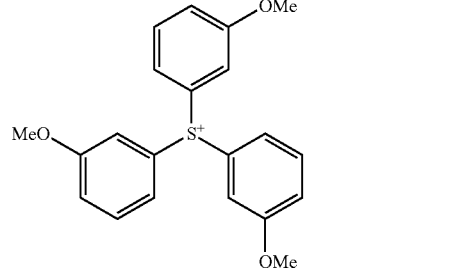
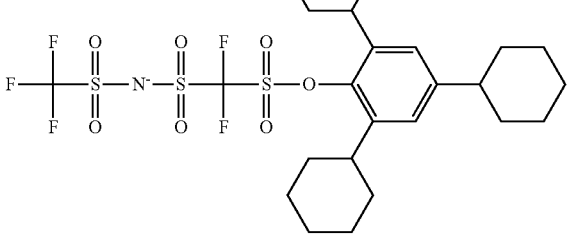
[Basic Compound]
As the basic compound, any one of the following compounds (N-3), and (N-6) to (N-10) were used. Further, the following compound (N-7) which corresponds to the above-mentioned compound (PA) was synthesized on the basis of the description of paragraph [0354] of JP2006-330098A.
N-3
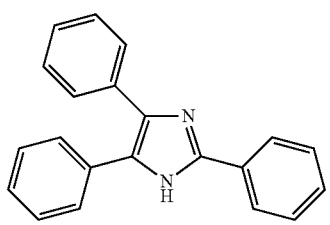
N-6
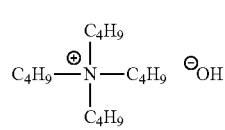
N-7
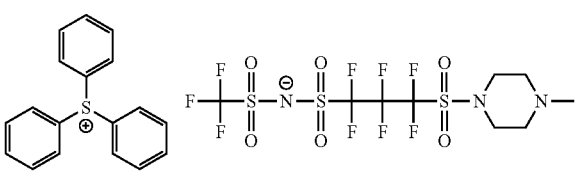
N-8
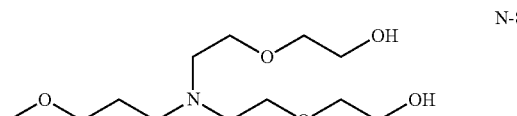
N-9
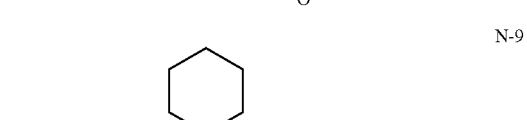

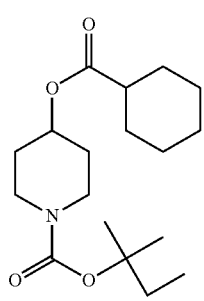

N-10

[Hydrophobic Resin]

As the hydrophobic resin, any one of the following hydrophobic resins HR-1 and HR-2 was used.

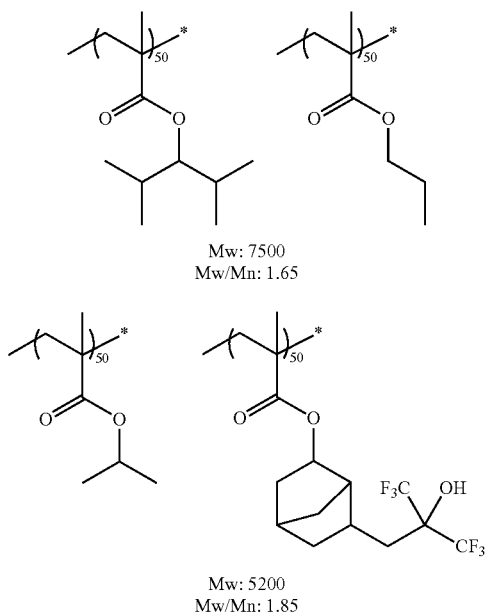

[Solvent]

S-1: Propylene glycol monomethyl ether acetate (PGMEA; boiling point (b.p.)=146° C.)

S-2: Propylene glycol monomethyl ether (PGME; b.p.=120° C.)

S-3: Ethyl lactate (b.p.=145° C.)

S-4: Cyclohexanone (b.p.=157° C.)

[Surfactant]

As the surfactant, the following W-1 to W-4 were used.

W-1: MEGAFACE R08 (manufactured by DIC, Inc.) (fluorine- and silicon-based)

W-2: Polysiloxane Polymer KP-341 (manufactured by Shin-Etsu Chemical Co., Ltd.) (silicon-based)

W-3: TROYSOL S-366 (manufactured by Troy Chemical Co., Ltd.; fluorine-based)

W-4: PF6320 (manufactured by OMNOVA Solution Inc.) (fluorine-based)

[Developer]

As the developer, the following ones were used.

G-1: Butyl acetate

G-2: Methyl amyl ketone (2-heptanone)

G-3: Anisole

G-4: TMAH (2.38% by mass aqueous tetramethylammonium hydroxide solution)

[Rinsing Liquid]

As the rinsing liquid, the following ones were used.

R-1: 4-Methyl-2-pentanol

R-2: 1-Hexanol

R-3: Decane

R-4: Water

Examples 1 to 13 and Comparative Examples 1 and 5

[Preparation and Application of Coating Liquid of Active-Light-Sensitive or Radiation-Sensitive Resin Composition]

A coating liquid composition with a solid content concentration of 1.5% by mass, having the compositional ratio (the concentration (% by mass) of each component represents the concentration in the total solid content concentration) shown in the following table, was microfiltered using a membrane filter having a pore diameter of 0.05 μm, thereby obtaining an active-light-sensitive or radiation-sensitive resin composition (resist composition) solution.

1.0% by mass of a hydrophobic resin HR-1 was added to the composition of Example 7. Similarly, 1.0% by mass of a hydrophobic resin HR-2 was added to the composition of Example 8.

The active-light-sensitive or radiation-sensitive resin composition was coated on a 6-inch Si wafer that had been subjected to a hexamethyldisilazane (HMDS) treatment in advance, using a spin coater Mark 8 manufactured by Tokyo Electron Limited, and dried on a hot plate at 100° C. for 60 seconds, thereby obtaining a resist film having a film thickness of 50 nm.

A top coat layer having a thickness of 300 Angstroms was formed on the resist film of Example 6, using a resin composition (a solid content concentration of 3.0% by mass) for forming a top coat, obtained by dissolving the hydrophobic resin HR-1 in 4-methyl-2-pentanol.

[EUV Exposure and Development]

The wafer having the obtained resist film coated thereon was subjected to pattern exposure through an exposure mask (line:space=1:1), using an EUV exposure device (Micro Exposure Tool manufactured by Exitech, NA0.3, X-dipole, outer sigma 0.68, inner sigma 0.36). After irradiation, the wafer was heated on a hot plate at 100° C. for 60 seconds, and then developed by paddling with a developer shown in the following table for 30 seconds, rinsed using the rinsing liquid shown in the following table, rotated at a rotation speed of 4,000 rpm for 30 seconds, and then baked at 95° C. for 60 seconds to obtain a resist pattern with a 1:1 line-and-space pattern having a line width of 50 nm.

[Evaluation of Resist Pattern]

For the obtained resist pattern, the sensitivity and LER were evaluated by the following method. The results are shown in the following Table 1.

<Sensitivity>

The irradiation energy upon resolution of the 1:1 line-and-space pattern having a line width of 50 nm was taken as sensitivity (Eop). A smaller value thereof indicates better performance.

<Line Edge Roughness (LER)>

The pattern with a 1:1 line-and-space pattern having a line width of 50 nm was observed using a scanning electron microscope (S-9260 manufactured by Hitachi, Ltd.). Further, the distance between actual edge and a reference line on which edges were to be present was measured at 30 points of equal intervals within 50 m in the longitudinal direction of the pattern. Then, the standard deviation of the measured distances was determined, and 3σ was computed therefrom. This 3σ was denoted as "LER (nm)". A smaller value thereof indicates better performance.

TABLE 1

| | Resin (% by mass) | Acid-generator (% by mass) | Basic compound (% by mass) | Solvent (mass ratio) | Surfactant (% by mass) | Developer | Rinsing liquid | Sensitivity (mJ/cm²) | LER (nm) |
|---|---|---|---|---|---|---|---|---|---|
| Example 1 | P-1 (89) | PAG-1 (11) | — | S-1/S-4 (90/10) | — | G-4 | — | 20 | 5.0 |
| Example 2 | P-2 (78.9) | B-118 (20) | N-9 (1) | S-2/S-3 (50/50) | W-2 (0.1) | G-1 | R-3 | 22 | 4.8 |
| Example 3 | P-3 (75) | B-114 (25) | — | S-1/S-2/S-4 (50/20/30) | — | G-4 | R-4 | 21 | 4.9 |
| Example 4 | P-3 (75) | B-114 (25) | — | S-1/S-2/S-4 (50/20/30) | — | G-1 | R-3 | 15 | 4.4 |
| Example 5 | P-4 (79.9) | B-183 (20) | — | S-1/S-2 (50/50) | W-4 (0.1) | G-1 | — | 17 | 4.7 |
| Example 6 | P-5 (79.9) | B-183 (20) | — | S-1/S-2 (50/50) | W-4 (0.1) | G-1 | — | 21 | 5.0 |
| Example 7 | P-6 (78.9) | B-183 (20) | — | S-1/S-2 (50/50) | W-4 (0.1) | G-1 | — | 24 | 5.3 |
| Example 8 | P-7 (83) | B-86 (15) | N-10 (1) | S-3/S-4 (60/40) | — | G-4 | R-4 | 19 | 5.1 |
| Example 9 | P-8 (92) | B-154 (5) | N-3 (3) | S-1/S-3 (50/50) | — | G-2 | R-1 | 24 | 5.3 |
| Example 10 | P-9 (98.9) | — | N-7 (1) | S-2/S-4 (50/50) | W-3 (0.1) | G-4 | R-4 | 23 | 4.5 |
| Example 11 | P-10 (88) | B-142 (10) | N-6 (2) | S-1/S-2/S-3 (40/20/40) | — | G-4 | R-4 | 18 | 5.2 |
| Example 12 | P-11 (83.9) | B-161 (15) | N-8 (1) | S-1/S-3 (20/80) | W-1 (0.1) | G-3 | R-2 | 20 | 5.1 |
| Example 13 | P-12 (65) | B-121 (35) | — | S-2 (100) | — | G-4 | R-4 | 22 | 5.0 |
| Comparative Example 1 | P'-1 (89) | PAG-1 (11) | — | S-1/S-4 (90/10) | — | G-4 | — | 28 | 6.6 |
| Comparative Example 2 | P'-2 (78.9) | B-118 (20) | N-9 (1) | S-2/S-3 (50/50) | W-2 (0.1) | G-1 | R-3 | 34 | 8.7 |
| Comparative Example 3 | P'-3 (75) | B-114 (25) | — | S-1/S-2/S-4 (50/20/30) | — | G-4 | R-4 | 31 | 6.8 |
| Comparative Example 4 | P'-4 (83.9) | B-161 (15) | N-8 (1) | S-1/S-3 (20/80) | W-1 (0.1) | G-3 | R-2 | 29 | 7.0 |
| Comparative Example 5 | P'-5 (79.9) | B-183 (20) | — | S-1/S-2 (50/50) | W-4 (0.1) | G-1 | — | 30 | 7.2 |

As seen from Table 1, in Examples 1 to 13, the excellent sensitivity was exhibited and LER was also excellent, as compared with Comparative Examples 1 to 5 in which the composition of the present invention is not used.

In particular, although Comparative Examples 1 and 3 to 5 having any one metal ion of Mg, Cu, Zn, and Cs had a metal ion, the sensitivity was insufficient, as compared with Examples 1 to 13.

Moreover, it was found that from the comparison result between Example 3 and Example 4, the sensitivity and LER of Example 3 using the organic developer tended to be more excellent than those of Example 4 using the alkaline developer.

In addition, in comparison among Examples 5 to 7, the effects of Example 6 having a sulfonic acid group as an acid group in the metal salt structure were more excellent than those of Example 7 having a phosphoric acid group as the acid group, and the effects of Example 5 having a carboxyl group as the acid group were more excellent than those of Example 6.

What is claimed is:
1. An active-light-sensitive or radiation-sensitive resin composition comprising:
    a resin (Ab) whose polarity is changed by the action of an acid; and
    a compound that generates an acid upon irradiation with active light or radiation,
    wherein the resin (Ab) includes a metal ion,
    the metal type of the metal ion is selected from the group consisting of K, Na, Al, Sn, Te and Ca,
    the resin (Ab) has a metal salt structure including the metal ion,
    the resin (Ab) has at least one of repeating units represented by the following General Formulae (f1) to (f4) as the metal salt structure:

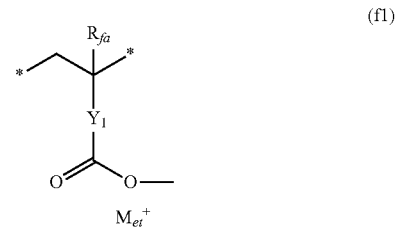

(f1)

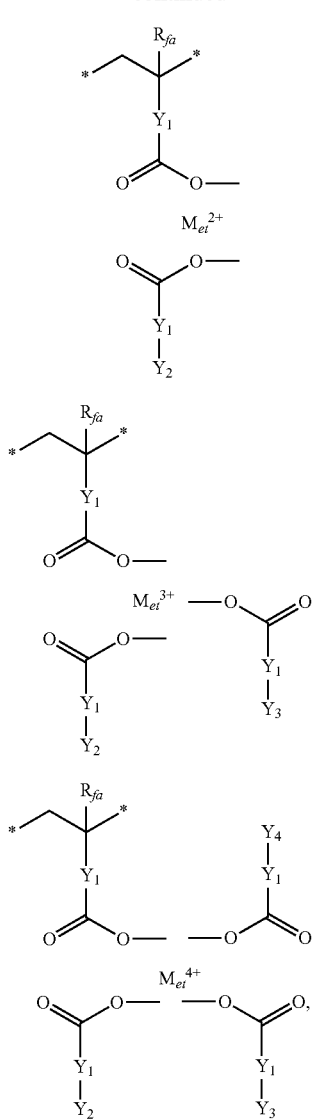

in General Formulae (f1) to (f4), $M_{et}$ represents a metal atom selected from the group consisting of K, Na, Al, Sn, Te and Ca, $R_{fa}$ represents a hydrogen atom, an alkyl group, a cycloalkyl group, a halogen atom, a cyano group, or an alkyloxycarbonyl group, $Y_1$'s each independently represent a single bond or a divalent linking group, and $Y_2$ to $Y_4$ each independently represents a hydrogen atom or a monovalent organic group, the content of the repeating units represented by General Formulae (f1) to (f4) in the resin (Ab) is 5% to 30% by mole with respect to all the repeating units, and the amount of the resin (Ab) is 30% to 99% by mass, with respect to the total solids content of the active-light-sensitive or radiation-sensitive resin composition.

2. An active-light-sensitive or radiation-sensitive film which is formed using the active-light-sensitive or radiation-sensitive resin composition according to claim 1.

3. The active-light-sensitive or radiation-sensitive resin composition according to claim 1, wherein the alkyl group represented by $R_{fa}$ in General Formulae (f1) to (f4) is an alkyl group having 1 to 20 carbon atoms selected from the group consisting of a methyl group, an ethyl group, a propyl group, an isopropyl group, an n-butyl group, an isobutyl group, a t-butyl group, a pentyl group, a hexyl group, a cyclohexyl group, an octyl group, and a dodecyl group.

4. The active-light-sensitive or radiation-sensitive resin composition according to claim 1, wherein:

the divalent linking group represented by $Y_1$ in General Formulae (f1) to (f4) is an alkylene group selected from the group consisting of a methylene group, an ethylene group, a propylene group, a butylene group, a hexylene group, and an octylene group; a cycloalkylene group selected from the group consisting of a cyclopentylene group, a cyclohexylene group, and an adamantylene group; an alkenylene group selected from the group consisting of an ethylene group, a propenylene group, and a butenylene group; a divalent aromatic ring group selected from the group consisting of a phenylene group, a benzylene group, a tolylene group, and a naphthylene group; —S—, —O—, —CO—, —$SO_2$—, —N($R_0$)—, and a divalent linking group obtained by combining these plural groups; and $R_0$ is a hydrogen atom or an alkyl group having 1 to 8 carbon atoms selected from the group consisting of a methyl group, an ethyl group, a propyl group, an n-butyl group, a sec-butyl group, a hexyl group, and an octyl group.

5. The active-light-sensitive or radiation-sensitive resin composition according to claim 1, wherein the monovalent organic group represented by each of $Y_2$ to $Y_4$ in General Formulae (f2) to (f4) is an alkyl group, an alkenyl group, an alkynyl group, a cycloalkyl group, or an aryl group which may have a heteroatom.

6. The active-light-sensitive or radiation-sensitive resin composition according to claim 1, wherein the alkyl group represented by each of $Y_2$ to $Y_4$ in General Formulae (f2) to (f4) is a methyl group, an ethyl group, an n-propyl group, an isopropyl group, or an n-butyl group.

7. The active-light-sensitive or radiation-sensitive resin composition according to claim 1, wherein the alkenyl group represented by each of $Y_2$ to $Y_4$ in General Formulae (f2) to (f4) is a vinyl group, an allyl group, an isopropenyl group, or a styryl group.

8. The active-light-sensitive or radiation-sensitive resin composition according to claim 1, wherein the alkynyl group represented by each of $Y_2$ to $Y_4$ in General Formulae (f2) to (f4) is an ethynyl group, a 1-propynyl group, a 1-butynyl group, or a trim ethylsilylethynyl group.

9. The active-light-sensitive or radiation-sensitive resin composition according to claim 1, wherein the cycloalkyl group represented by each of $Y_2$ to $Y_4$ in General Formulae (f2) to (f4) is a cyclopropyl group, a cyclobutyl group, a cyclopentyl group, a cyclohexyl group, a norbornyl group, or an adamantyl group.

10. The active-light-sensitive or radiation-sensitive resin composition according to claim 1, wherein the aryl group represented by each of $Y_2$ to $Y_4$ in General Formulae (f2) to (f4) is a phenyl group, a benzyl group, a tolyl group, or a naphthyl group.

11. The active-light-sensitive or radiation-sensitive resin composition according to claim 1, wherein the resin (Ab) is a resin whose polarity is changed by the action of an acid, and has a repeating unit having an acid-decomposable group that is a group in which a hydrogen atom of a polar group such as a carboxyl group, a phenolic hydroxyl group, a sulfonic acid group, or a thiol group is protected with a group that leaves by the action of an acid.

12. A pattern forming method comprising at least:
- a step of forming an active-light-sensitive or radiation-sensitive film using the active-light-sensitive or radiation-sensitive resin composition according to claim 1;
- a step of exposing the active-light-sensitive or radiation-sensitive film; and
- a step of developing the exposed active-light-sensitive or radiation-sensitive film using a developer to form a pattern.

13. The pattern forming method according to claim 12, wherein the exposure is exposure with electron beams or EUV light.

14. The pattern forming method according to claim 12, wherein the developer is an alkaline developer.

15. The pattern forming method according to claim 12, wherein the developer is a developer including an organic solvent.

* * * * *